(12) United States Patent
Cui et al.

(10) Patent No.: US 11,575,000 B2
(45) Date of Patent: Feb. 7, 2023

(54) SUPER-JUNCTION BASED VERTICAL GALLIUM NITRIDE JFET POWER DEVICES

(71) Applicant: NEXGEN POWER SYSTEMS, INC.

(72) Inventors: Hao Cui, Santa Clara, CA (US); Clifford Drowley, Santa Clara, CA (US)

(73) Assignee: NEXGEN POWER SYSTEMS, INC., Santa Clara, CA (US)

( * ) Notice: Subject to any disclaimer, the term of this patent is extended or adjusted under 35 U.S.C. 154(b) by 0 days.

(21) Appl. No.: 17/350,237

(22) Filed: Jun. 17, 2021

(65) Prior Publication Data

US 2021/0399091 A1 Dec. 23, 2021

Related U.S. Application Data

(60) Provisional application No. 63/040,853, filed on Jun. 18, 2020.

(51) Int. Cl.
*H01L 21/00* (2006.01)
*H01L 29/06* (2006.01)
(Continued)

(52) U.S. Cl.
CPC .... *H01L 29/0634* (2013.01); *H01L 29/66522* (2013.01); *H01L 29/66734* (2013.01); *H01L 29/66909* (2013.01); *H01L 29/66924* (2013.01); *H01L 29/7813* (2013.01); *H01L 29/8083* (2013.01); *H01L 21/0254* (2013.01);
(Continued)

(58) Field of Classification Search
CPC ........... H01L 29/0634; H01L 29/66522; H01L 29/66734; H01L 29/66909; H01L 29/66924; H01L 29/7813; H01L 29/8083; H01L 21/02389; H01L 21/02458; H01L 21/02496; H01L 21/02502; H01L 21/0254; H01L 21/0262; H01L 21/02642; H01L 21/28264; H01L 21/30617
See application file for complete search history.

(56) References Cited

U.S. PATENT DOCUMENTS

2018/0226513 A1\* 8/2018 Li ........................ H01L 21/047
2020/0144407 A1\* 5/2020 Bader ............... H01L 21/28575
(Continued)

*Primary Examiner* — Richard A Booth
(74) *Attorney, Agent, or Firm* — Kilpatrick Townsend & Stockton LLP

(57) ABSTRACT

A method for manufacturing a vertical JFET includes providing a III-nitride substrate having a first conductivity type; forming a first III-nitride layer coupled to the III-nitride substrate, wherein the first III-nitride layer is characterized by a first dopant concentration and the first conductivity type; forming a plurality of trenches within the first III-nitride layer, wherein the plurality of trenches extend to a predetermined depth; epitaxially regrowing a second III-nitride structure in the trenches, wherein the second III-nitride structure is characterized by a second conductivity type; forming a plurality of III-nitride fins, each coupled to the first III-nitride layer, wherein the plurality of III-nitride fins are separated by one of a plurality of recess regions; epitaxially regrowing a III-nitride gate layer in the recess regions, wherein the III-nitride gate layer is coupled to the second III-nitride structure, and wherein the III-nitride gate layer is characterized by the second conductivity type.

10 Claims, 46 Drawing Sheets

(51) Int. Cl.
  *H01L 29/78*    (2006.01)
  *H01L 29/66*    (2006.01)
  *H01L 29/808*   (2006.01)
  H01L 21/02      (2006.01)
  H01L 21/28      (2006.01)
  H01L 21/306     (2006.01)

(52) U.S. Cl.
  CPC .... *H01L 21/0262* (2013.01); *H01L 21/02389* (2013.01); *H01L 21/02458* (2013.01); *H01L 21/02496* (2013.01); *H01L 21/02502* (2013.01); *H01L 21/02642* (2013.01); *H01L 21/28264* (2013.01); *H01L 21/30617* (2013.01)

(56)  References Cited

U.S. PATENT DOCUMENTS

2020/0328737 A1* 10/2020 Rivas-Davila ........ H02M 7/003
2021/0091061 A1*  3/2021 Fiorenza ............. H01L 21/8258

* cited by examiner

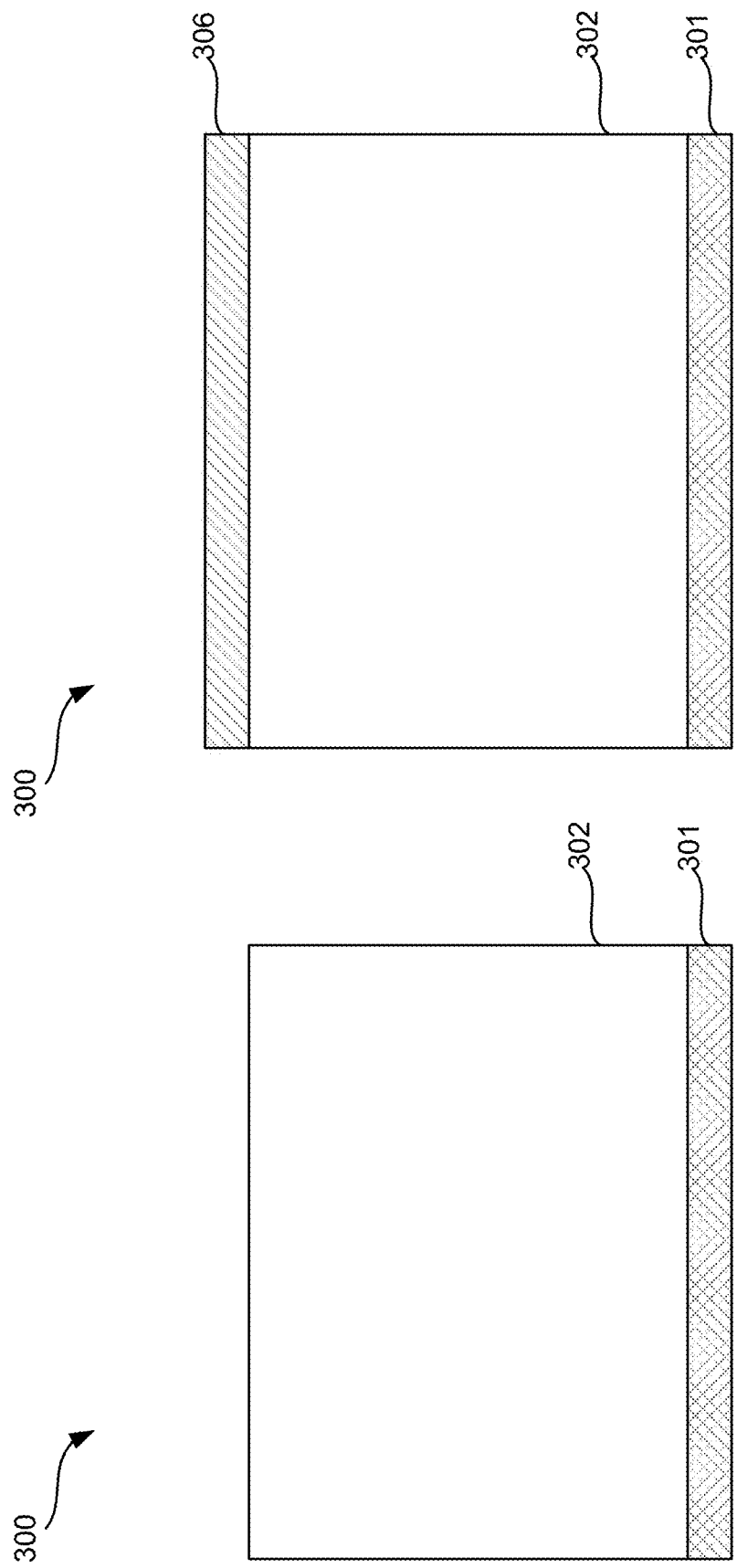

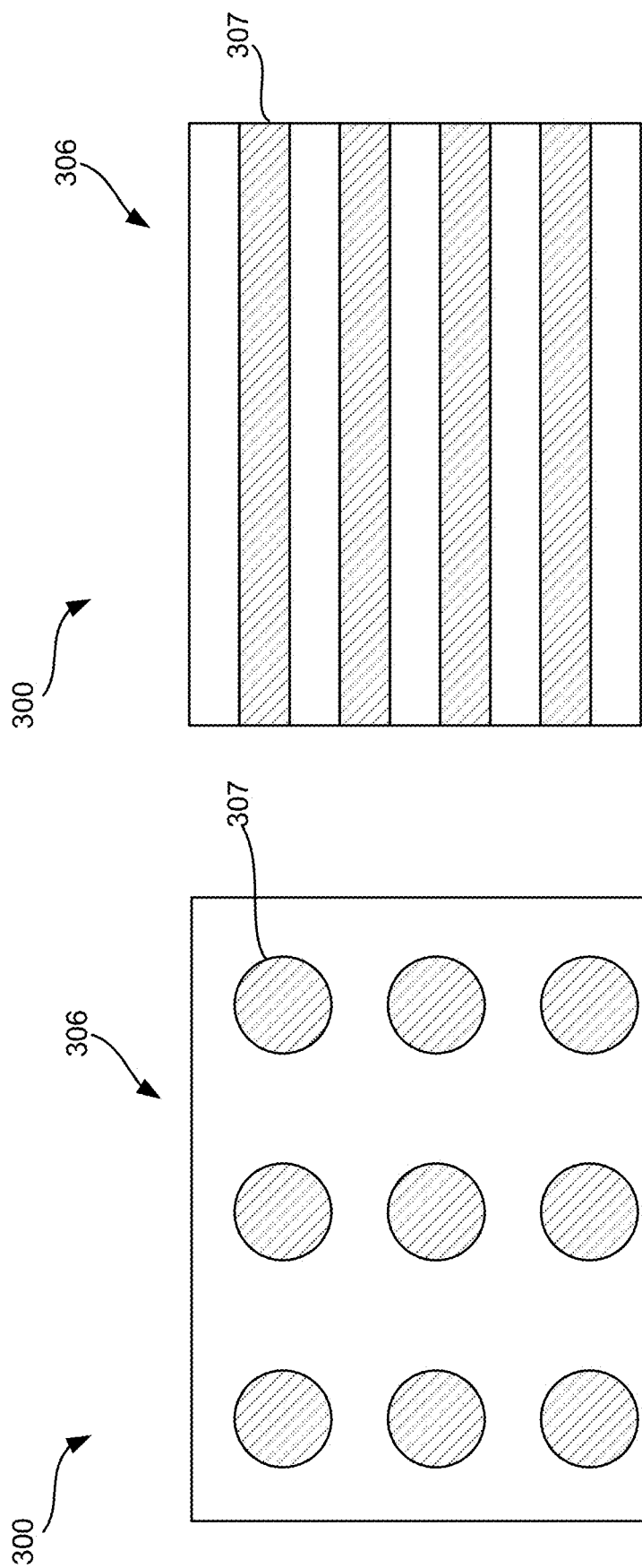

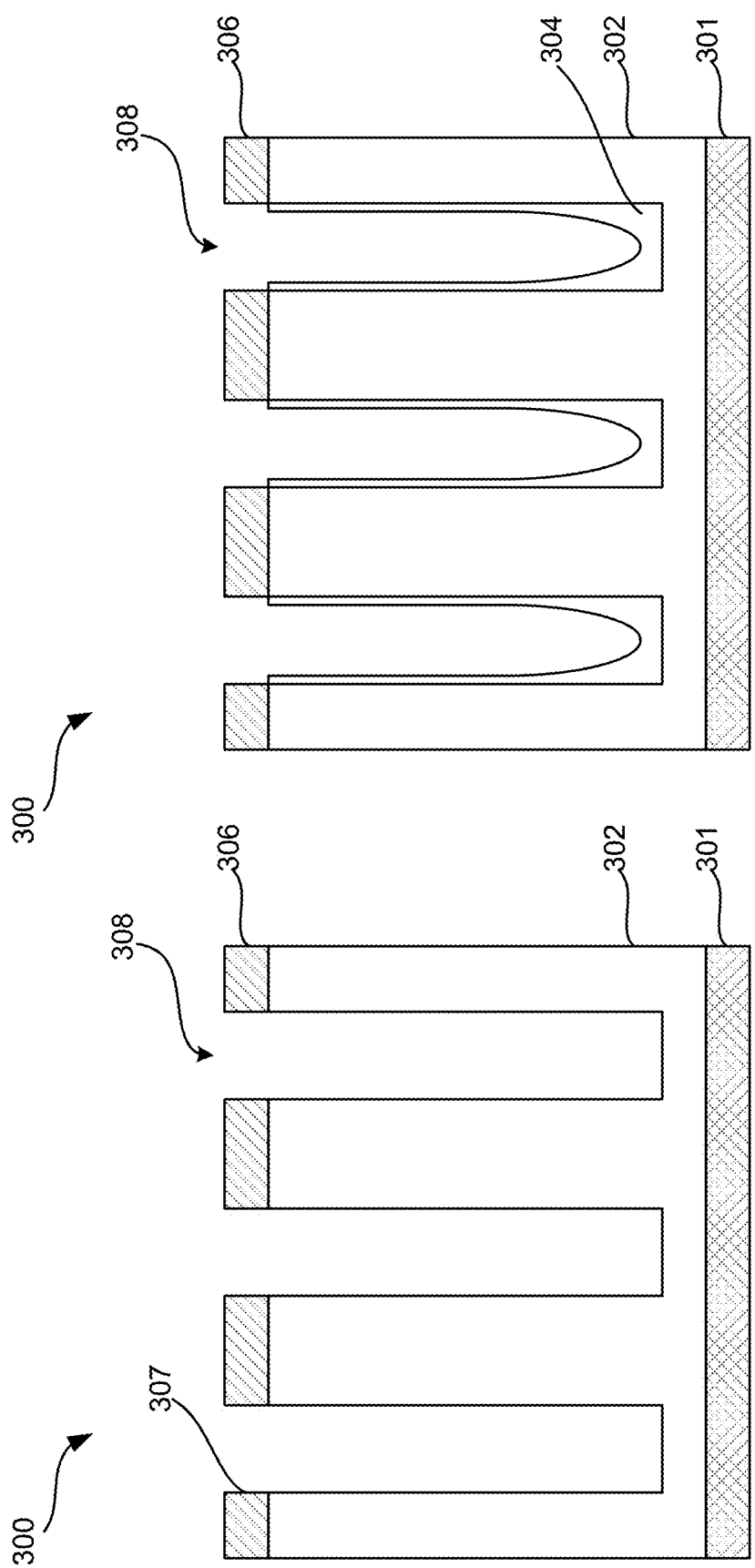

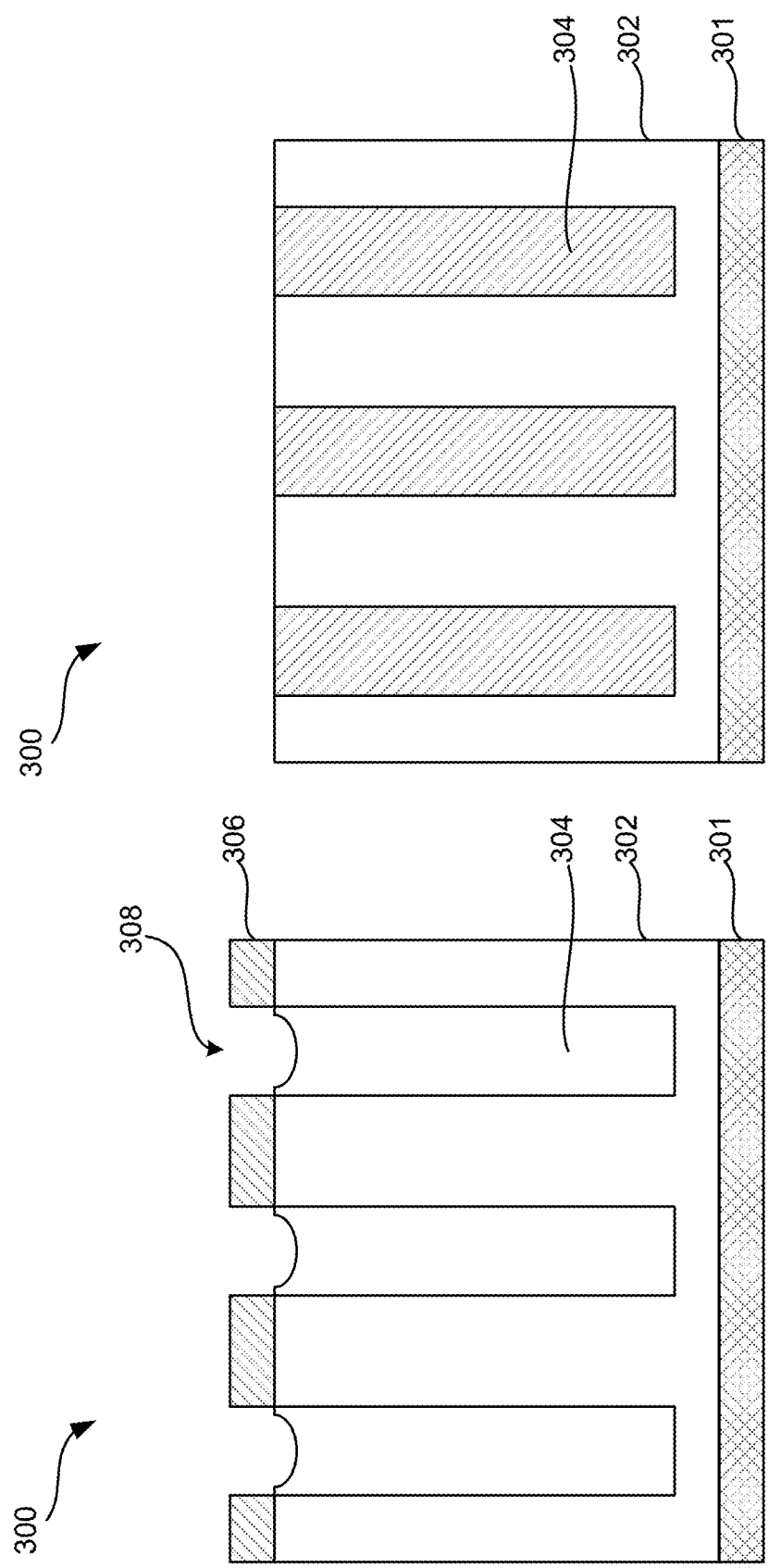

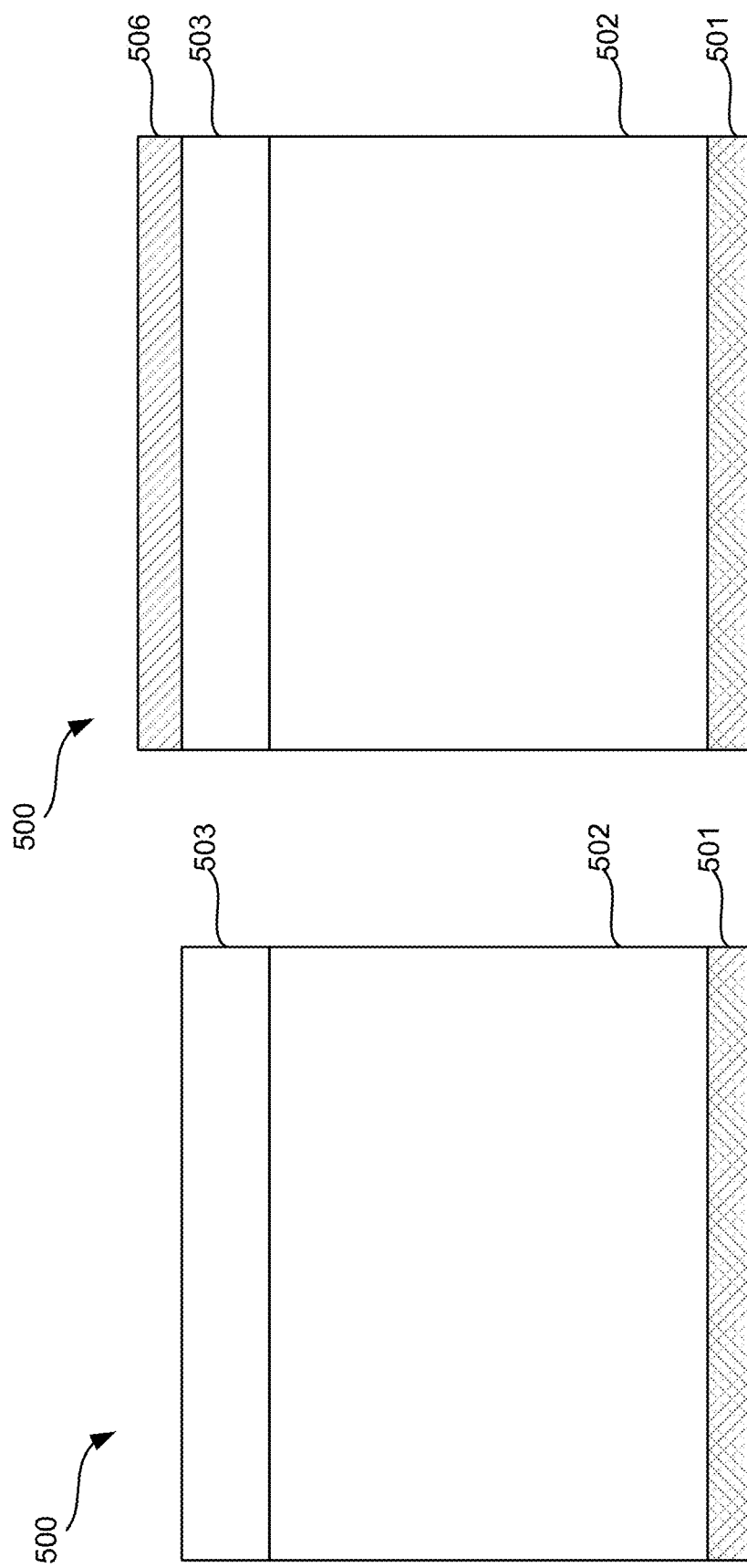

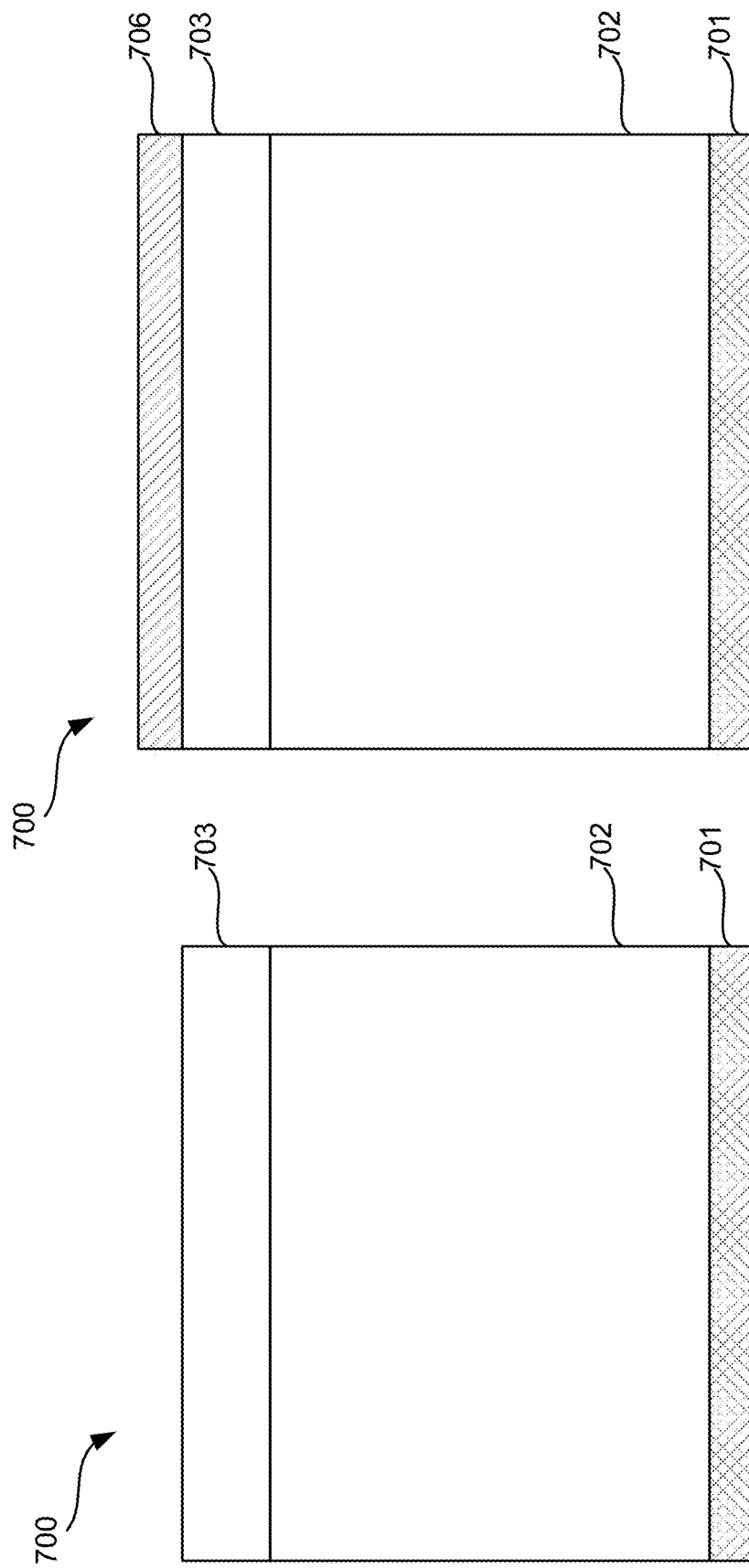

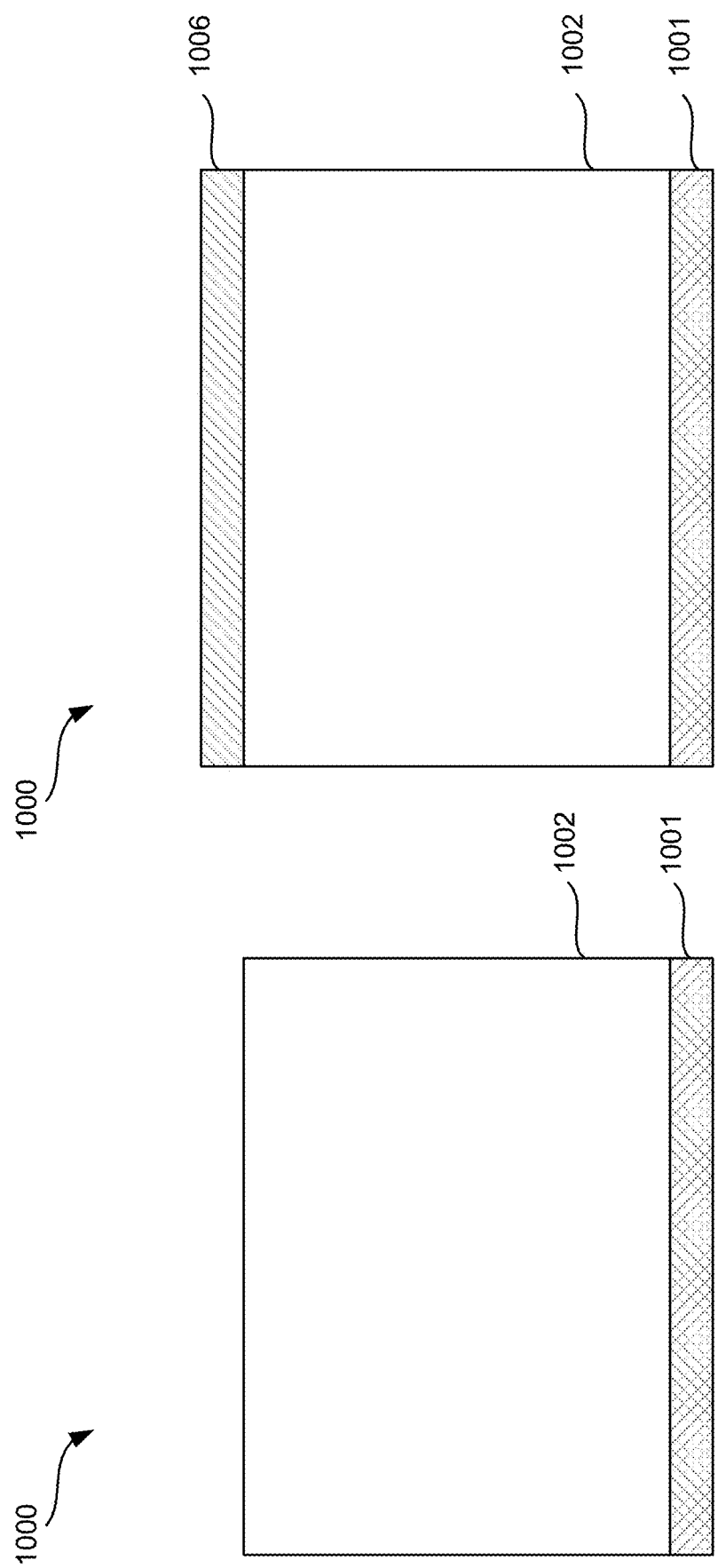

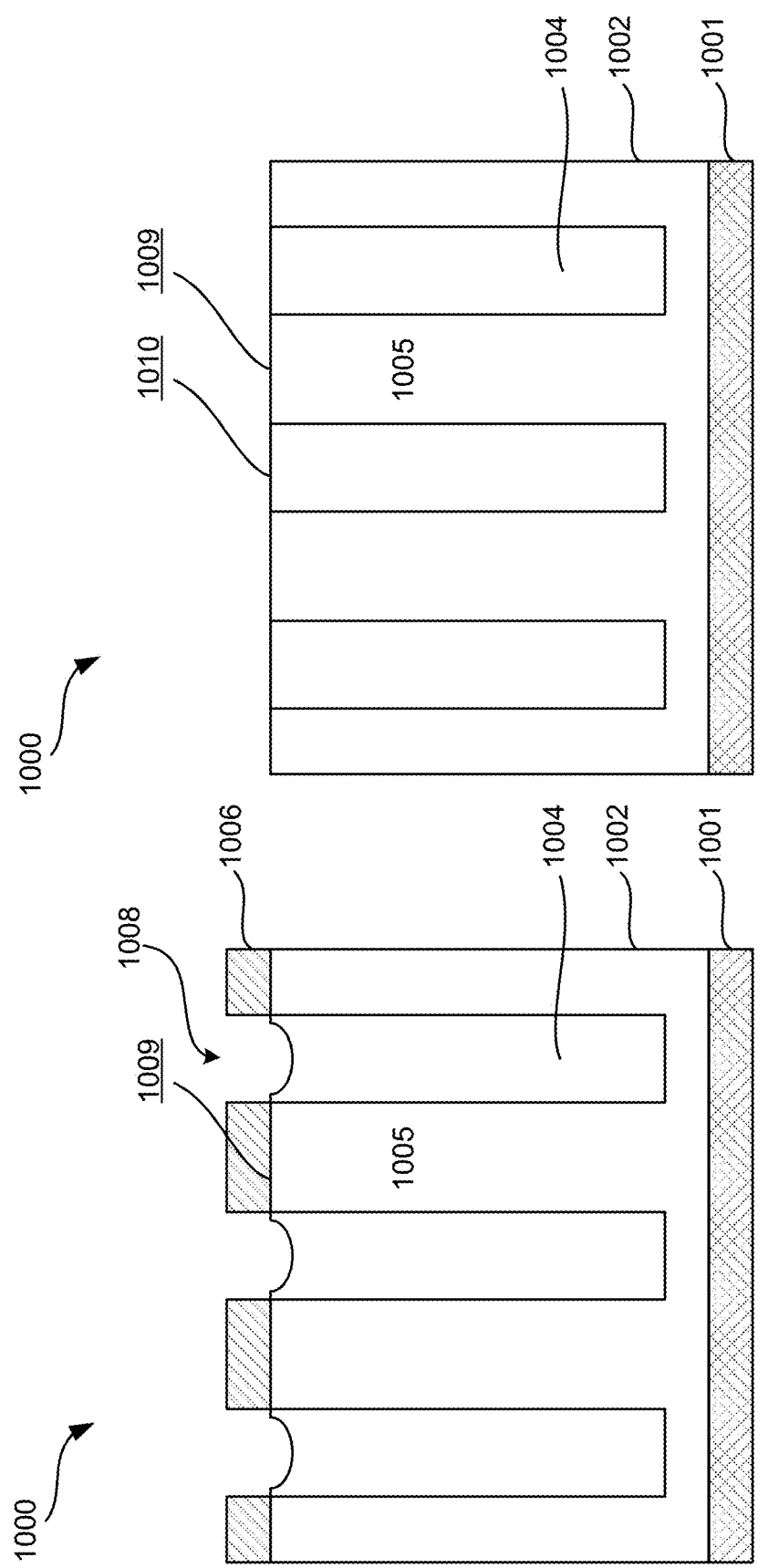

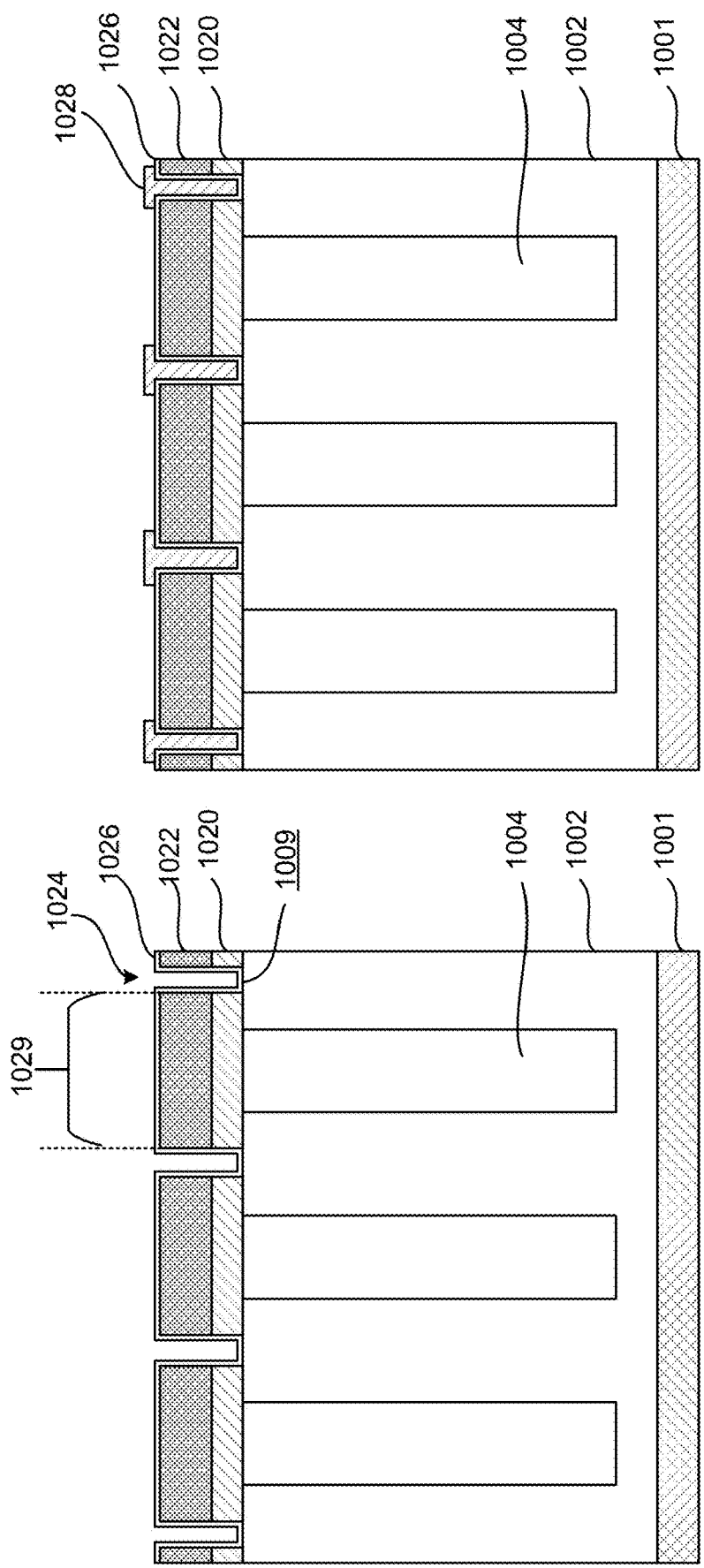

SUPER-JUNCTION BASED VERTICAL GALLIUM NITRIDE JFET POWER DEVICES

CROSS-REFERENCES TO RELATED APPLICATIONS

This application claims the benefit of and priority to U.S. Provisional Patent Application No. 63/040,853, filed on Jun. 18, 2020, the disclosure of which is hereby incorporated by reference in its entirety for all purposes.

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

Embodiments of the present invention relate to vertical junction field-effect transistor (JFET) devices utilizing a super junction structure. Other embodiments of the present invention relate to metal-oxide field-effect transistor (MOSFET) devices utilizing a super junction structure. Vertical JFET devices and MOSFET devices as described herein can achieve breakdown voltages up to thousands and tens of thousands of volts. By employing super junction structures, the specific on resistance of the vertical JFET devices and MOSFET devices can be reduced up to 10-100 times without compromising the breakdown voltage that is achieved.

In one aspect of the present invention, a method for manufacturing a vertical JFET device includes providing a III-nitride substrate having a first conductivity type and forming a first III-nitride layer coupled to the III-nitride substrate. The first III-nitride layer is characterized by a first dopant concentration and the first conductivity type. The method also includes forming a plurality of trenches within the first III-nitride layer, wherein the plurality of trenches extend to a predetermined depth, and epitaxially regrowing a second III-nitride structure in the trenches, wherein the second III-nitride structure is characterized by a second conductivity type opposite to the first conductivity type. The method further includes forming a plurality of III-nitride fins, each coupled to the first III-nitride layer, wherein the plurality of III-nitride fins are separated by one of a plurality of recess regions, and epitaxially regrowing a III-nitride gate layer in the recess regions, wherein the III-nitride gate layer is coupled to the second III-nitride structure, and wherein the III-nitride gate layer is characterized by the second conductivity type.

In one embodiment, forming a plurality of trenches within the first III-nitride layer includes forming a first hardmask layer having a first set of openings on the first III-nitride layer to expose a first surface portion of the first III-nitride layer and etching the first surface portion of the first III-nitride layer using the first hardmask layer as a mask to form the plurality of trenches.

In one embodiment, forming a plurality of trenches within the first III-nitride layer includes forming a first hardmask layer having a first set of openings on the first III-nitride layer to expose a first surface portion of the first III-nitride layer and etching the first surface portion of the first III-nitride layer using the first hardmask layer as a mask to form the plurality of trenches.

In one embodiment, forming the plurality of III-nitride fins, each coupled to the first III-nitride layer, includes forming a third III-nitride layer coupled to the first III-nitride layer, wherein the third III-nitride layer is characterized by a second dopant concentration greater than the first dopant concentration, forming a second hardmask layer having a second set of openings on the third III-nitride layer to expose a second surface portion of the third III-nitride layer, wherein the second surface portion of the third III-nitride layer is aligned with each of the plurality of trenches, and etching through the third III-nitride layer using the second hardmask layer as a mask to form the plurality of recess regions exposing the second III-nitride structure.

In one aspect of the present invention, a vertical JFET device includes a III-nitride substrate having a first conductivity type, a first III-nitride layer coupled to the III-nitride substrate, wherein the first III-nitride layer is characterized by a first dopant concentration and the first conductivity type, and the first III-nitride layer comprises a plurality of trenches, and a second III-nitride structure formed within the trenches, wherein the second III-nitride structure is characterized by a second conductivity type opposite to the first conductivity type. The vertical JFET also includes a plurality of III-nitride fins, each coupled to the first III-nitride layer, wherein the plurality of III-nitride fins are separated by one of a plurality of recess regions, a III-nitride gate layer formed within the recess regions and coupled to the second III-nitride structure, wherein the III-nitride gate layer is characterized by the second conductivity type, a source metal layer coupled to an upper portion of each of the plurality of III-nitride fins, and a gate metal layer couple to the an upper portion of the III-nitride gate layer.

In one aspect of the present invention, a method for fabricating a MOSFET device includes providing a III-nitride substrate having a first conductivity type, forming a first III-nitride layer coupled to the III-nitride substrate, wherein the first III-nitride layer is characterized by the first conductivity type and a first dopant concentration, and forming a plurality of first trenches within the first III-nitride layer, wherein the plurality of first trenches extend to a predetermined depth, and the plurality of first trenches are separated by a first portion of the first III-nitride layer. The method also includes epitaxially regrowing a second III-nitride structure in the first trenches, wherein the second III-nitride structure is characterized by a second conductivity type opposite to the first conductivity type, epitaxially regrowing a third III-nitride layer coupled to the first III-nitride layer and the second III-nitride structure, wherein the third III-nitride layer is characterized by the second conductivity type, and epitaxially regrowing a fourth III-nitride layer coupled to the third III-nitride layer, wherein the fourth III-nitride layer is characterized by the first conductivity type and a second dopant concentration. The method further includes forming a plurality of second trenches through the third and fourth III-nitride layers, wherein each of the plurality of second trenches is separated by a source region of the third and fourth III-nitride layers aligned with each of the plurality of the first trenches, forming a gate dielectric layer coupled to the fourth III-nitride layer and coupled to a sidewall and a bottom wall of the plurality of second trenches, forming a gate metal layer coupled to the gate dielectric layer within the second trenches, etching the gate dielectric layer on at least part of the source region of the third and fourth III-nitride layers aligned with each of the plurality of the first trenches to expose an upper surface portion of the fourth III-nitride layer, and forming a source metal layer coupled to the upper surface portion of the fourth III-nitride layer.

In one embodiment, forming the plurality of second trenches through the third and fourth III-nitride layers includes forming a second hardmask layer having a second set of openings on the fourth III-nitride layer to expose a second surface portion of the fourth III-nitride layer, wherein the second surface portion of the fourth III-nitride layer is aligned with at least part of the first portion of the first III-nitride layer, and etching through the third and fourth III-nitride layers using the second hardmask layer as a mask to form the plurality of second trenches.

In one aspect of the present invention, a MOSFET device includes a III-nitride substrate having a first conductivity type, a first III-nitride layer coupled to the III-nitride substrate, wherein the first III-nitride layer is characterized by a first dopant concentration and the first conductivity type, and the first III-nitride layer comprises a plurality of first trenches, a second III-nitride structure formed within the first trenches, wherein the second III-nitride structure is characterized by a second conductivity type opposite to the first conductivity type, and a third III-nitride layer coupled to the first III-nitride layer and the second III-nitride structure, wherein the third III-nitride layer is characterized by the second conductivity type opposite to the first conductivity type. The MOSFET also includes a fourth III-nitride layer coupled to the third III-nitride layer, wherein the fourth III-nitride layer is characterized by the first conductivity type, a plurality of second trenches through the third and fourth III-nitride layers; wherein each of the plurality of second trenches is separated by a source region of the third and fourth III-nitride layers aligned with each of the plurality of the first trenches, a gate dielectric layer coupled to the fourth III-nitride layer and coupled to a sidewall and a bottom wall of the second trenches, a gate metal layer coupled to the gate dielectric layer within the second trenches, an exposed surface portion of the fourth III-nitride layer on at least part of the source region of the third and fourth III-nitride layers aligned with each of the plurality of the first trenches, and a source metal layer coupled to the exposed surface portion of the fourth III-nitride layer.

In an embodiment, a dopant concentration of the fourth III-nitride layer greater than the dopant concentration of the first III-nitride layer. A depth of the plurality of first trenches extend an entire thickness of the first III-nitride layer. In an embodiment, a dopant concentration of the second III-nitride structure is substantially equal to a dopant concentration of the first III-nitride layer.

In one aspect of the present invention, a method for manufacturing a vertical JFET device includes providing a III-nitride substrate having a first conductivity type, epitaxially growing a first III-nitride layer coupled to the III-nitride substrate, wherein the first III-nitride layer is characterized by a first dopant concentration and the first conductivity type, forming a second III-nitride layer coupled to the first III-nitride layer, wherein the second III-nitride layer is characterized by a second dopant concentration and the first conductivity type, forming a hardmask layer having a first set of openings on the second III-nitride layer to expose a first surface portion of the second III-nitride layer, and etching the first surface portion of the second III-nitride layer using the hardmask layer as a mask to form a plurality of trenches within the first III-nitride layer, wherein the plurality of trenches extend to a predetermined depth. The method also includes selectively regrowing a third III-nitride structure in the plurality of trenches, wherein the third III-nitride structure is characterized by a second conductivity type opposite to the first conductivity type, forming a second pattern on the hardmask layer having a second set of openings on the second III-nitride layer to expose a second surface portion of the second III-nitride layer, etching through the second III-nitride layer and the third III-nitride structure, using the hardmask layer as a mask, to form a plurality of recess regions, epitaxially regrowing a III-nitride gate layer in the recess regions, wherein the III-nitride gate layer is coupled to the third III-nitride structure, and wherein the III-nitride gate layer is characterized by the second conductivity type, removing the hardmask layer; forming a source metal layer coupled to the second III-nitride layer, and forming a gate metal layer coupled to the III-nitride gate layer.

In one aspect of the present invention, a method for manufacturing a vertical JFET device includes providing a III-nitride substrate having a first conductivity type, epitaxially growing a first III-nitride layer coupled to the III-nitride substrate, wherein the first III-nitride layer is characterized by a first dopant concentration and the first conductivity type, epitaxially growing a second III-nitride layer coupled to the first III-nitride layer, wherein the second III-nitride layer is characterized by a second dopant concentration and the first conductivity type, forming a hardmask layer having a first set of openings on the second III-nitride layer to expose a first surface portion of the second III-nitride layer, and etching the first surface portion of the second III-nitride layer using the hardmask layer as a mask to form a plurality of trenches within the first III-nitride layer, wherein the plurality of trenches extend to a predetermined depth. The method also includes selectively regrowing a third III-nitride structure in the plurality of trenches, wherein the third III-nitride structure is characterized by a second conductivity type opposite to the first conductivity type, forming a second pattern on the hardmask layer having a second set of openings on the second III-nitride layer to expose a second surface portion of the second III-nitride layer, etching through the second III-nitride layer and the third III-nitride structure, using the hardmask layer as a mask, to form a plurality of recess regions, forming a III-nitride gate layer in the plurality of recess regions using an ion implantation process or a dopant diffusion process, wherein the III-nitride gate layer is characterized by the second conductivity type; removing the hardmask layer, forming a source metal layer coupled to the second III-nitride layer, and forming a gate metal layer coupled to the III-nitride gate layer.

Numerous benefits are achieved by way of the present invention over conventional techniques. For example, embodiments of the present invention provide a field-effect transistor (FET) device utilizing a super junction structure, which has improved performance characteristics. When the rated voltage is increased, the drift layer in a conventional FET device becomes thicker, and the specific on-resistance is increased. In contrast to the conventional FET device, the FET device according to some embodiments of the present invention can achieve a comparatively lower specific on-resistance and lower gate charge while maintaining a given high breakdown voltage. For the switching characteristics of a transistor, a FET device according to some embodiments of the present invention can achieve a faster reverse recovery time of the internal diode compared with a conventional FET device.

BRIEF DESCRIPTION OF THE DRAWINGS

FIGS. 3A-3C and 3F-3N are partial cross-sectional views illustrating intermediate stages of a method of manufacturing a vertical JFET device with a super junction structure according to an embodiment of the present invention.

FIGS. 3D and 3E are partial plan view diagrams illustrating patterning of a hardmask layer according to various embodiments of the present invention.

FIGS. 5A through 5J are partial cross-sectional views illustrating intermediate stages of a method of manufacturing a vertical JFET device with a super junction structure according to an embodiment of the present invention.

FIGS. 7A through 7J are partial cross-sectional views illustrating intermediate stages of a method of manufacturing a vertical JFET device with a super junction structure according to an embodiment of the present invention.

FIGS. 10A-10C and 10F-10P are partial cross-sectional views illustrating intermediate stages of a method of manufacturing a MOSFET device with a super junction structure according to an embodiment of the present invention.

DETAILED DESCRIPTION OF SPECIFIC EMBODIMENTS

Super junction based silicon power devices have been widely utilized due to their ability to achieve much lower specific on-resistance ($R_{dson}$) in a given die area than conventional non-super junction based power devices at comparable operating voltages. Power devices using wide band gap (WBG) semiconductor materials, such as gallium nitride (GaN) and silicon carbide (SiC) can benefit from super junction structures. However, there remain challenges in adoption and commercialization of WBG power devices with a super junction structure due to a range of technical difficulties.

Junction field-effect transistors (JFETs) and metal-oxide-semiconductor field effect transistors (MOSFETs) are two types of power transistors widely used in power conversion electronics. Their unipolar nature and low $R_{dson}$ make them preferable power transistor choices for applications in which fast switching speed and low power loss are desired. Vertical JFET devices and MOSFET devices utilizing III-nitride materials, such as GaN, can achieve breakdown voltages up to thousands and tens of thousands of volts when thicker and lighter doped GaN epitaxial films are used. The use of thick, lightly doped epitaxial films increases the specific on-resistance ($R_{dson}×$Area), thus increasing the die size for a given on-resistance target. By employing a super junction structure, the $R_{dson}×$Area of a JFET device and/or a MOSFET device can be reduced up to 10 times without compromising the breakdown voltage that is achieved, allowing the die size to be decreased accordingly for a given target on-resistance.

Figure 1:
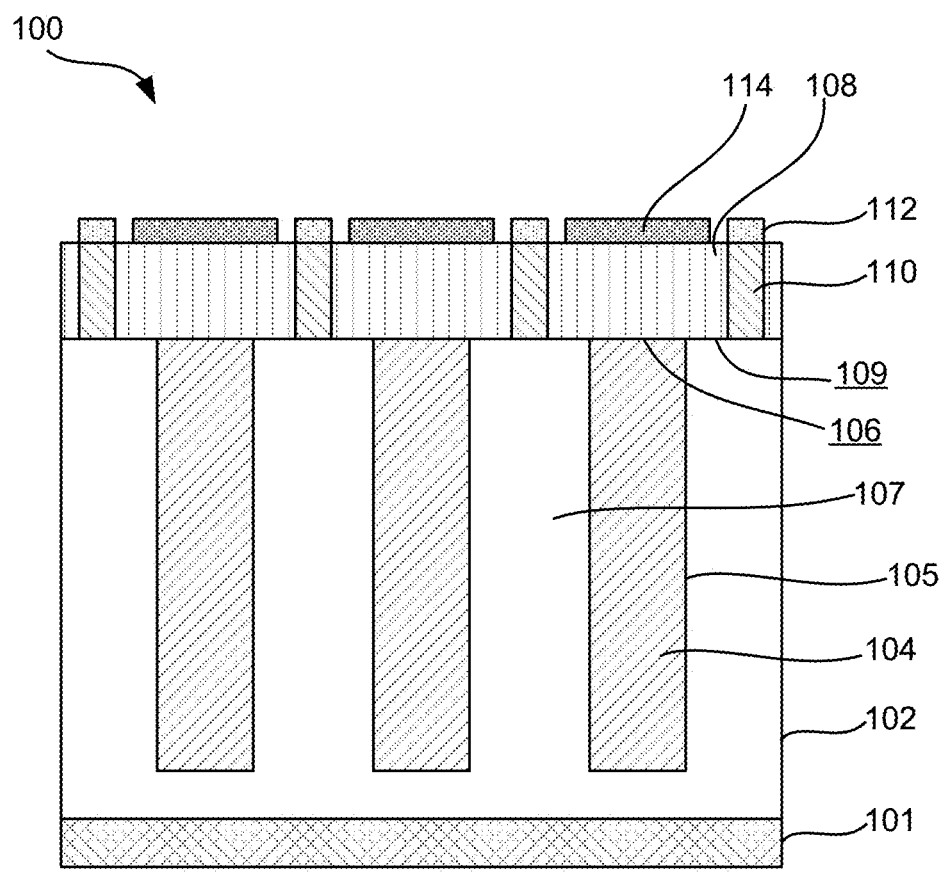
FIG. 1 is a partial cross-sectional view of a vertical junction field-effect transistor (JFET) device with super junction structure according to an embodiment of the present invention.

FIG. 1 shows a partial cross section of a vertical JFET device 100 manufactured according to some embodiments of the present invention. Vertical JFET device 100 may include a semiconductor substrate 101, a drift layer 102 coupled to substrate 101 and having a plurality of trenches 105, and a semiconductor structure 104 selectively regrown within trenches 105. In one embodiment, semiconductor substrate 101 may include III-nitride compounds, such as GaN. In one embodiment, semiconductor substrate 101 may include heavily n-type doped GaN, which can be used as drain contact. The dopant concentration of semiconductor substrate 101 may vary as appropriate to the particular application. In one embodiment, a dopant concentration of semiconductor substrate 101 may be in the range from $1×10^{18}$ atoms/cm$^3$ to $3×10^{19}$ atoms/cm$^3$. Each of the plurality of trenches 105 is separated by a drift region 107 of drift layer 102. In some embodiments, semiconductor structure 104 may include III-nitride compounds, such as GaN. For example, semiconductor structure 104 may include p-type doped GaN. The dopant concentration of semiconductor structure 104 may vary as appropriate to the particular application. In one embodiment, the dopant concentration of semiconductor structure 104 may be in a range from $1×10^{17}$ atoms/cm$^3$ to $3×10^{18}$ atoms/cm$^3$.

Vertical JFET device 100 may further include a channel layer 110 coupled to semiconductor structure 104. Specifically, channel layer 110 is coupled to the upper portion of drift region 107 of semiconductor structure 104. In some embodiments, channel layer 110 may include III-nitride compounds, such as GaN. For example, channel layer 110 may include n-type doped GaN. In some embodiments, channel layer 110 is more heavily doped than drift layer 102. Vertical JFET device 100 may further include a gate layer 108 coupled to semiconductor structure 104, surrounding channel layer 110. In some embodiments, gate layer 108 may include III-nitride compounds, such as GaN. For example, gate layer 108 may include p-type doped GaN.

Vertical JFET device 100 may further include a source metal layer 112 deposited on the upper portion of channel layer 110. In some embodiments, source metal layer 112 may include a refractory metal, a refractory metal compound or a refractory metal alloy (e.g., TiN). Vertical JFET device 100 may further include a gate metal layer 114 deposited on the upper portion of gate layer 108. In some embodiments, gate metal layer 114 may include molybdenum, gold, nickel, platinum, tantalum, tungsten, palladium, silver, aluminum, combinations thereof, and the like.

Operation of the vertical JFET can be illustrated by assuming that it is an n-channel JFET. When vertical JFET device 100 is biased into the "on" state, a bias is applied to gate region 108 such that channel layer 110 is not fully depleted, allowing electrons to flow from the source metal layer 112 (assumed to be at ground for this discussion) to the substrate 101 (assumed to be at a positive potential). Drift region 107 acts as a conducting layer between channel layer 110 and substrate 101, while semiconductor structure 104 acts as a blocking layer (i.e., no significant current is conducted vertically in semiconductor structure 104). The resistance of drift region 107 is a major component of the total on-resistance of the JFET device. This drift region resistance can be reduced by increasing the doping concentration in drift region 107.

In the "off" state, gate region 108 is biased such that channel layer 110 is fully depleted. In this state, the bias of the substrate may be increased to a large positive value, depleting both drift region 107 and semiconductor structure 104. With the appropriate balance of doping levels between drift region 107 and semiconductor structure 104, the net doping in the depletion region can be very small, so that the electric field gradient is also small. This decrease in electric field gradient by balancing the charge between drift region 107 and semiconductor structure 104 allows the designer to decrease the on-resistance of the device while maintaining high breakdown voltages in the device.

Figure 2:
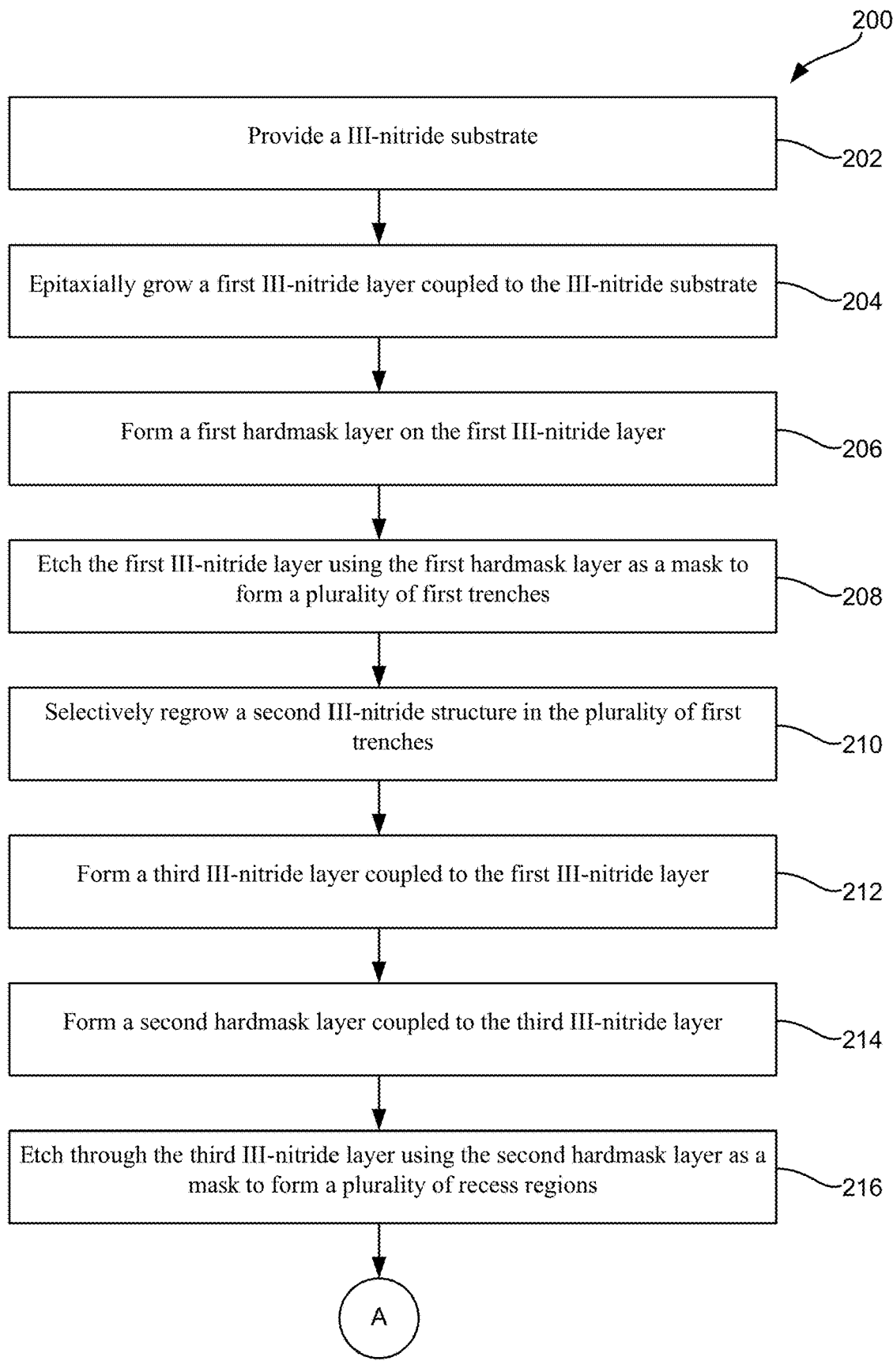
FIG. 2 is a simplified flowchart showing a method of manufacturing a vertical JFET device with a super junction structure according to an embodiment of the present invention.
Figure 2:
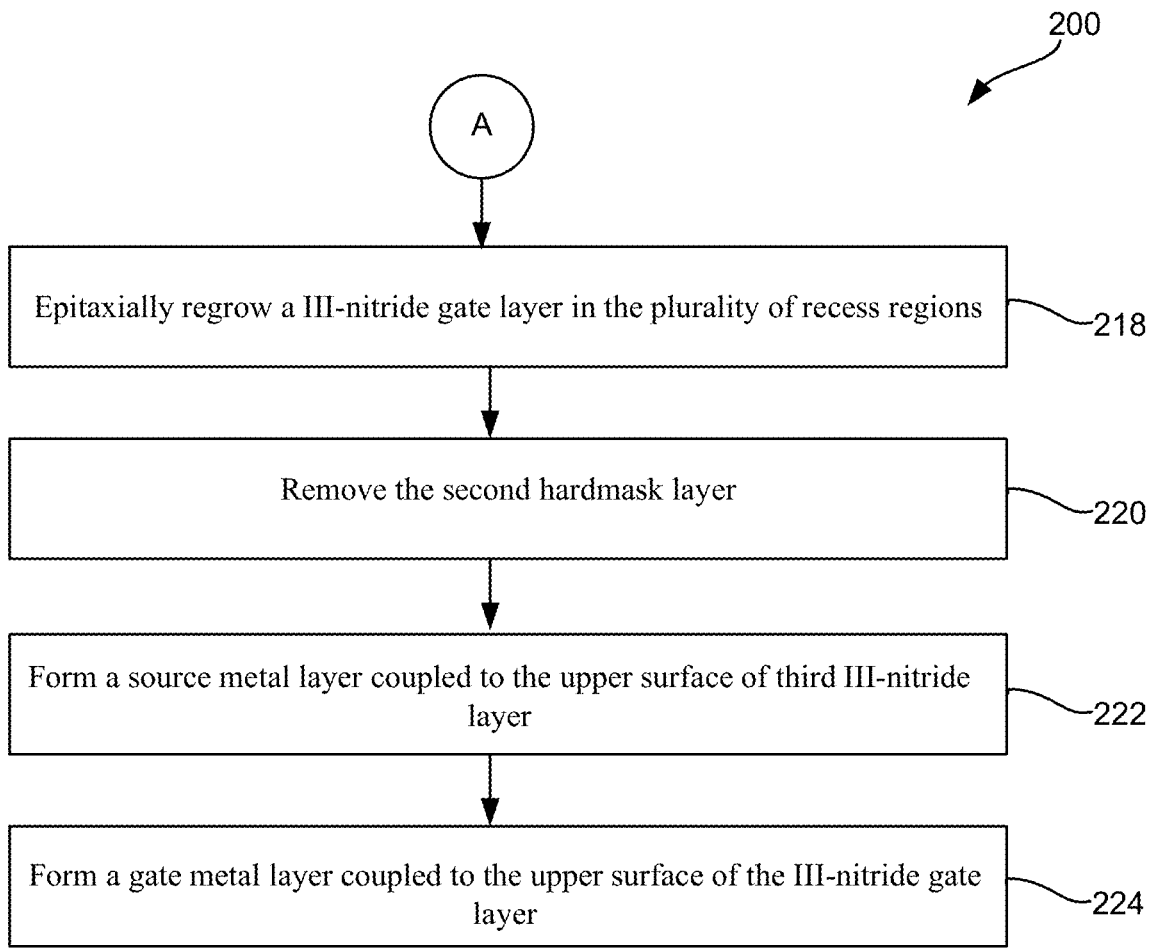

FIG. 2 is a simplified flowchart of a method 200 for manufacturing a vertical JFET device with a super junction structure according to an embodiment of the present invention. Referring to FIG. 2, method 200 may include providing a III-nitride substrate having a first conductivity type (202). In one embodiment, the III-nitride substrate is a n+ GaN substrate. The method also includes epitaxially growing a first III-nitride layer coupled to the III-nitride substrate (204). This epitaxial growth can be performed at a temperature between 950° C. and 1150° C. and can produce a grown epitaxial layer characterized by a first dopant concentration. In one embodiment, the first III-nitride layer comprises n-type doped GaN with a dopant concentration of about $5 \times 10^{16}$ atoms/cm$^3$ to $5 \times 10^{17}$ atoms/cm$^3$. In one embodiment, the first III-nitride layer may have multiple dopant concentrations, e.g., to allow a separate optimization of drift layer 102 and channel layer 110. In one embodiment, the first III-nitride layer consists of a first region coupled to the substrate with a dopant concentration between about $1 \times 10^{16}$ to $5 \times 10^{17}$ atoms/cm$^3$, and a second region on top of and coupled to the first region with a dopant concentration between about $1 \times 10^{17}$ to $5 \times 10^{17}$ atoms/cm$^3$.

The method also includes forming a first hardmask layer having a first set of openings on the first III-nitride layer to expose a first surface portion of the first III-nitride layer (206) and etching the first surface portion of the first III-nitride layer using the first hardmask layer as a mask to form a plurality of trenches within the first III-nitride layer (208). The plurality of trenches may extend to a predetermined depth (e.g., 5 to 12 μm) into the first III-nitride layer, dependent on the breakdown voltage of the design. In some embodiments, the plurality of trenches may extend through the entire thickness of the first III-nitride layer.

Method 200 may further include selectively regrowing a second III-nitride structure in the plurality of trenches (210). The second III-nitride structure can be characterized by a second conductivity type with a second dopant concentration. In one embodiment, the second III-nitride structure may include p-type doped GaN with a dopant concentration in the range of about $1 \times 10^{16}$ atoms/cm$^3$ to $5 \times 10^{17}$ atoms/cm$^3$. In some embodiments, the second III-nitride structure is selectively regrown to completely fill the plurality of trenches. In this embodiment, as illustrated in FIG. 1, the upper surface of the second III-nitride structure (e.g., upper surface 106 of semiconductor structure 104) is planar with the upper surface of the first III-nitride layer (e.g., upper surface 109 of drift layer 102).

Method 200 may further include forming a third III-nitride layer coupled to the second III-nitride structure (212). In some embodiments, the third III-nitride layer is also coupled to the first III-nitride layer. In some embodiments, the third III-nitride layer is characterized by a second dopant concentration greater than the first dopant concentration. In one embodiment, the third III-nitride layer may include n-type doped GaN with a dopant concentration of about $1 \times 10^{17}$ atoms/cm$^3$. Method 200 may further include forming a second hardmask layer having a second set of openings on the third III-nitride layer to expose a second surface portion of the third III-nitride layer (214). In some embodiments, the second surface portion of the third III-nitride layer is aligned with each of the plurality of trenches. Moreover, method 200 may include etching through the third III-nitride layer using the second hardmask layer as a mask to form a plurality of recess regions, thereby exposing the second III-nitride structure (216). In some embodiments, a portion of the first III-nitride layer is also exposed within the plurality of the recess regions.

Method 200 may further include epitaxially regrowing a III-nitride gate layer in the plurality of recess regions (218). The III-nitride gate layer is coupled to the second III-nitride structure and the III-nitride gate layer is characterized by the second conductivity type. In some embodiments, the III-nitride gate layer is also coupled to the first III-nitride layer. In one embodiment, the III-nitride gate layer may include p-type doped GaN with a dopant concentration in the range of about $1 \times 10^{18}$ atoms/cm$^3$ to $3 \times 10^{19}$ atoms/cm$^3$. Further, method 200 may include removing the second hardmask layer (220).

Method 200 may further include forming a source metal layer coupled to the upper surface of third III-nitride layer (222) and forming a gate metal layer coupled to the upper surface of the III-nitride gate layer (224).

It should be understood that the specific steps illustrated in FIG. 2 provide a particular method of manufacturing a vertical JFET device with a super junction structure according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual steps. Furthermore, additional steps may be added or removed depending on a particular application. One of ordinary skill in the art would recognize many variations, modifications, and alternatives.

Figure 3C:
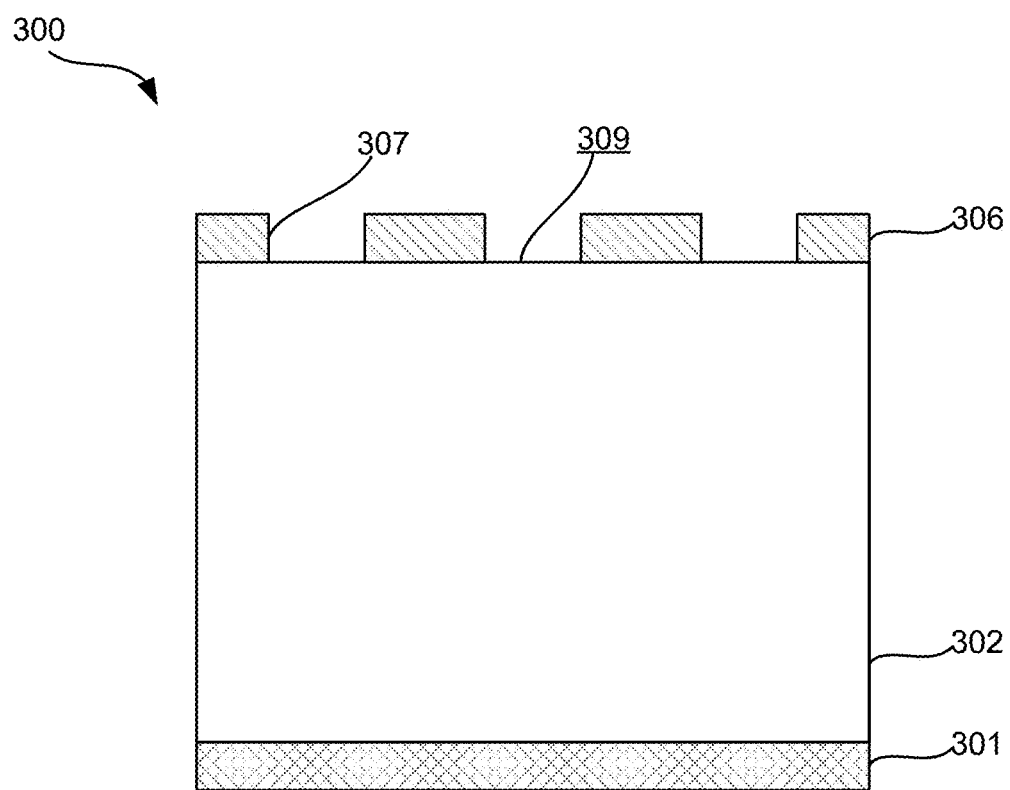
Figures 3J, 3K:
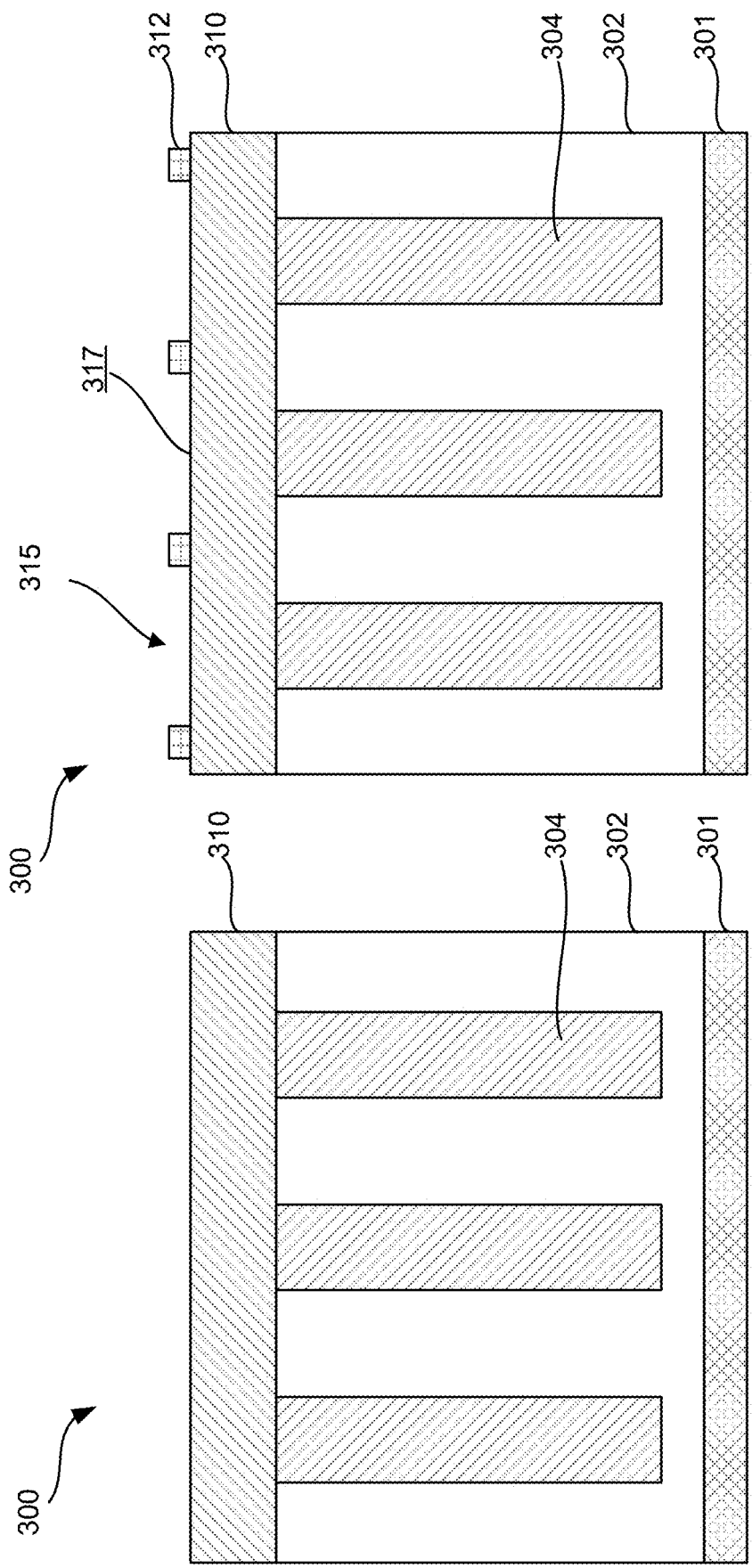
Figure 3L:
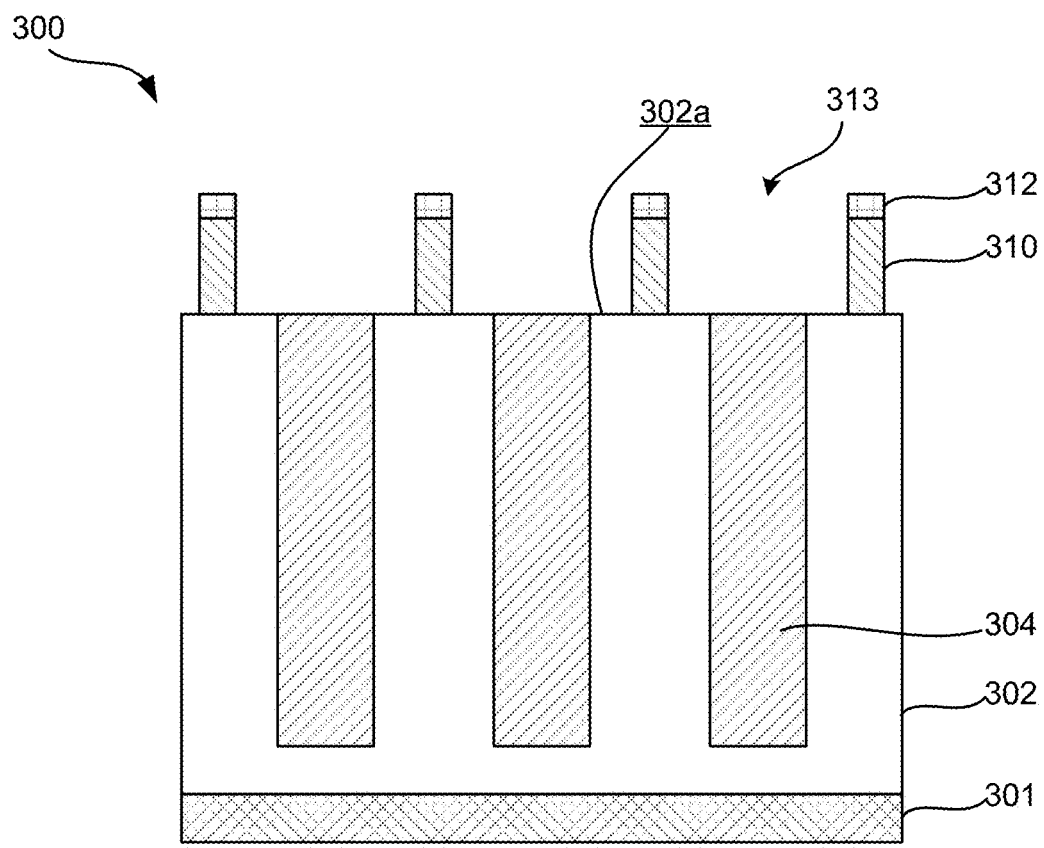
Figures 3M, 3N:
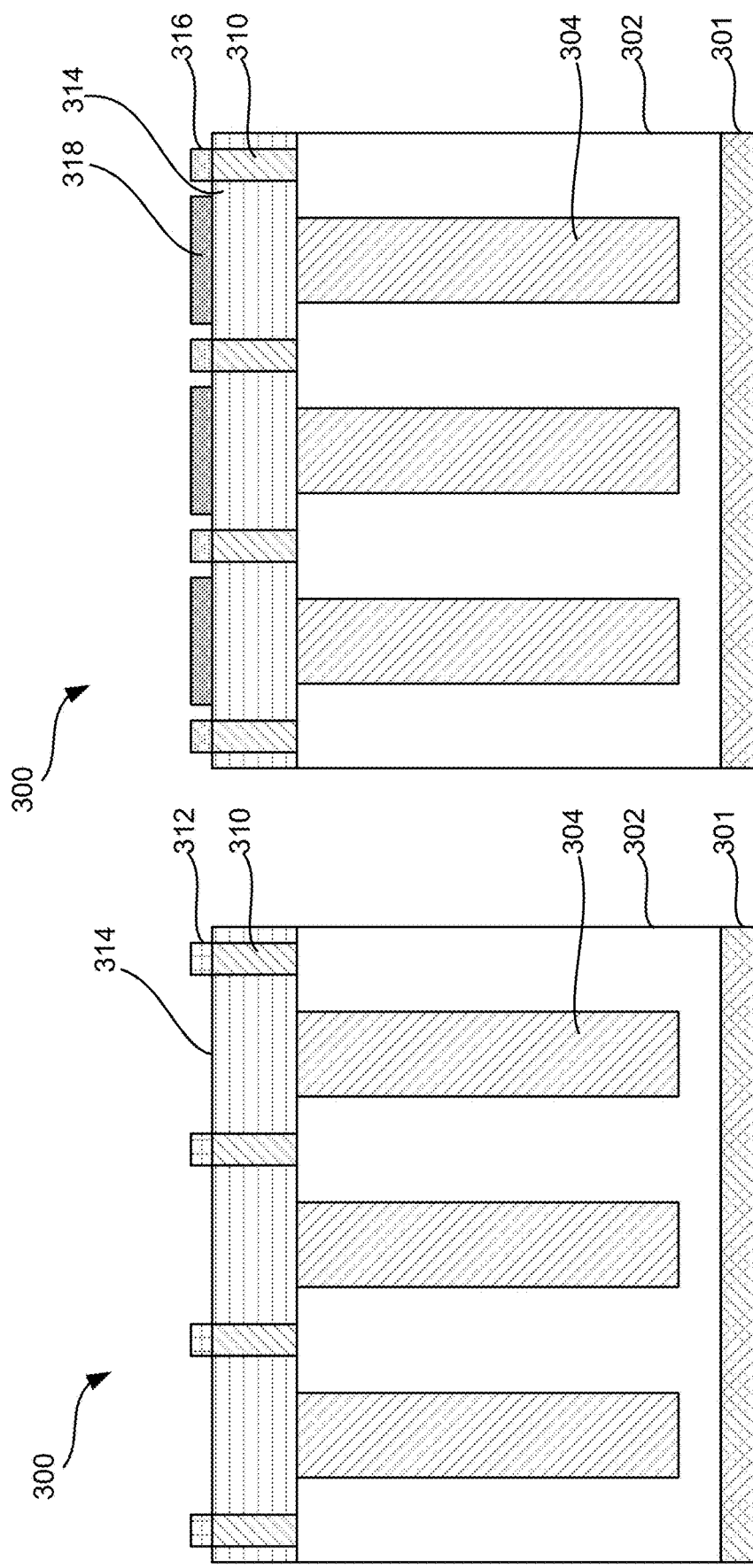

Referring back to FIG. 2 and with reference to FIGS. 3A through 3N, a method of manufacturing a vertical JFET device 300 is described according to some embodiments of the present invention. FIG. 3A is a partial cross-sectional view illustrating a vertical JFET device 300 having an n+ doped semiconductor substrate 301 and an n− doped first semiconductor layer 302 epitaxially grown on the n+ doped semiconductor substrate 301. In one embodiment, the dopant concentration of semiconductor substrate 301 may be in the range from $1 \times 10^{18}$ atoms/cm$^3$ to $3 \times 10^{19}$ atoms/cm$^3$. In one embodiment, first semiconductor layer 302 forms the drift region of the device and is doped with an n-type dopant such as silicon. In one embodiment, first semiconductor layer 302 may have a dopant concentration in the range of about $1\times10^{16}$ atoms/cm$^3$ to $5\times10^{17}$ atoms/cm$^3$ and a thickness of 2 μm-20 μm.

Referring to FIG. 3B, a hardmask layer 306 is formed on the semiconductor layer 302. In one embodiment, hardmask layer 306 may be formed by a plasma-enhanced chemical vapor deposition (PECVD) process. In another embodiment, hardmask layer 306 may be formed using low-pressure chemical vapor deposition (LPCVD). In another embodiment, hardmask layer 306 may be formed using metalorganic chemical vapor deposition (MOCVD). In another embodiment, hardmask layer 306 may be formed using physical vapor deposition (e.g., sputtering). As shown in FIG. 3C, hardmask layer 306 is patterned with a plurality of openings 307 that expose a portion 309 of the upper surface of semiconductor layer 302. In one embodiment, the cross section of the openings 307 is in circular shape as shown in FIG. 3D. In another embodiment, the cross section of the opening 307 is a rectangular shape that extends through the width of the semiconductor layer 302, as shown in FIG. 3E. In another embodiment, the hardmask layer 306 may be etched using a reactive ion etch (RIE) with a F-based chemistry. It should be understood that embodiments of the present invention should not be construed as limited to a particular shape illustrated herein but are to include variations in shape that are appropriate to the particular applications. In some embodiments, hardmask layer 306 may include silicon oxides, silicon carbides, aluminum nitrides, silicon nitrides, silicon-aluminum nitrides, silicon carbonitrides, etc. The thickness of hardmask layer 306 may be in the range of 300 nm to 600 nm. In one embodiment, a diameter/width of opening 307 is in a range of about 0.4-1.0 μm, and a distance between adjacent openings 307 is in the range of about 1.5-3 μm.

Referring to FIG. 3F, an etch process is performed using hardmask layer 306 as a mask to form a plurality of trenches 308. In some embodiments, the trenches 308 may extend to a predetermined depth within the semiconductor layer 302, for example, 70%-90% of the thickness of semiconductor layer 302. In one embodiment, the trenches 308 may extend the entire thickness of semiconductor layer 302. It should be understood the depth of trenches 308 should not be construed as being limited to a particular depth as described above but are to include variations depending on particular device design. In some embodiments, the etch process may include a RIE process. In some embodiments, the etch process may include a photoelectrochemical (PEC) process.

In one embodiment, after forming the trenches 308, a cleaning process is performed using a wet chemical solution. In one embodiment, the cleaning process may include a hydroxide-based etch, such as a solution including potassium hydroxide (KOH) or tri-methyl ammonium hydroxide (TMAH), which provides an anisotropic etch, allowing for the formation of trenches with vertical sidewalls along GaN m-planes. In one embodiment, the cleaning process is performed using a TMAH solution of about 25% by weight, at a temperature of about 85° C., and for a duration of about 30 minutes. In another embodiment, prior to performing a cleaning using the TMAH solution, a pre-cleaning such as piranha clean using a $H_2SO_4$:$H_2O$ in a volume ratio 2:1 for 2 minutes may also be performed.

Referring to FIG. 3G, after cleaning, a second semiconductor structure 304 is selectively regrown within the trenches 308. In one embodiment, second semiconductor structure 304 may include a p-type GaN layer that is epitaxially and uniformly grown in the trenches at a temperature of about 900° C. to 1040° C. up to a thickness that is substantially planar to the upper surface of first semiconductor layer 302, as shown in FIG. 3H. In one embodiment, second semiconductor structure 304 may be regrown to completely fill the trenches 308. In one embodiment, second semiconductor structure 304 is doped with p-type dopant such as Mg. In one embodiment, second semiconductor structure 304 may have a dopant concentration in the range of about $5\times10^{16}$ atoms/cm$^3$ to $5\times10^{17}$ atoms/cm$^3$. According to some embodiments, the dopant concentration is determined to achieve a charge balance with neighboring n-type doped first semiconductor layer 302. In one embodiment, the selective regrowth process may include the use of an MOCVD process.

Referring to FIG. 3I, first hardmask layer 306 is removed to expose the upper surface of first semiconductor layer 302 and second semiconductor structure 304. In one embodiment, first hardmask layer 306 is removed using a wet or dry etch process.

FIGS. 3J through 3L illustrate the process stages to form a plurality of semiconductor fins on first semiconductor layer 302. Referring to FIG. 3J, a third semiconductor layer 310 is epitaxially grown on first semiconductor layer 302. In one embodiment, third semiconductor layer 310 may include III-nitride compounds, such as n-type doped GaN with a dopant concentration greater than that of first semiconductor layer 302. For example, third semiconductor layer 310 can have a dopant concentration in the range of about $1\times10^{17}$ atoms/cm$^3$ to $5\times10^{17}$ atoms/cm$^3$.

Referring to FIG. 3K, a second hardmask layer 312 is formed on third semiconductor layer 310. Second hardmask layer 312 is patterned with a plurality of openings 315 aligned with each of the plurality of trenches 308 to expose a portion 317 of the upper surface of third semiconductor layer 310. In one embodiment, second hardmask layer 312 may be formed by PECVD. In another embodiment, hardmask layer 312 may be formed using LPCVD. In another embodiment, hardmask layer 312 may be formed using MOCVD. In another embodiment, the hardmask layer 312 may be formed using physical vapor deposition (e.g., sputtering).

Referring to FIG. 3L, an etch process is performed using second hardmask layer 312 as a mask to form a plurality of recess regions 313, exposing the second semiconductor structure 304 and a portion 302a of the upper surface of first semiconductor layer 302. In one embodiment, the trench extends into the first semiconductor layer 302. The remaining part of third semiconductor layer 310 forms the plurality of fins separated by the recess regions 313. In one embodiment, the etch process may include an RIE process.

In one embodiment, after forming the recess regions 313, a cleaning process is performed using a wet chemical solution. In one embodiment, the cleaning process may include a hydroxide-based etch, such as a solution including KOH or TMAH, which provides an anisotropic etch, allowing for the formation of trenches with vertical sidewalls along GaN en-planes. In one embodiment, the cleaning process is performed using a TMAH solution of about 25% by weight, at a temperature of about 85° C. and for a duration of about 30 minutes. In another embodiment, prior to performing a cleaning using the TMAH solution, a pre-cleaning such as a piranha clean using a $H_2SO_4$:$H_2O$ in a volume ratio 2:1 for 2 minutes may also be performed.

Referring to FIG. 3M, after cleaning, a semiconductor gate layer 314 is epitaxially regrown in the recess regions 313. In one embodiment, semiconductor gate layer 314 may be deposited on second semiconductor structure 304 in order to provide the gate structure described herein. In one embodiment, semiconductor gate layer 314 is also coupled with the portion 302a of first semiconductor layer 302, surrounding third semiconductor layer 310, i.e. the plurality of fins. Then, second hardmask layer 312 is removed. In one embodiment, second hardmask layer 312 is removed using wet or dry etch processes.

Referring to FIG. 3N, a source metal layer 316 is deposited on the upper portion of third semiconductor layer 310. In other words, source metal layer 316 is formed on the plurality of fins. In some embodiments, source metal layer 316 forms a self-aligned contact to the upper portion of third semiconductor layer 310. A gate metal layer 318 is deposited on the upper portion of semiconductor gate layer 314.

Figure 4:
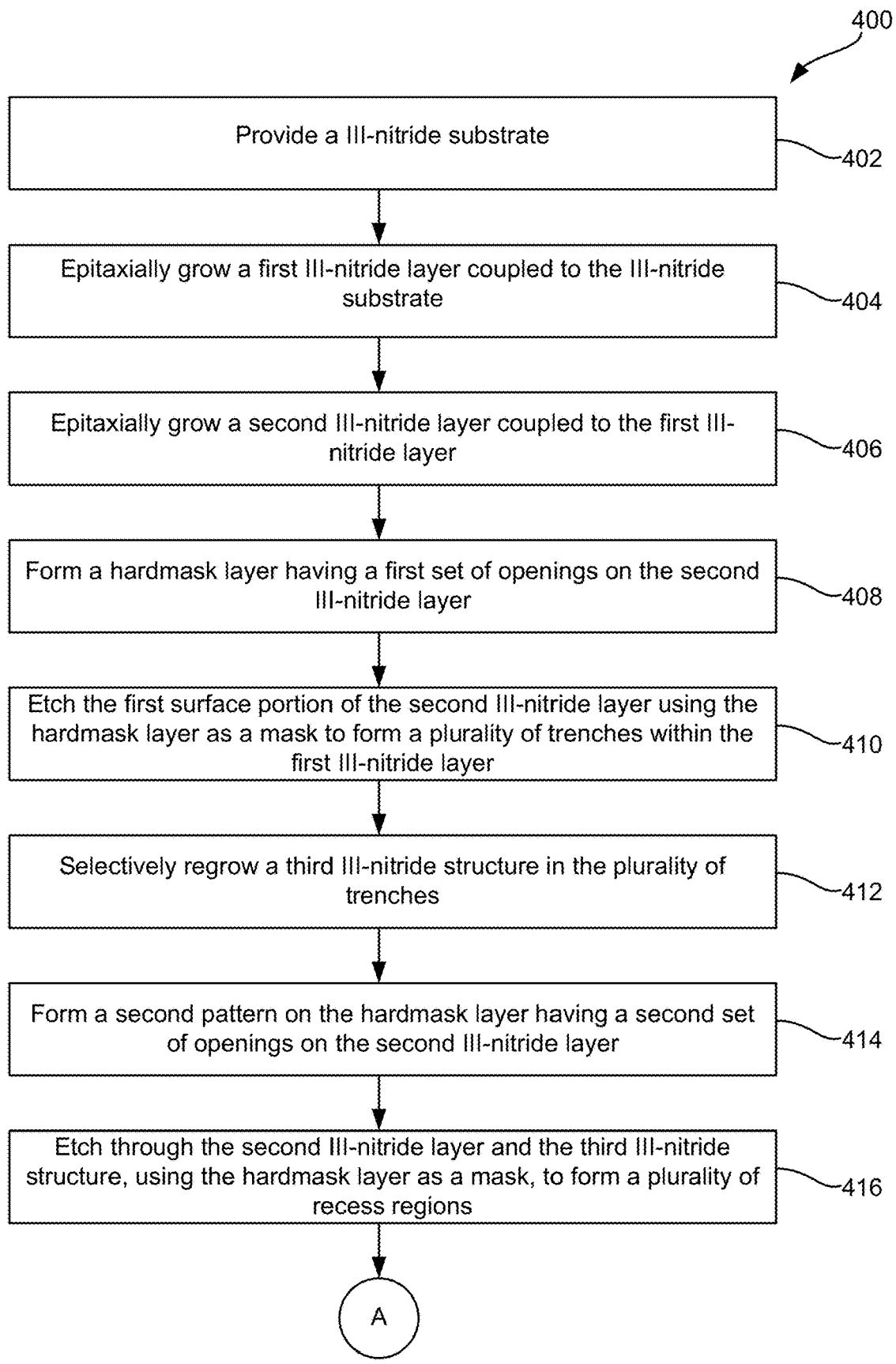
FIG. 4 is a simplified flowchart showing a method of manufacturing a vertical JFET device with a super junction structure according to an embodiment of the present invention.
Figure 4:
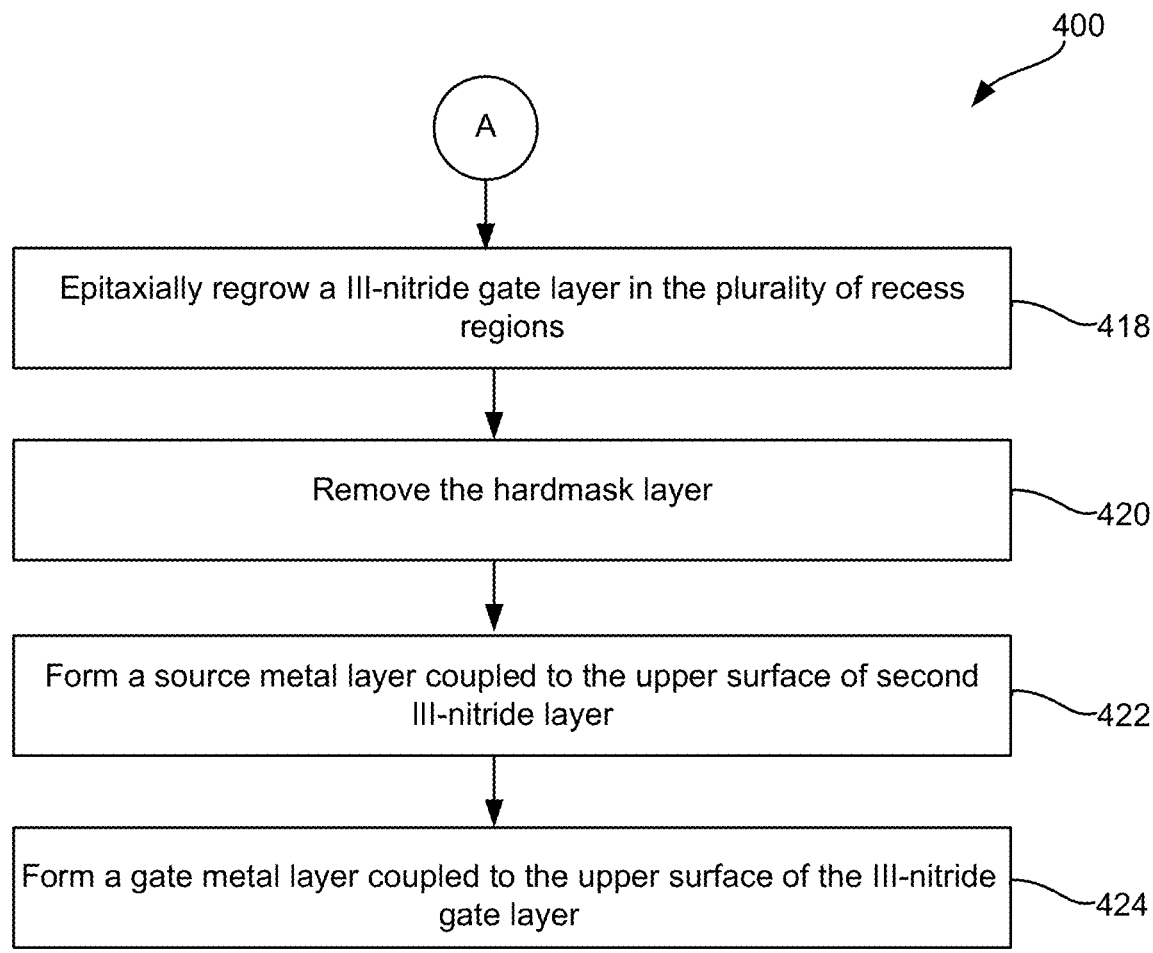

FIG. 4 is a simplified flowchart of a method 400 for manufacturing a vertical JFET device with a super junction structure according to an embodiment of the present invention. Referring to FIG. 4, method 400 may include providing a III-nitride substrate having a first conductivity type (402). In one embodiment, the III-nitride substrate is an n+ GaN substrate. The method also includes epitaxially growing a first III-nitride layer coupled to the III-nitride substrate (404). This epitaxial growth can be performed at a temperature between 950° C. and 1150° C. and can produce a grown epitaxial layer characterized by a first dopant concentration. In one embodiment, the first III-nitride layer comprises n-type doped GaN with a dopant concentration of about $5 \times 10^{16}$ atoms/cm$^3$ to $5 \times 10^{17}$ atoms/cm$^3$. In one embodiment, the first III-nitride layer may have multiple dopant concentrations, e.g., to allow separate optimization of drift layer 102 and channel layer 110 as shown in FIG. 1. In one embodiment, the first III-nitride layer consists of a first region coupled to the III-nitride substrate with a dopant concentration between about $1 \times 10^{16}$ atoms/cm$^3$ to $5 \times 10^{17}$ atoms/cm$^3$, and a second region on top of and coupled to the first region with a dopant concentration between about $5 \times 10^{16}$ atoms/cm$^3$ to $5 \times 10^{17}$ atoms/cm$^3$, where the dopant concentration of the second region is equal to or greater than the dopant concentration in the first region. The thickness of the first III-nitride layer is dependent on the desired breakdown voltage of the finished JFET device. For example, to manufacture a vertical JFET device with a breakdown voltage of 1200V, the thickness of the first III-nitride layer may be in the range of about 6 µm to 12 µm.

Method 400 may further include epitaxially growing a second III-nitride layer coupled to the first III-nitride layer (406). In some embodiments, the second III-nitride layer is characterized by a second dopant concentration greater than the dopant concentration of the second region of the first III-nitride layer. In one embodiment, the second III-nitride layer may include n-type doped GaN with a dopant concentration of about $1 \times 10^{17}$ atoms/cm$^3$.

The method 400 also includes forming a hardmask layer having a first set of openings on the second III-nitride layer to expose a first surface portion of the second III-nitride layer (408) and etching the first surface portion of the second III-nitride layer using the hardmask layer as a mask to form a plurality of trenches within the first III-nitride layer (410). The plurality of trenches may extend to a predetermined depth (e.g., 5 µm to 12 µm) into the first III-nitride layer. In some embodiments, the plurality of trenches may extend through the entire thickness of the first III-nitride layer. In some embodiments, a composite hard mask is formed by depositing a metal layer and then a dielectric layer to form the composite hard mask. In these embodiments, as will be evident to one of skill in the art, the composite hard mask is then patterned prior to performing etching processes.

Method 400 may further include selectively regrowing a third III-nitride structure in the plurality of trenches (412). The third III-nitride structure can be characterized by a second conductivity type with a third dopant concentration. In one embodiment, the third III-nitride structure may include p-type doped GaN with a dopant concentration in the range of about $1 \times 10^{16}$ atoms/cm$^3$ to $5 \times 10^{17}$ atoms/cm$^3$. In some embodiments, the third III-nitride structure is selectively regrown to completely fill the plurality of trenches. In this embodiment, the upper surface of the third III-nitride structure is planar with the upper surface of the second III-nitride layer.

Method 400 may further include forming a second pattern on the hardmask layer having a second set of openings on the second III-nitride layer to expose a second surface portion of the second III-nitride layer (414). In some embodiments, the second surface portion of the second III-nitride layer is aligned with each of the plurality of trenches, such that the trench surface is approximately centered in the hardmask opening. Moreover, method 400 may include etching through the second III-nitride layer and simultaneously etching the third III-nitride structure to approximately the same depth as the etch through the exposed second III-nitride layer, using the hardmask layer as a mask, to form a plurality of recess regions, thereby exposing the first III-nitride layer (416). In some embodiments, the etch depth extends into the first III-nitride layer within the plurality of the recess regions. In other words, method 400 may include etching at least a portion of the first III-nitride layer.

Method 400 may further include epitaxially regrowing a III-nitride gate layer in the plurality of recess regions (418). The III-nitride gate layer is coupled to the third III-nitride structure and the III-nitride gate layer is characterized by the second conductivity type (p GaN gate). In some embodiments, the III-nitride gate layer is also coupled to the first III-nitride layer. In one embodiment, the III-nitride gate layer may include p-type doped GaN with a dopant concentration in the range of about $1 \times 10^{18}$ atoms/cm$^3$ to $3 \times 10^{19}$ atoms/cm$^3$. Further, method 400 may include removing the hardmask layer (420).

Method 400 may further include forming a source metal layer coupled to the upper surface of second III-nitride layer (422) and forming a gate metal layer coupled to the upper surface of the III-nitride gate layer (424).

It should be understood that the specific steps illustrated in FIG. 4 provide a particular method of manufacturing a vertical JFET device with a super junction structure according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual steps. Furthermore, additional steps may be added or removed depending on a particular application. One of ordinary skill in the art would recognize many variations, modifications, and alternatives.

Figure 5C:
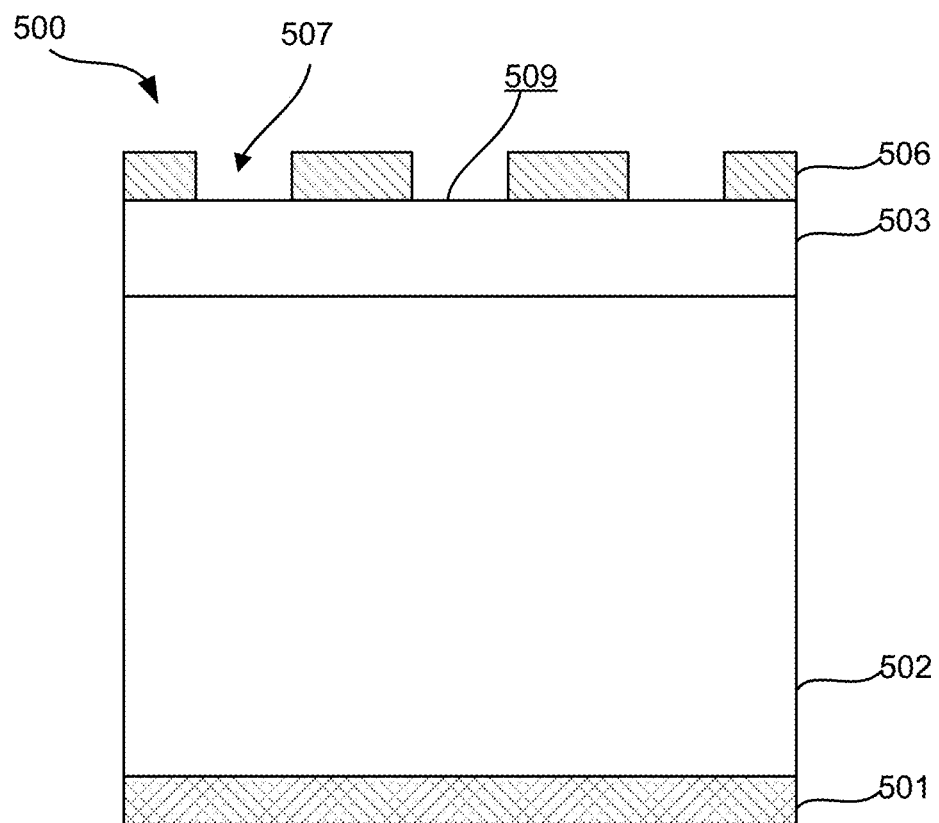

Referring back to FIG. 4 and with reference to FIGS. 5A through 5J, a method of manufacturing a vertical JFET device 500 is described according to some embodiments of the present invention. FIG. 5A is a partial cross-sectional view illustrating vertical JFET device 500 having an n+ doped semiconductor substrate 501 and an n− doped first semiconductor layer 502 epitaxially grown on the n+ doped semiconductor substrate 501. In one embodiment, the dopant concentration of semiconductor substrate 501 may be in the range from $1\times10^{18}$ atoms/cm$^3$ to $3\times10^{19}$ atoms/cm$^3$. In one embodiment, first semiconductor layer 502 forms the drift region of the device and is doped with n-type dopant such as silicon. In one embodiment, first semiconductor layer 502 may have a dopant concentration in the range of about $1\times10^{16}$ atoms/cm$^3$ to $5\times10^{17}$ atoms/cm$^3$ and a thickness of 2 µm-20 µm.

Referring to FIG. 5A, a second semiconductor layer 503 is epitaxially grown on first semiconductor layer 502. In one embodiment, second semiconductor layer 503 may include III-nitride compounds, such as n-type doped GaN with a dopant concentration greater than that of first semiconductor layer 502. For example, second semiconductor layer 503 can have a dopant concentration in the range of about $1\times10^{17}$ atoms/cm$^3$ to $5\times10^{17}$ atoms/cm$^3$.

Referring to FIG. 5B, a hardmask layer 506 is formed on second semiconductor layer 503. In one embodiment, hardmask layer 506 may be formed by a PECVD process. In another embodiment, hardmask layer 506 may be formed using an LPCVD process. In another embodiment, hardmask layer 506 may be formed using a MOCVD process. In another embodiment, hardmask layer 506 may be formed using a physical vapor deposition (e.g., sputtering) process.

Referring to FIG. 5C, hardmask layer 506 is patterned with a plurality of openings 507 that expose a portion 509 of the upper surface of second semiconductor layer 503. In one embodiment, the top view of the openings 507 is in circular shape like openings 307 shown in FIG. 3D. In another embodiment, the top view of the opening 507 is a rectangular shape like openings 307 shown in FIG. 3E. It should be understood that embodiments of the present invention should not be construed as limited to a particular shape illustrated herein but are to include variations in shape that are appropriate to the particular applications. In some embodiments, hardmask layer 506 may include silicon oxides, silicon carbides, silicon nitrides, aluminum nitrides, silicon-aluminum nitrides, silicon carbonitrides, etc. In some embodiments, the thickness of hardmask layer 506 is in a range of 300 nm to 600 nm. In one embodiment, a diameter/width of opening 507 is in a range of about 0.4 µm-1.0 µm, and a distance between adjacent openings 507 is in a range of about 1.5 µm-3 µm.

Figure 5D:
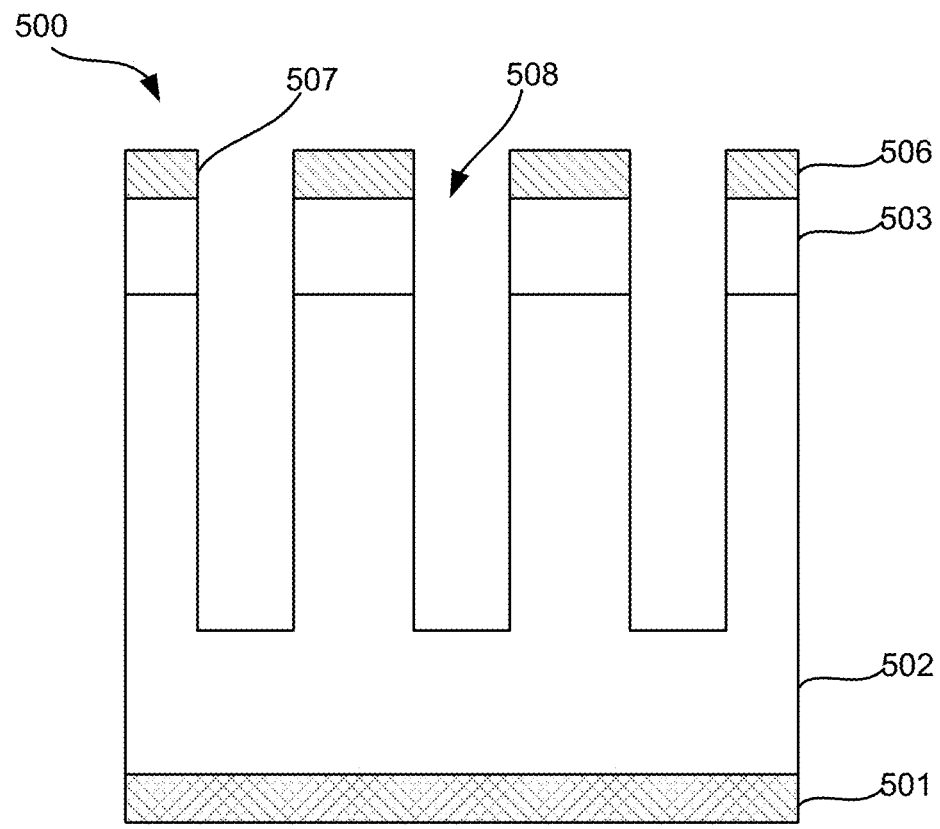

Referring to FIG. 5D, an etch process is performed using hardmask layer 506 as a mask to form a plurality of trenches 508 that extend vertically through the width of the second semiconductor layer 503 and into first semiconductor layer 502. In some embodiments, trenches 508 may extend to a predetermined depth within first semiconductor layer 502, for example, 70%-90% of the thickness of first semiconductor layer 502. In one embodiment, trenches 508 may extend the entire thickness of first semiconductor layer 502. It should be understood the depth of trenches 508 should not be construed as being limited to a particular depth as described above but are to include variations depending on particular device design. In some embodiments, the etch process may include an RIE process. In some embodiments, the etch process may include a PEC process.

In one embodiment, after forming trenches 508, a cleaning process is performed using a wet chemical solution. In one embodiment, the cleaning process may include a hydroxide-based etch, such as a solution including KOH or TMAH, which provides an anisotropic etch, allowing for the formation of trenches with vertical sidewalls along GaN m-planes. In one embodiment, the cleaning process is performed using a TMAH solution of about 25% by weight, at a temperature of about 85° C., and for a duration of about 30 minutes. In another embodiment, prior to performing a cleaning using the TMAH solution, a pre-cleaning such as piranha clean using a $H_2SO_4:H_2O$ in a volume ratio 2:1 for 2 minutes may also be performed.

Figure 5E:
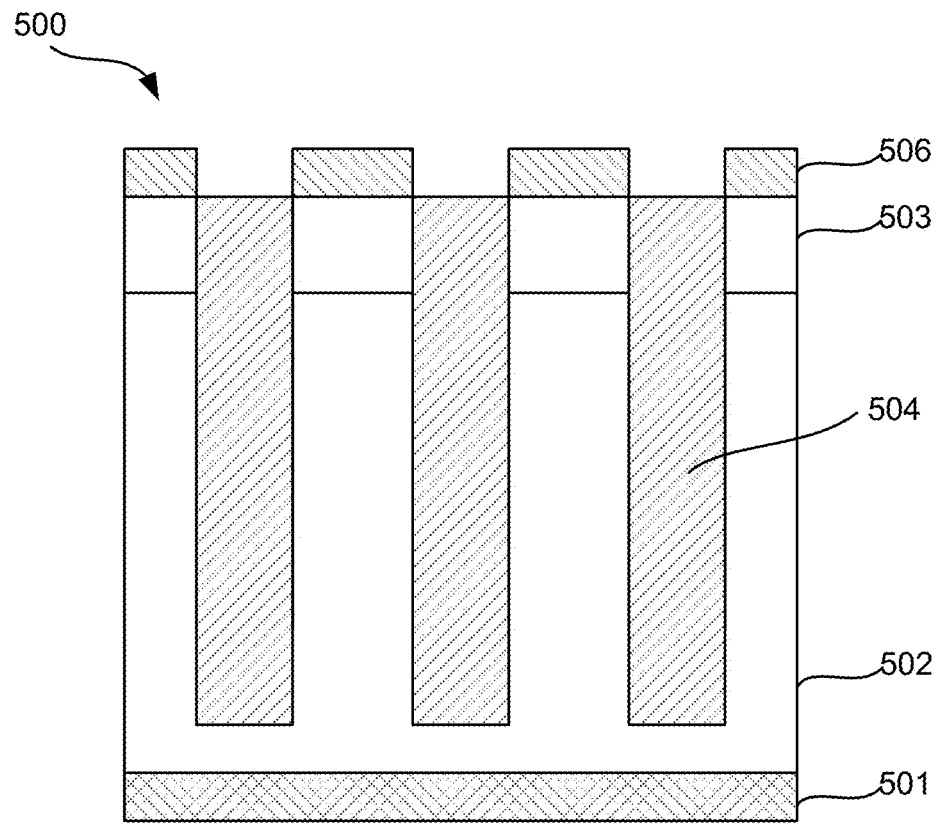

Referring to FIG. 5E, after cleaning, a third semiconductor structure 504 is selectively regrown within trenches 508. In one embodiment, third semiconductor structure 504 may include a p-type GaN layer that is epitaxially and uniformly grown in the trenches at a temperature of about 900° C. to 1040° C. up to a thickness that is substantially planar to the upper surface of second semiconductor layer 503, as shown in FIG. 5E. In one embodiment, third semiconductor structure 504 may be regrown to completely fill the trenches 508. In one embodiment, third semiconductor structure 504 is doped with p-type dopant such as Mg. In one embodiment, third semiconductor structure 504 may have a dopant concentration in the range of about $5\times10^{16}$ atoms/cm$^3$ to $5\times10^{17}$ atoms/cm$^3$. According to some embodiments, the dopant concentration is determined to achieve a charge balance with neighboring n-type doped first semiconductor layer 502. In one embodiment, the selective regrowth process may include the use of an MOCVD process. In one embodiment, the selective regrowth process is performed at atmospheric pressure. In one embodiment, the selective regrowth process is performed at reduced pressure, e.g., between 100 mTorr and 600 mTorr.

Figure 5F:
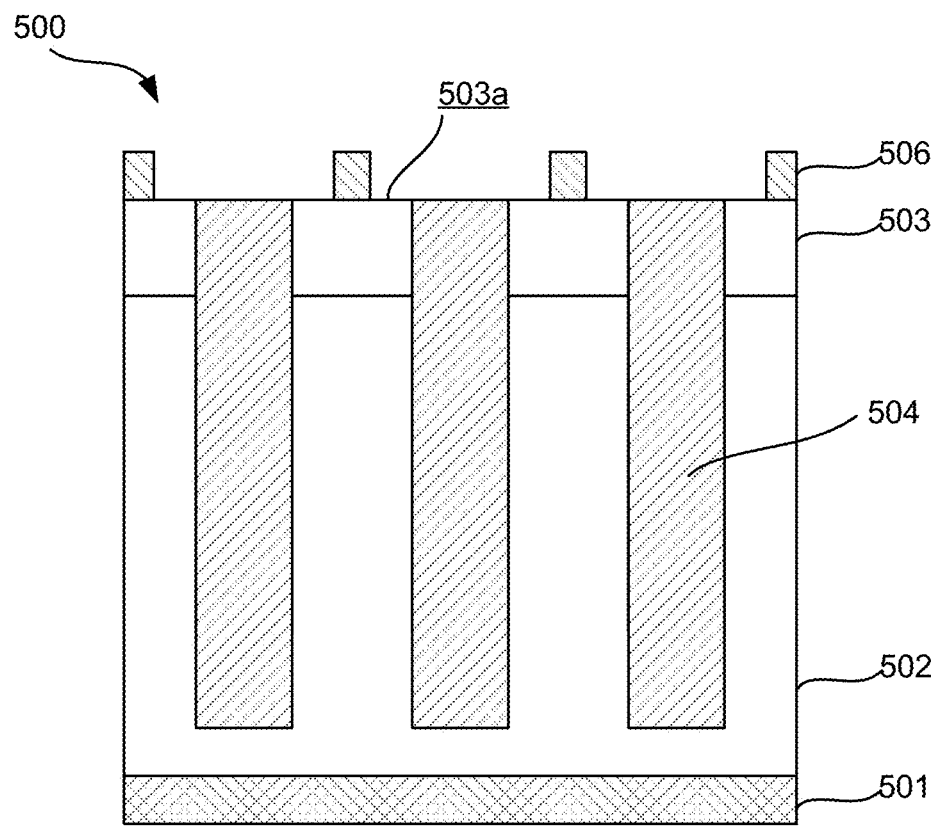
Figure 5G:
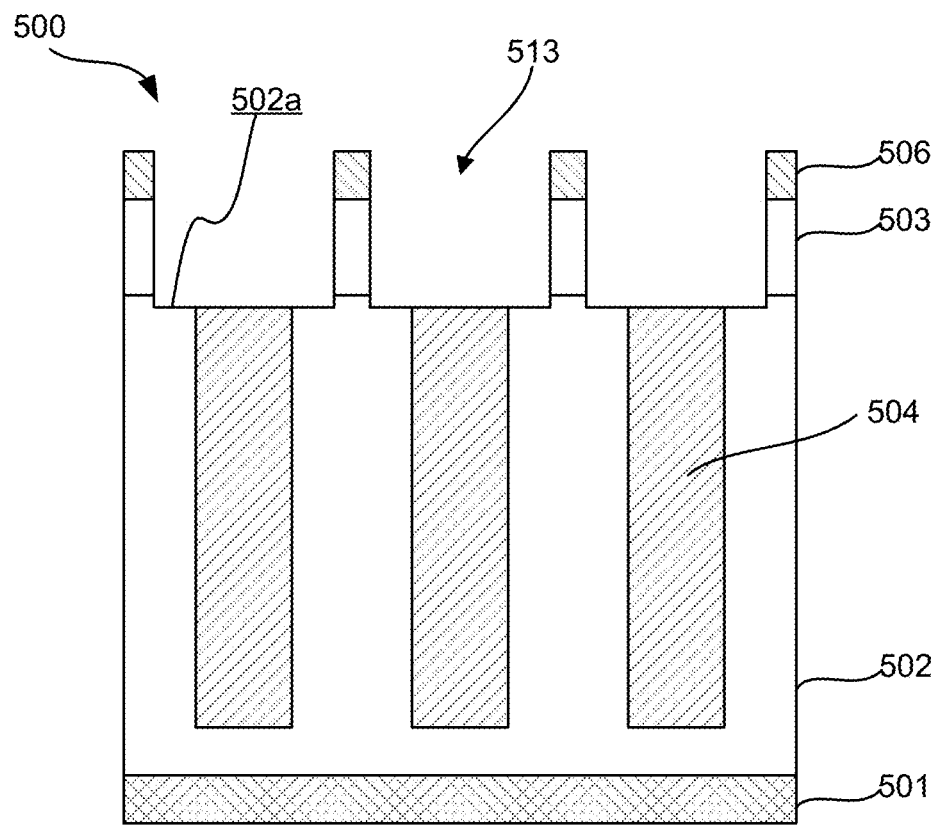

FIGS. 5F through 5G illustrate the process stages to form a plurality of semiconductor fins on first semiconductor layer 502. Referring to FIG. 5F, hardmask layer 506 is further patterned to expose a portion 503a of the upper surface of second semiconductor layer 503 and third semiconductor structure 504. In one embodiment, hardmask layer 506 is etched using a dry etch process.

Referring to FIG. 5G, an etch process is performed using hardmask layer 506 as a mask to form a plurality of recess regions 513, exposing third semiconductor structure 504 and a portion 502a of the upper surface of first semiconductor layer 502. In some embodiments, the etch process may extend a predetermined distance into first semiconductor layer 502, for example, about 0.1 µm-0.3 µm. The remaining part of second semiconductor layer 503 forms the plurality of fins separated by the recess regions 513. In one embodiment, the etch process may include an RIE process.

In one embodiment, after forming the recess regions 513, a cleaning process is performed using a wet chemical solution. In one embodiment, the cleaning process may include a hydroxide-based etch, such as a solution including KOH or TMAH, which provides an anisotropic etch, allowing for the formation of trenches with vertical sidewalls along GaN m-planes. In one embodiment, the cleaning process is performed using a TMAH solution of about 25% by weight, at a temperature of about 85° C. and for a duration of about 30 minutes. In another embodiment, prior to performing a cleaning using the TMAH solution, a pre-cleaning such as a piranha clean using a $H_2SO_4:H_2O$ in a volume ratio 2:1 for 2 minutes may also be performed.

Figure 5H:
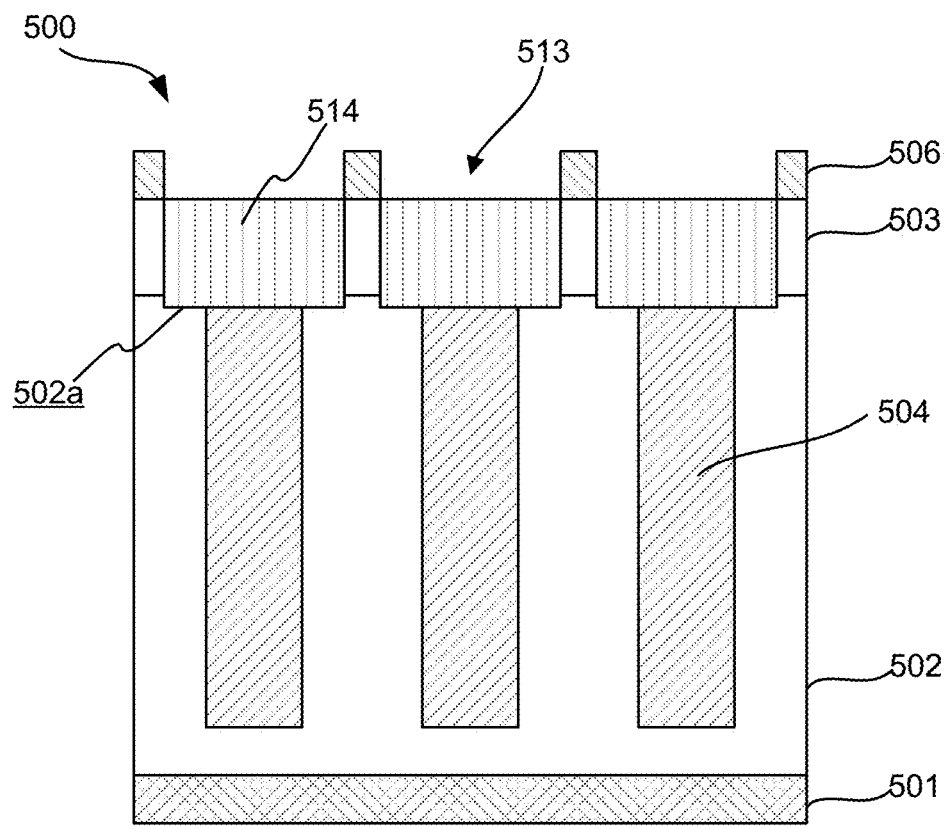
Figure 5I:
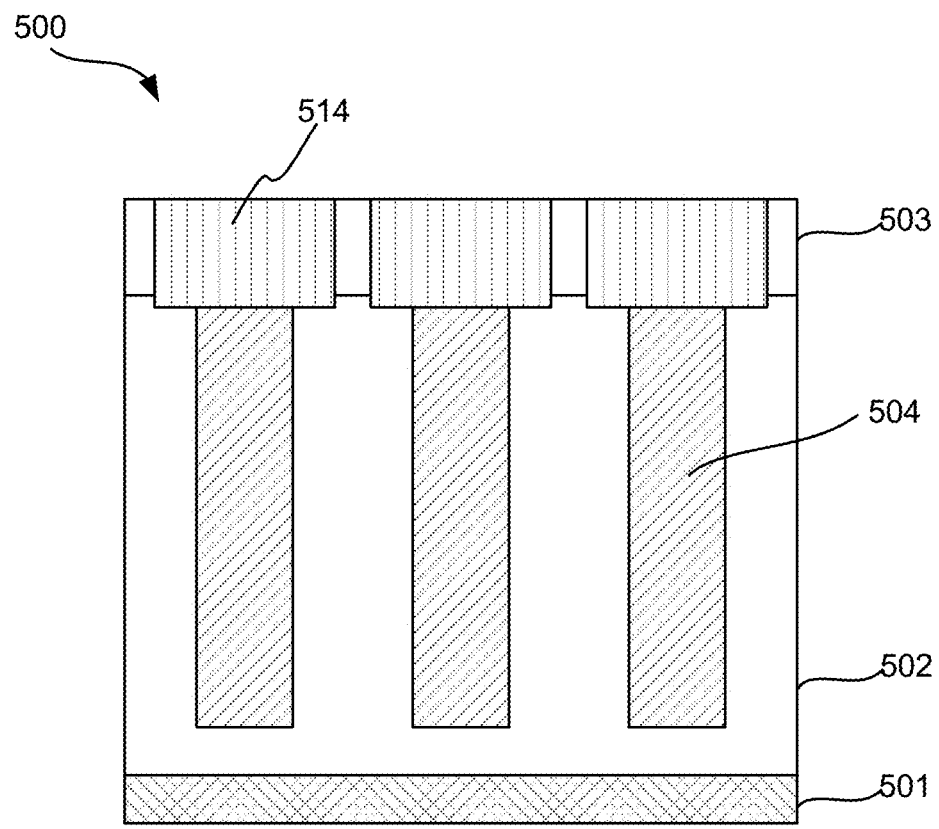

Referring to FIG. 5H, after cleaning, a semiconductor gate layer 514 is epitaxially regrown in the recess regions 513. In one embodiment, semiconductor gate layer 514 may be deposited on third semiconductor structure 504 in order to provide the gate structure described herein. In one embodiment, semiconductor gate layer 514 is also coupled with the portion 502a of first semiconductor layer 502, surrounding second semiconductor layer 503, i.e. the plurality of fins. Referring to FIG. 5I, hardmask layer 506 is removed. In one embodiment, hardmask layer 506 is removed using wet or dry etch processes.

Figure 5J:
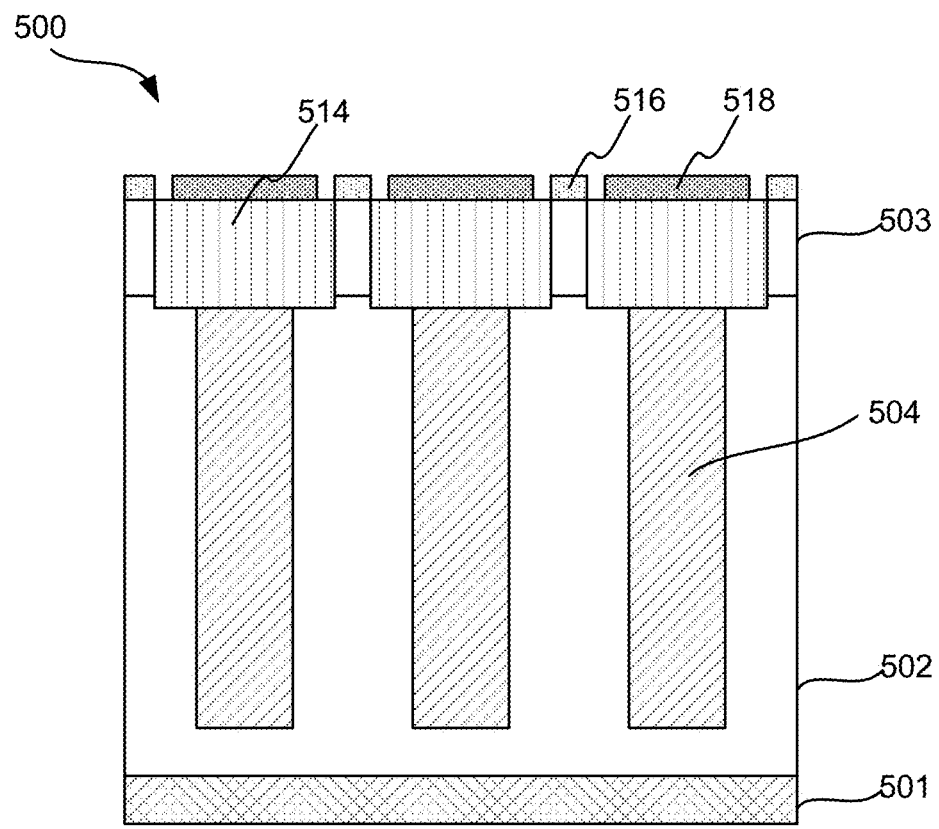

Referring to FIG. 5J, a source metal layer 516 is deposited on the upper portion of second semiconductor layer 503. In other words, source metal layer 516 is formed on the plurality of fins. In some embodiments, the source metal layer 516 forms a self-aligned contact to the upper portion of second semiconductor layer 503. Referring to FIG. 5J, a gate metal layer 518 is deposited on the upper portion of semiconductor gate layer 514.

Figure 6:
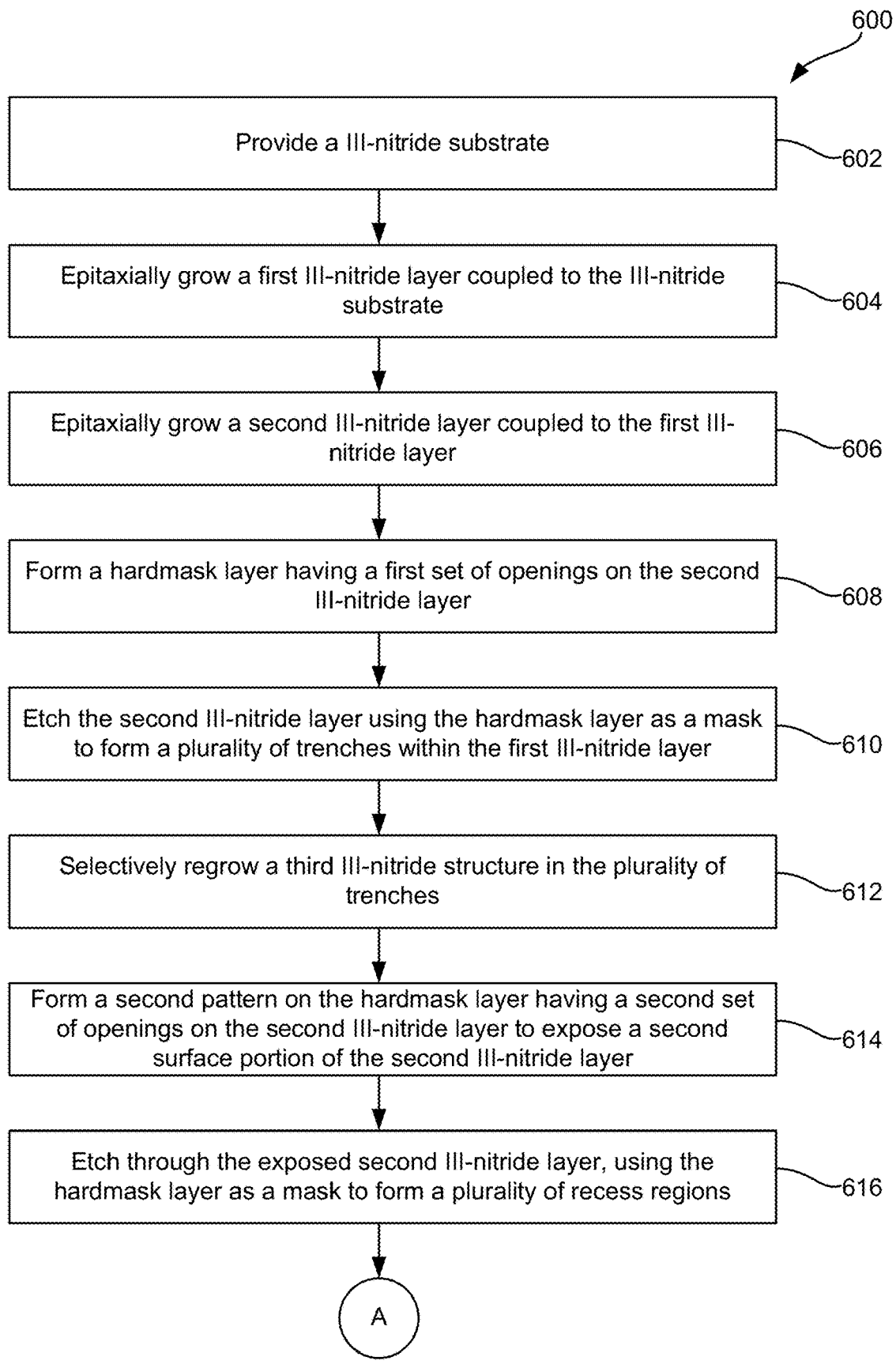
FIG. 6 is a simplified flowchart showing a method of manufacturing a vertical JFET device with a super junction structure according to an embodiment of the present invention.
Figure 6:
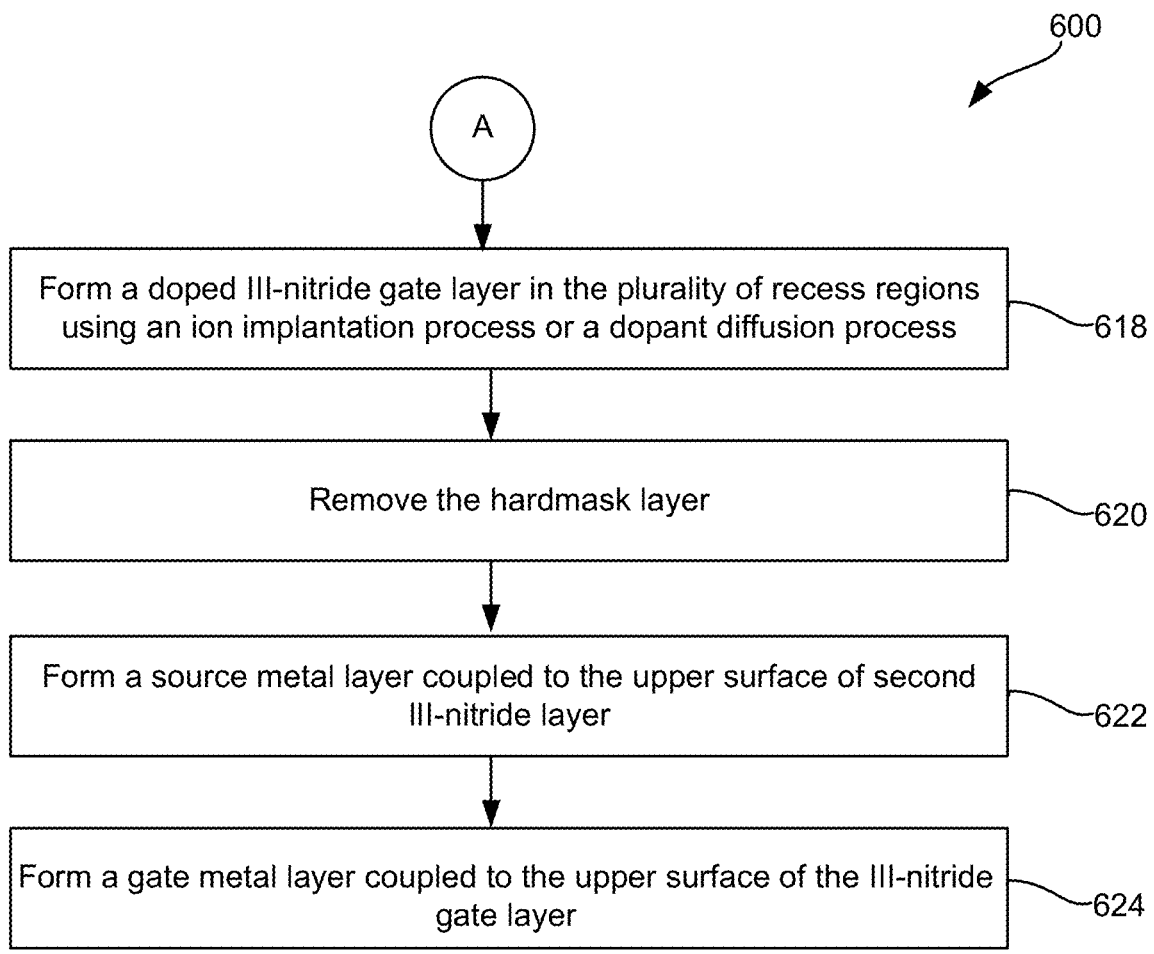

FIG. 6 is a simplified flowchart of a method 600 for manufacturing a vertical JFET device with a super junction structure according to an embodiment of the present invention. Referring to FIG. 6, method 600 may include providing a III-nitride substrate having a first conductivity type (602). In one embodiment, the III-nitride substrate is an n+ GaN substrate. The method also includes epitaxially growing a first III-nitride layer coupled to the III-nitride substrate (604). This epitaxial growth can be performed at a temperature between 950° C. and 1150° C. and can produce a grown epitaxial layer characterized by a first dopant concentration. In one embodiment, the first III-nitride layer comprises n-type doped GaN with a dopant concentration of about $5 \times 10^{16}$ atoms/cm$^3$ to $5 \times 10^{17}$ atoms/cm$^3$. In one embodiment, the first III-nitride layer may have multiple dopant concentrations, e.g., to allow separate optimization of drift layer 102 and channel layer 110 as shown in FIG. 1. In one embodiment, the first III-nitride layer consists of a first region coupled to the III-nitride substrate with a dopant concentration between about $1 \times 10^{16}$ atoms/cm$^3$ to $5 \times 10^{17}$ atoms/cm$^3$, and a second region on top of and coupled to the first region with a dopant concentration between about $5 \times 10^{16}$ atoms/cm$^3$ to $5 \times 10^{17}$ atoms/cm$^3$, where the dopant concentration of the second region is equal to or greater than the dopant concentration in the first region. The thickness of the first III-nitride layer is dependent on the desired breakdown voltage of the finished JFET device. For example, to manufacture a vertical JFET device with a breakdown voltage of 1200V, the thickness of the first III-nitride layer may be in the range of about 6 μm to 12 μm.

Method 600 may further include epitaxially growing a second III-nitride layer coupled to the first III-nitride layer (606). In some embodiments, the second III-nitride layer is characterized by a second dopant concentration greater than the dopant concentration of the second region of the first III-nitride layer. In one embodiment, the second III-nitride layer may include n-type doped GaN with a dopant concentration of about $1 \times 10^{17}$ atoms/cm$^3$.

The method 600 also includes forming a hardmask layer having a first set of openings on the second III-nitride layer to expose a first surface portion of the second III-nitride layer (608) and etching the first surface portion of the second III-nitride layer using the hardmask layer as a mask to form a plurality of trenches within the first III-nitride layer (610). The plurality of trenches may extend to a predetermined depth (e.g., 5 μm to 12 μm) into the first III-nitride layer. In some embodiments, the plurality of trenches may extend through the entire thickness of the first III-nitride layer. In some embodiments, a composite hard mask is formed by depositing a metal layer and then a dielectric layer to form the composite hard mask. In these embodiments, as will be evident to one of skill in the art, the composite hard mask is then patterned prior to performing etching processes.

Method 600 may further include selectively regrowing a third III-nitride structure in the plurality of trenches (612). The third III-nitride structure can be characterized by a second conductivity type with a third dopant concentration. In one embodiment, the third III-nitride structure may include p-type doped GaN with a dopant concentration in the range of about $5 \times 10^{16}$ atoms/cm$^3$ to $5 \times 10^{17}$ atoms/cm$^3$. In some embodiments, the third III-nitride structure is selectively regrown to completely fill the plurality of trenches. In this embodiment, the upper surface of the third III-nitride structure is planar with the upper surface of the second III-nitride layer.

Method 600 may further include forming a second pattern on the hardmask layer having a second set of openings on the second III-nitride layer to expose a second surface portion of the second III-nitride layer (614). In some embodiments, the second surface portion of the second III-nitride layer is aligned with each of the plurality of trenches, such that the trench surface is approximately centered in the hardmask opening. Moreover, method 600 may include etching through the second III-nitride layer and simultaneously etching the third III-nitride layer to approximately the same depth as the etch through the exposed second III-nitride layer, using the hardmask layer as a mask, to form a plurality of recess regions, thereby exposing the first III-nitride layer (616). In some embodiments, the etch depth extends into the first III-nitride layer within the plurality of the recess regions. In other words, method 600 may include etching at least a portion of the first III-nitride layer.

Method 600 may further include forming a doped III-nitride gate layer in the plurality of recess regions using an ion implantation process or a dopant diffusion process (618). In some embodiments, the doped III-nitride gate layer is coupled to the third III-nitride structure and the doped III-nitride gate layer is characterized by the second conductivity type (i.e., a p GaN gate). In some embodiments, the doped III-nitride gate layer is also coupled to the first III-nitride layer. In some embodiments, the doped III-nitride gate layer is formed at the bottom of the recess regions, and optionally on a contiguous portion of the sidewall of the recess regions. In some embodiments, the doped III-nitride gate layer may include first portions formed in the side walls of each of the recess regions, second portions formed in the upper portions of the first semiconductor layer exposed from each of the recess regions, and a third portion formed in the upper portion of the third semiconductor structure. In one embodiment, the doped III-nitride gate layer may include p-type doped GaN with a dopant concentration in the range of about $1 \times 10^{18}$ atoms/cm$^3$ to $3 \times 10^{19}$ atoms/cm$^3$.

In some embodiments, the doped III-nitride gate layer is formed by ion-implantation of a p-type dopant, such as Mg, Be or Zn, followed by a high-temperature anneal process. In some such embodiments, the implanted surface is encapsulated by a dielectric (e.g., silicon nitride, aluminum nitride, silicon-aluminum nitride, etc.) prior to the high-temperature anneal.

In other embodiments, the doped III-nitride gate layer is formed by a solid-phase diffusion process as described in U.S. Pat. No. 9,136,116, which is incorporated herein by reference in its entirety for all purposes. In yet other embodiments, the doped III-nitride gate layer is formed by a gas-phase doping process involving a p-type dopant precursor gas (e.g., biscyclopentadienylmagnesium) in an ammonia-rich ambient in an MOCVD reactor, at temperatures between 950° C. and 1150° C. and pressures between 100 mTorr and 1 atmosphere. In some embodiments, only a portion of the sidewall of the trench is doped to form the doped III-nitride gate layer. In such embodiments, the doped III-nitride gate layer is formed on the bottom of the trench. In some embodiments, the height of the first portion of the III-nitride gate layer may extend a predetermined distance along the thickness of the second semiconductor layer, for example 70%-90% of the thickness of the second semiconductor layer. In some other embodiments, the first portion of the III-nitride gate layer may extend the whole thickness of the second semiconductor layer. Further, method 600 may include removing the hardmask layer (620).

Method 600 may further include forming a source metal layer coupled to the upper surface of second III-nitride layer (622) and forming a gate metal layer coupled to the upper surface of the III-nitride gate layer (624).

It should be understood that the specific steps illustrated in FIG. 6 provide a particular method of manufacturing a vertical JFET device with a super junction structure according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual steps. Furthermore, additional steps may be added or removed depending on a particular application. One of ordinary skill in the art would recognize many variations, modifications, and alternatives.

Referring back to FIG. 6 and with reference to FIGS. 7A through 7J, a method of manufacturing a vertical JFET device 700 is described according to some embodiments of the present invention.

FIG. 7A is a partial cross-sectional view illustrating a vertical JFET device 700 having an n+ doped semiconductor substrate 701 and an n− doped first semiconductor layer 702 epitaxially grown on the n+ doped semiconductor substrate 701. In one embodiment, the dopant concentration of semiconductor substrate 701 may be in the range from $1 \times 10^{18}$ atoms/cm$^3$ to $3 \times 10^{19}$ atoms/cm$^3$. In one embodiment, first semiconductor layer 702 forms the drift region of the device and is doped with n-type dopant such as silicon. In one embodiment, first semiconductor layer 702 may have a dopant concentration in the range of about $1 \times 10^{16}$ atoms/cm$^3$ to $5 \times 10^{17}$ atoms/cm$^3$ and a thickness of 2 µm-20 µm.

Referring to FIG. 7A, a second semiconductor layer 703 is epitaxially grown on first semiconductor layer 702. In one embodiment, second semiconductor layer 703 may include III-nitride compounds, such as n-type doped GaN with a dopant concentration greater than that of first semiconductor layer 702. For example, second semiconductor layer 703 can have a dopant concentration in the range of about $1 \times 10^{17}$ atoms/cm$^3$ to $5 \times 10^{17}$ atoms/cm$^3$.

Referring to FIG. 7B, a hardmask layer 706 is formed on second semiconductor layer 703. In one embodiment, hardmask layer 706 may be formed by a PECVD process. In another embodiment, hardmask layer 706 may be formed using an LPCVD process. In another embodiment, hardmask layer 706 may be formed using an MOCVD process. In another embodiment, hardmask layer 706 may be formed using a physical vapor deposition (e.g., sputtering) process.

Figure 7C:
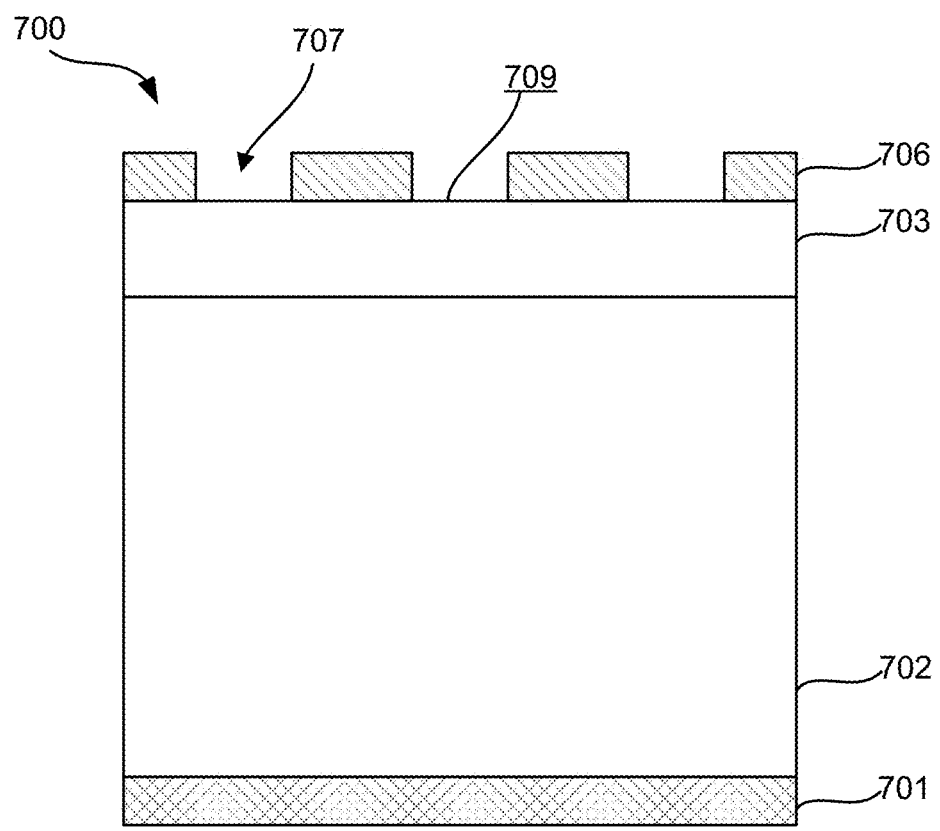

Referring to FIG. 7C, hardmask layer 706 is patterned with a plurality of openings 707 that expose a portion 709 of the upper surface of second semiconductor layer 703. In one embodiment, the top view of the openings 707 is in circular shape like openings 307 as shown in FIG. 3D. In another embodiment, the top view of the opening 707 is a rectangular shape like openings 307 as shown in FIG. 3E. It should be understood that embodiments of the present invention should not be construed as limited to a particular shape illustrated herein but are to include variations in shape that are appropriate to the particular applications. In some embodiments, hardmask layer 706 may include silicon oxides, silicon carbides, silicon nitrides, aluminum nitrides, silicon-aluminum nitrides, silicon carbonitrides, etc. In some embodiments, the thickness of hardmask layer 706 is in the range of 300 nm to 600 nm. In one embodiment, a diameter/width of opening 707 is in the range of about 0.4 µm-1.0 µm, and a distance between adjacent openings 707 is in the range of about 1.5 µm-3 µm.

Figure 7D:
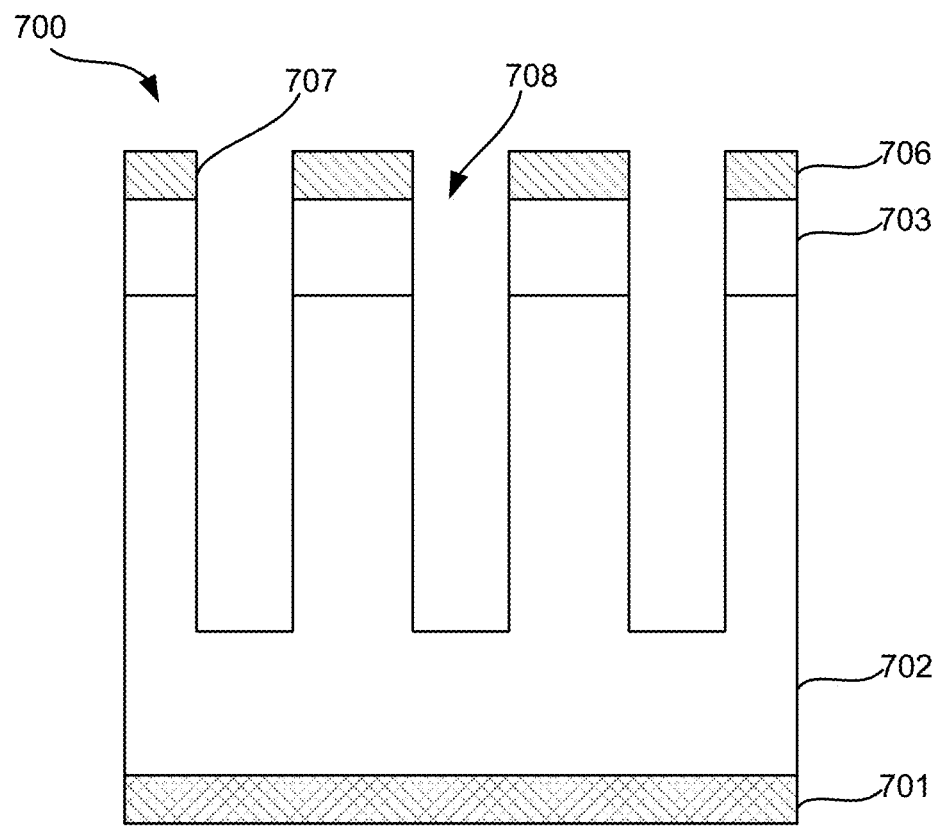

Referring to FIG. 7D, an etch process is performed using hardmask layer 706 as a mask to form a plurality of trenches 708 that extend vertically through the width of the second semiconductor layer 703 and into the first semiconductor layer 702. In some embodiments, the trenches 708 may extend to a predetermined depth within first semiconductor layer 702, for example, 70%-90% of the thickness of first semiconductor layer 702. In one embodiment, the trenches 708 may extend the entire thickness of first semiconductor layer 702. It should be understood the depth of trenches 708 should not be construed as being limited to a particular depth as described above but are to include variations depending on particular device design. In some embodiments, the etch process may include an RIE process. In some embodiments, the etch process may include a PEC process.

In one embodiment, after forming the trenches 708, a cleaning process is performed using a wet chemical solution. In one embodiment, the cleaning process may include a hydroxide-based etch, such as a solution including KOH or TMAH, which provides an anisotropic etch, allowing for the formation of trenches with vertical sidewalls along GaN en-planes. In one embodiment, the cleaning process is performed using a TMAH solution of about 25% by weight, at a temperature of about 85° C., and for a duration of about 30 minutes. In another embodiment, prior to performing a cleaning using the TMAH solution, a pre-cleaning such as piranha clean using a $H_2SO_4:H_2O$ in a volume ratio 2:1 for 2 minutes may also be performed.

Figure 7E:
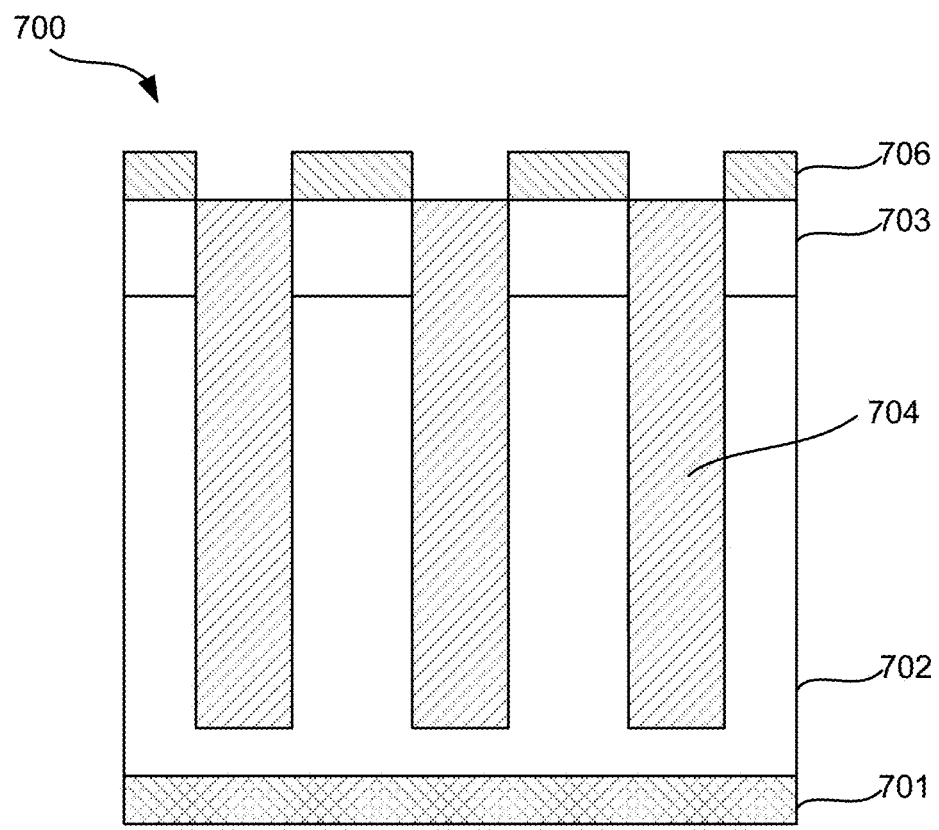

Referring to FIG. 7E, after cleaning, a third semiconductor structure 704 is selectively regrown within the trenches 708. In one embodiment, third semiconductor structure 704 may include a p-type GaN layer that is epitaxially and uniformly grown in the trenches at a temperature of about 900° C. to 740° C. up to a thickness that is substantially planar to the upper surface of second semiconductor layer 703, as shown in FIG. 7E. In one embodiment, third semiconductor structure 704 may be regrown to completely fill the trenches 708. In one embodiment, third semiconductor structure 704 is doped with p-type dopant such as Mg. In one embodiment, third semiconductor structure 704 may have a dopant concentration in the range of about $5 \times 10^{16}$ atoms/cm$^3$ to $5 \times 10^{17}$ atoms/cm$^3$. According to some embodiments, the dopant concentration is determined to achieve a charge balance with neighboring n-type doped first semiconductor layer 702. In one embodiment, the selective regrowth process may include the use of an MOCVD process. In one embodiment, the selective regrowth process is performed at atmospheric pressure. In one embodiment, the selective regrowth process is performed at reduced pressure, e.g., between 100 mTorr and 600 mTorr.

Figure 7F:
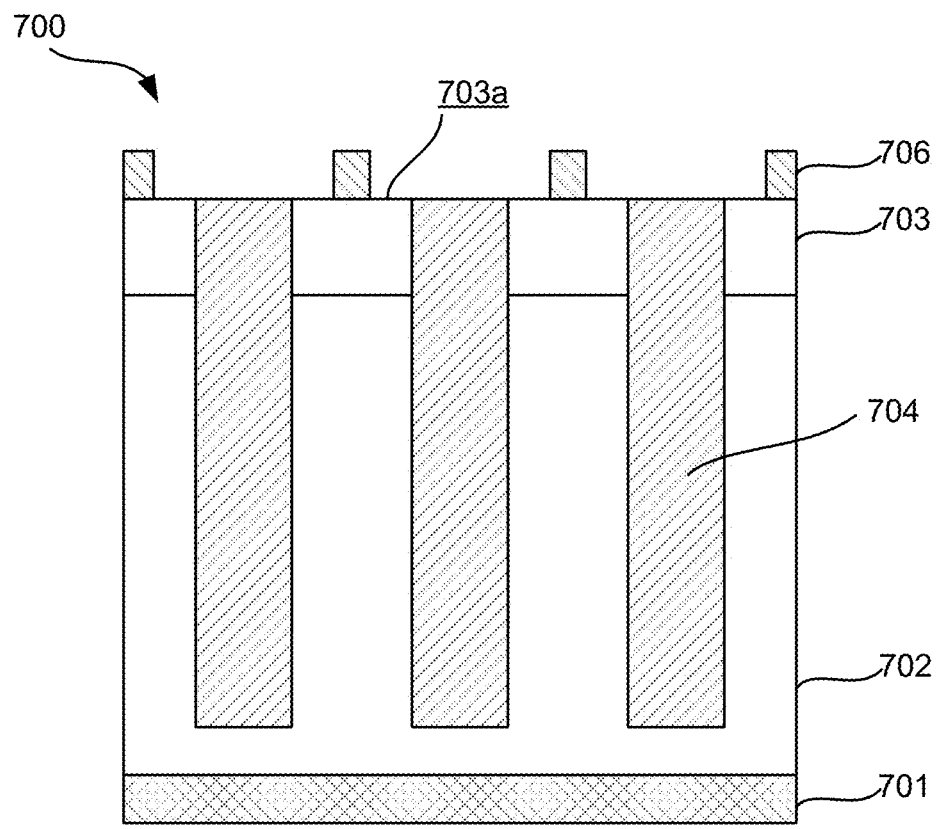
Figure 7G:
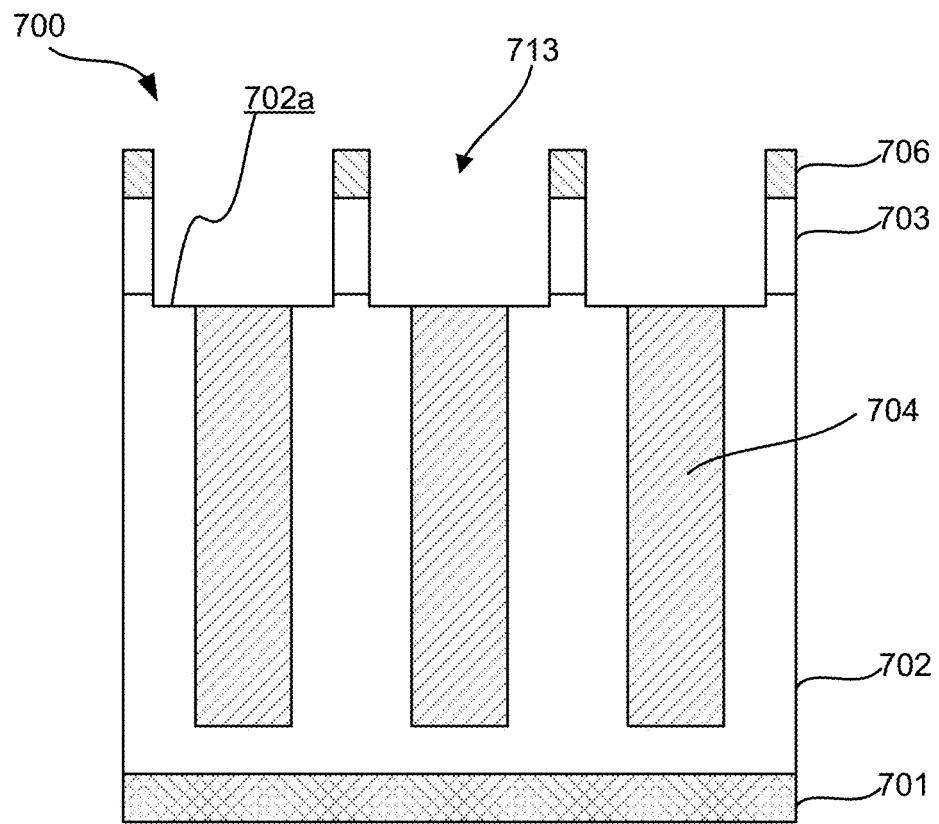

FIGS. 7F through 7G illustrate the process stages to form a plurality of semiconductor fins on first semiconductor layer 702. Referring to FIG. 7F, hardmask layer 706 is further patterned to expose a portion 703a of the upper surface of second semiconductor layer 703 and third semiconductor structure 704. In one embodiment, hardmask layer 706 is etched using a dry etch process.

Referring to FIG. 7G, an etch process is performed using hardmask layer 706 as a mask to form a plurality of recess regions 713, exposing the upper surface of third semiconductor structure 704 and a portion 702a of the upper surface of first semiconductor layer 702. In some embodiments, the etch process may extend a predetermined distance into first semiconductor layer 702, for example, about 0.1 µm-0.3 µm. The remaining part of second semiconductor layer 703 forms the plurality of fins separated by the recess regions 713. In one embodiment, the etch process may include an RIE process.

In one embodiment, after forming the recess regions 713, a cleaning process is performed using a wet chemical solution. In one embodiment, the cleaning process may include a hydroxide-based etch, such as a solution including KOH or TMAH, which provides an anisotropic etch, allowing for the formation of trenches with vertical sidewalls along GaN en-planes. In one embodiment, the cleaning process is performed using a TMAH solution of about 25% by weight, at a temperature of about 85° C. and for a duration of about 30 minutes. In another embodiment, prior to performing a cleaning using the TMAH solution, a pre-cleaning such as a piranha clean using a $H_2SO_4$:$H_2O$ in a volume ratio 2:1 for 2 minutes may also be performed.

Figure 7H:
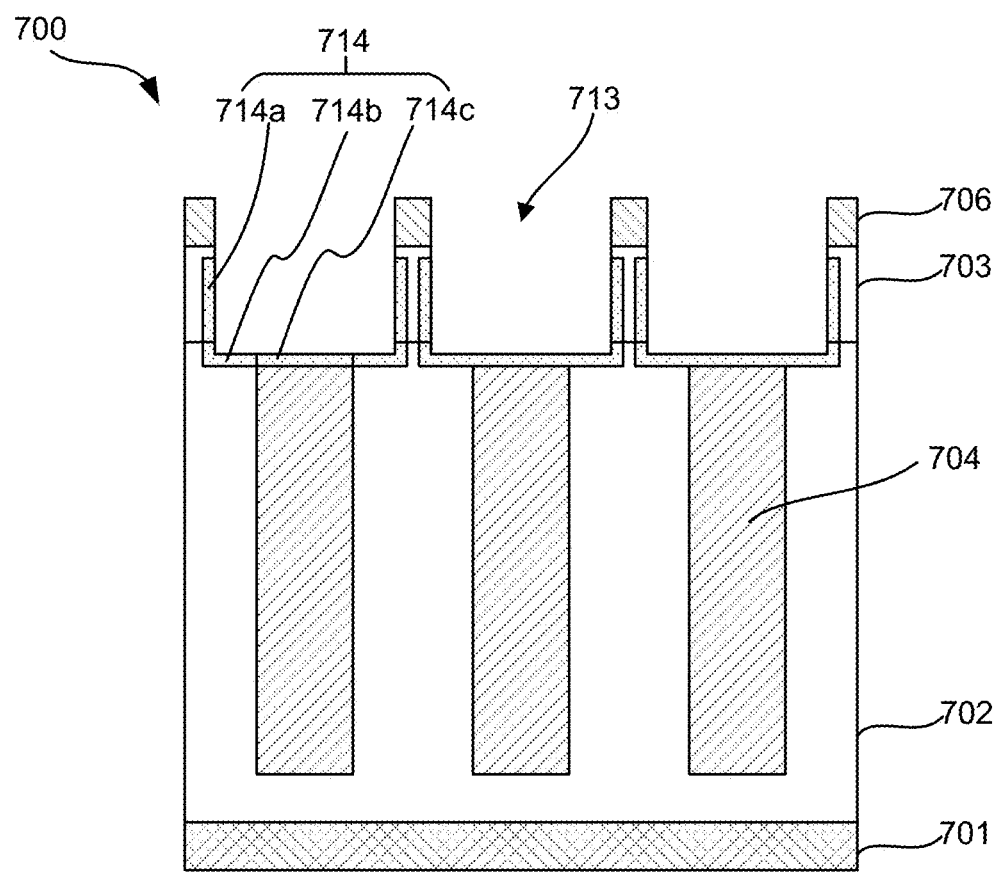
Figure 7I:
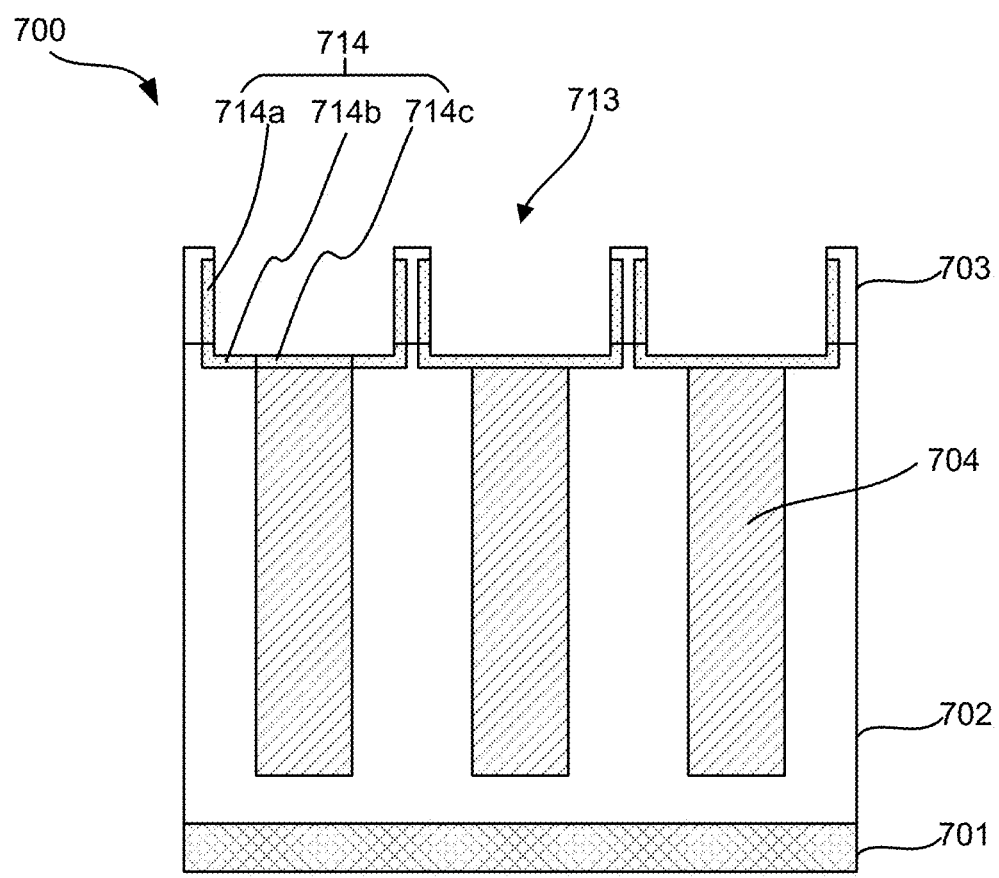

Referring to FIG. 7H, after cleaning, a semiconductor gate layer 714 is formed by creating a doped III-nitride layer on the surface of the recess regions 713. In some embodiments, semiconductor gate layer 714 is formed in recess regions 713 using an ion implantation process or a dopant diffusion process. In some embodiments, semiconductor gate layer 714 may be formed on third semiconductor structure 704 in order to provide the gate structure described herein. In one embodiment, semiconductor gate layer 714 is also coupled with the portion 702a of first semiconductor layer 702, surrounding second semiconductor layer 703, i.e., the plurality of fins. In some embodiments, semiconductor gate layer 714 may include first portions 714a that extend partially up the sidewall of the fins formed in second semiconductor layer 703, while having a second portion 714b that extends across the portion 702a of first semiconductor layer 702 and a third portion 714c that extends across the top surface of third semiconductor structure 704. In some embodiments, semiconductor gate layer 714 may include first portions 714a formed in the side walls of each recess region 713, second portions 714b formed in the upper portions of first semiconductor layer 702 exposed from each recess region 713, and a third portion 714c formed in the upper portion of third semiconductor structure 704. As shown in FIG. 7H, the side walls of recess region 713 are substantially formed in second semiconductor layer 703. In some embodiments, the side wall of recess region 713 may include a portion formed in first semiconductor layer 702 at the bottom end of the side wall. In some embodiments, the height of first portion 714a may extend a predetermined distance along the thickness of second semiconductor layer 703, for example 70%-90% of the thickness of second semiconductor layer 703. In some other embodiments not shown, first portion 714a may extend the whole thickness of second semiconductor layer 703. The thickness of semiconductor gate layer 714 may be in the range of about 200 nm-1000 nm. In some embodiments, the semiconductor gate layer 714 is formed by implanting p-type dopants such as Mg, Be or Zn, and subsequently annealing the implant damage to activate the dopants. In other embodiments, the semiconductor gate layer 714 is formed by diffusion of a p-type dopant from a deposited solid-state diffusion source, e.g., ZnO or MgO, at temperatures between 900° C. and 1150° C. In yet other embodiments, the semiconductor gate layer 714 is formed by diffusion of a p-type dopant from a gas-phase source (e.g., biscyclopentadienylmagnesium) in the presence of ammonia gas in an MOCVD reactor at temperatures between 950° C. and 1150° C. Referring to FIG. 7I, hardmask layer 706 is removed. In one embodiment, hardmask layer 706 is removed using wet or dry etch processes.

Figure 7J:
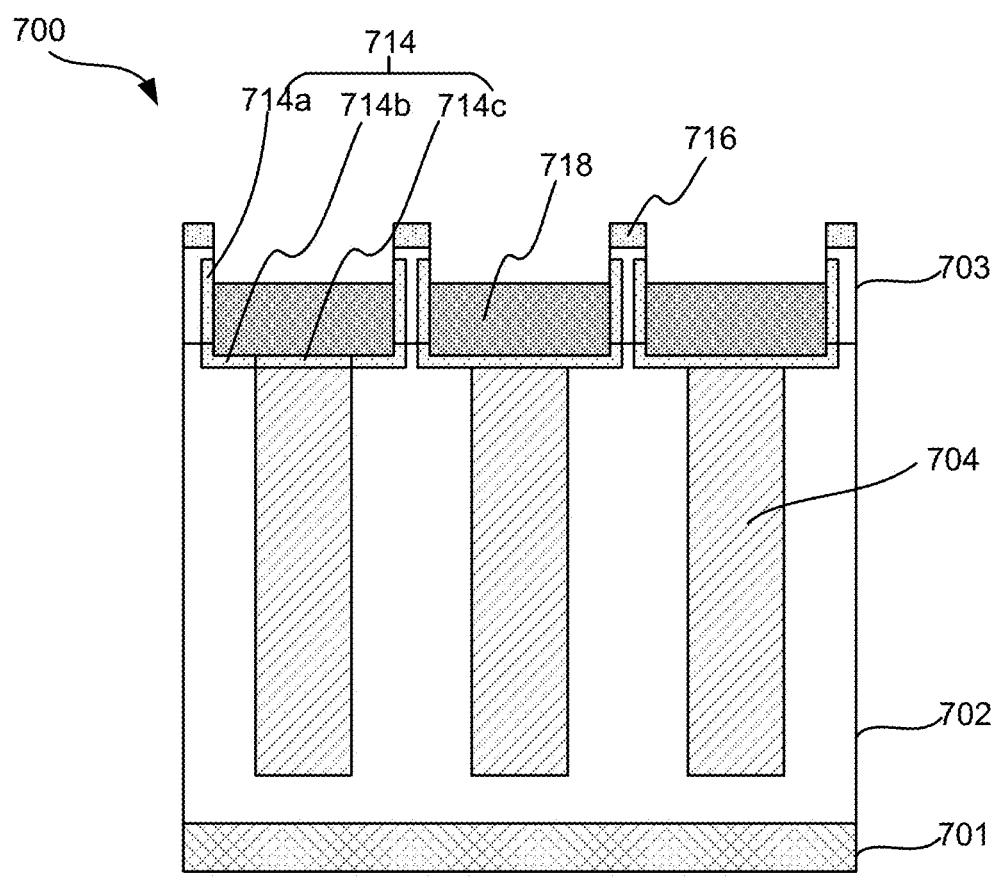

Referring to FIG. 7J, a source metal layer 716 is deposited on the upper portion of second semiconductor layer 703. In other words, source metal layer 716 is formed on the plurality of fins. In some embodiments, the source metal layer 716 forms a self-aligned contact to the upper portion of second semiconductor layer 703. Referring to FIG. 7J, a gate metal layer 718 is deposited on semiconductor gate layer 714. As shown in FIG. 7J, the thickness of gate metal layer 718 is less than the height of first portion 714a.

Figure 8:
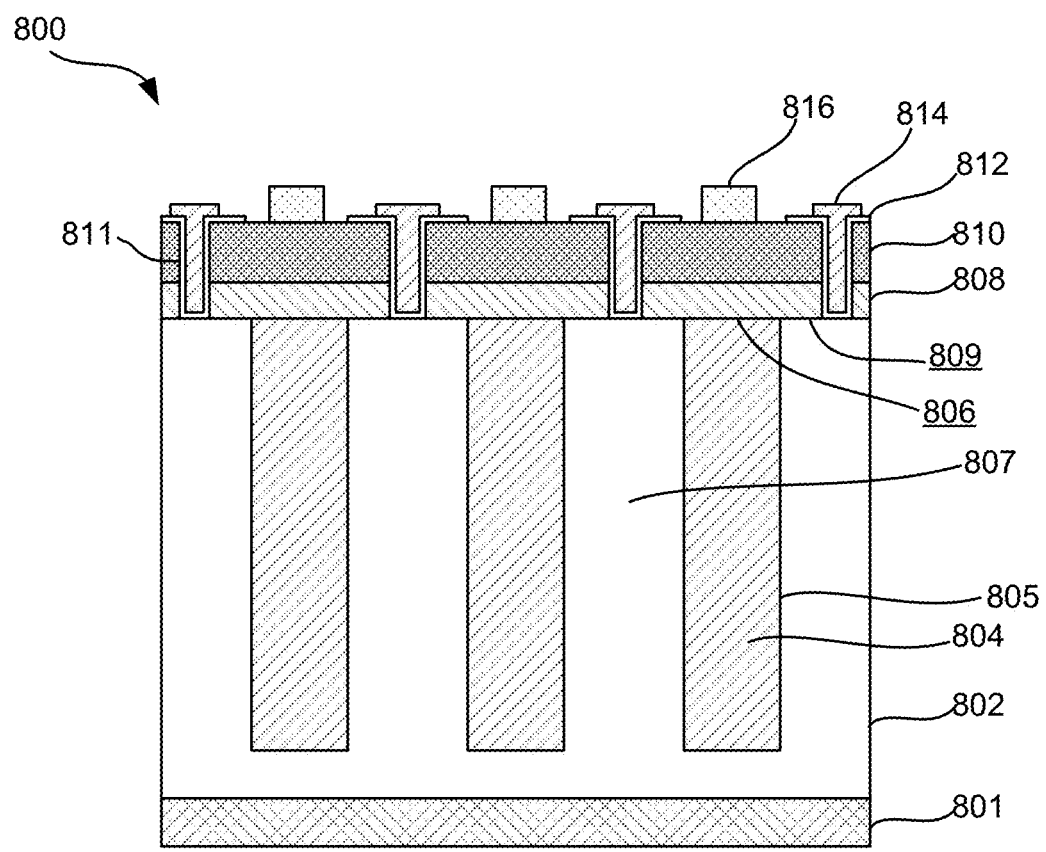
FIG. 8 is a partial cross-sectional view of a metal-oxide-semiconductor field-effect transistor (MOSFET) device with a super junction structure according to an embodiment of the present invention.

FIG. 8 shows a partial cross-section of a MOSFET device 800 manufactured according to some embodiments of the present invention. MOSFET device 800 may include a semiconductor substrate 801, a drift layer 802 coupled to semiconductor substrate 801 and having a plurality of trenches 805, and a semiconductor structure 804 selectively regrown within trenches 405. In one embodiment, semiconductor substrate 801 may include III-nitride compounds, such as GaN. In one embodiment, semiconductor substrate 801 may include heavily n-type doped GaN, which can be used as drain contact. The dopant concentration of semiconductor substrate 801 may vary as appropriate to the particular application. In one embodiment, a dopant concentration of semiconductor substrate 801 may be in the range from $1\times10^{18}$ atoms/$cm^3$ to $3\times10^{19}$ atoms/$cm^3$. Each of the plurality of trenches 805 is separated by a portion 807 of drift layer 802. In some embodiments, semiconductor structure 804 may include III-nitride compounds, such as GaN. For example, semiconductor structure 804 may include p-type doped GaN. The dopant concentration of semiconductor structure 804 may vary as appropriate to the particular application. In one embodiment, dopant concentration of semiconductor structure 804 may be in a range from $1\times10^{17}$ atoms/$cm^3$ to $1\times10^{19}$ atoms/$cm^3$.

MOSFET device 800 may further include a body layer 808 coupled to semiconductor structure 804, and a source layer 810 coupled to body layer 808. A plurality of second trenches 811 are formed through body layer 808 and source layer 810, exposing the upper surface 809 of drift layer 802. In some embodiments, trenches 811 extend into drift layer 802 a predetermined distance, e.g., 0.1-0.3 µm. MOSFET device 800 may further include a gate dielectric layer 812 coupled to a portion of the upper surface of source layer 810 and the sidewall and bottom wall of the second trenches 811. In some embodiments, body layer 808 may include III-nitride compounds, such as GaN. For example, body layer 808 may include p-type doped GaN. In one embodiment, a dopant concentration of body layer 808 may be in a range from $1\times10^{17}$ atoms/$cm^3$ to $1\times10^{19}$ atoms/$cm^3$. In some embodiments, source layer 810 may include III-nitride compounds, such as GaN. For example, source layer 810 may include n-type doped GaN with a dopant concentration greater than that of drift layer 802. For example, source layer 810 has a dopant concentration in the range of about $1\times10^{17}$ atoms/$cm^3$ to $1\times10^{18}$ atoms/$cm^3$. In one embodiment, the gate dielectric layer 812 may have a thickness of approximately 100 nm and may include $Si_3N_4$ and be deposited by a PECVD process at about 300° C. In another embodiment, the gate dielectric layer 812 has a thickness of approximately 100 nm and may include $SiO_2$ and be deposited by a PECVD process at about 300° C. In another embodiment, the gate dielectric layer 812 has a thickness of approximately 100 nm and may include $Al_2O_3$ and be deposited using atomic-layer deposition (ALD). In other embodiments, gate dielectric layer 812 may be deposited by an LPCVD process or an MOCVD process.

MOSFET device 800 may further include a gate metal layer 814 coupled to the gate dielectric layer 812 and a source metal layer 816 coupled to source layer 810. In some embodiments, source metal layer 816 may include a refractory metal, a refractory metal compound or a refractory metal alloy (e.g., TiN). In some embodiments, source metal layer 816 also makes contact to body layer 808. In some embodiments, gate metal layer 814 may include tantalum, tungsten, palladium, silver, aluminum, titanium, platinum, gold, combinations thereof, and the like.

Figure 9:
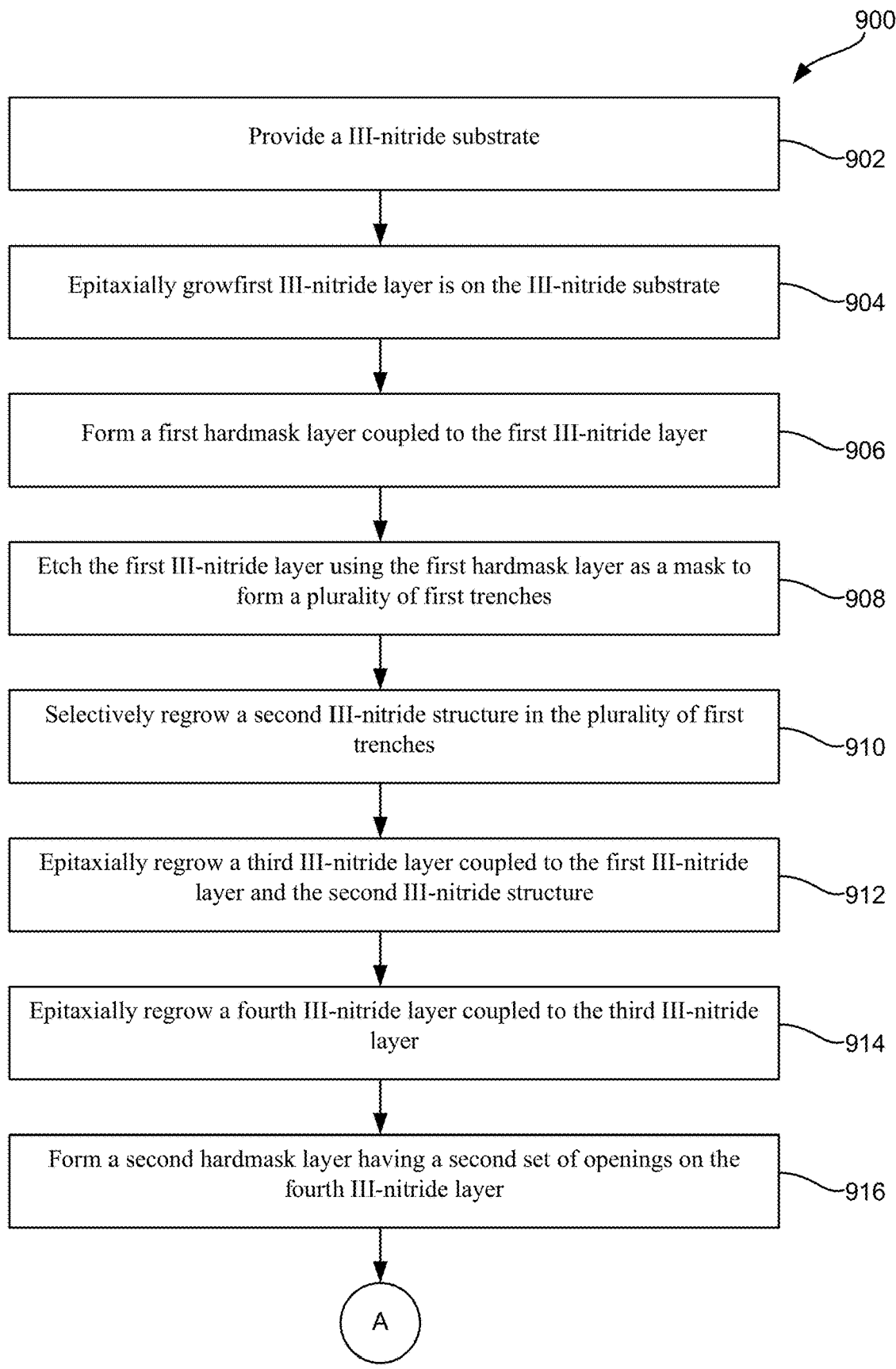
FIG. 9 is a simplified flowchart of a method of manufacturing a MOSFET device with a super junction structure according to an embodiment of the present invention.
Figure 9:
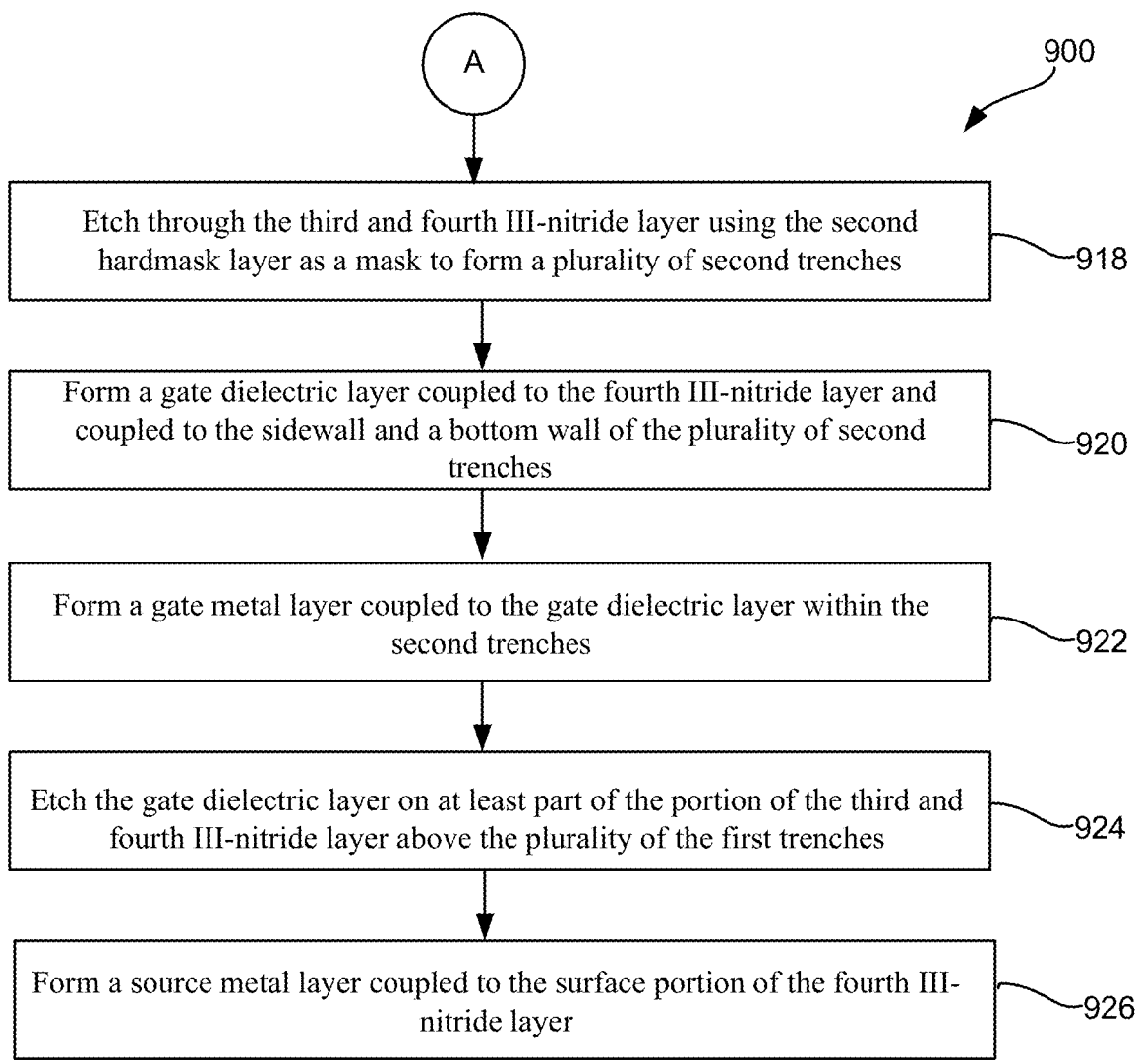

FIG. 9 is a simplified flowchart of a method 900 for manufacturing a MOSFET device with a super junction structure according to an embodiment of the present invention. Referring to FIG. 9, method 900 may include providing a III-nitride substrate having a first conductivity type (902). In one embodiment, the III-nitride substrate is an n+ GaN substrate. The method 900 also includes epitaxially growing a first III-nitride layer coupled to the III-nitride substrate (904). This epitaxial regrowth can be performed at a temperature between 950° C. and 1100° C., and can produce a regrown epitaxial layer characterized by a first dopant concentration. In one embodiment, the first III-nitride layer comprises n-type doped GaN with a dopant concentration in the range of about $1 \times 10^{16}$ atoms/cm$^3$ to $1 \times 10^{17}$ atoms/cm$^3$. In one embodiment, the first III-nitride layer has a thickness of about 5 μm to 20 μm, depending on the desired breakdown voltage of the device.

The method also includes forming a first hardmask layer having a first set of openings on the first III-nitride layer to expose a first surface portion of the first III-nitride layer (906) and etching the first surface portion of the first III-nitride layer using the first hardmask layer as a mask to form a plurality of first trenches within the first III-nitride layer, each of which is separated by a first portion of the first III-nitride layer (908). The plurality of first trenches may extend to a predetermined depth (e.g., 12 μm). In some embodiments, the plurality of first trenches may extend through the entire thickness of the first III-nitride layer.

Method 900 may further include selectively regrowing a second III-nitride structure in the plurality of first trenches (910). The second III-nitride structure can be characterized by a second conductivity type with a second dopant concentration. In one embodiment, the second III-nitride structure may include p-type doped GaN with a dopant concentration in the range of about $1 \times 10^{16}$ atoms/cm$^3$ to $1 \times 10^{17}$ atoms/cm$^3$. In some embodiments, the second III-nitride structure is selectively regrown to completely fill the plurality of first trenches. In other words, the upper surface of the second III-nitride structure (e.g., upper surface 806 of semiconductor structure 804) is planar with the upper surface of the first III-nitride layer (e.g., upper surface 809 of drift layer 802).

Method 900 may further include epitaxially regrowing a third III-nitride layer coupled to the first III-nitride layer and the second III-nitride structure (912). In some embodiments, the third III-nitride layer may be characterized by the second conductivity type with a third dopant concentration. In one embodiment, the third III-nitride layer may include p-type doped GaN with a dopant concentration in the range of about $1 \times 10^{16}$ atoms/cm$^3$ to $1 \times 10^{17}$ atoms/cm$^3$.

Method 900 may further include epitaxially regrowing a fourth III-nitride layer coupled to the third III-nitride layer (914). In some embodiments, the fourth III-nitride layer is characterized by the first conductivity type and a fourth dopant concentration greater than the first dopant concentration. In one embodiment, the fourth III-nitride layer may include n-type doped GaN with a dopant concentration in the range of about $1 \times 10^{17}$ atoms/cm$^3$ to $1 \times 10^{18}$ atoms/cm$^3$.

Method 900 may further include forming a second hardmask layer having a second set of openings on the fourth III-nitride layer to expose a second surface portion of the fourth III-nitride layer (916). In some embodiments, the second surface portion of the fourth III-nitride layer is aligned with at least part of the first portion of the first III-nitride layer that separates the plurality of first trenches.

Method 900 may further include etching through the third and fourth III-nitride layers using the second hardmask layer as a mask to form a plurality of second trenches, exposing the upper surface of the first III-nitride layer (918). Then, the method may further include removing the second hardmask layer.

Method 900 may further include forming a gate dielectric layer coupled to the fourth III-nitride layer and coupled to the sidewall and a bottom wall of the plurality of second trenches (920).

Method 900 may further include forming a gate metal layer coupled to the gate dielectric layer within the plurality of second trenches (922).

Method 900 may further include etching the gate dielectric layer on at least part of a source region of the third and fourth III-nitride layers aligned with each of the plurality of the first trenches to expose an upper surface portion of the fourth III-nitride layer (924).

Method 900 may further include forming a source metal layer coupled to the upper surface portion of the fourth III-nitride layer (926).

It should be understood that the specific steps illustrated in FIG. 9 provide a particular method of manufacturing a MOSFET device with super junction structure according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual steps. Furthermore, additional steps may be added or removed depending on a particular application. One of ordinary skill in the art would recognize many variations, modifications, and alternatives.

Figure 10C:
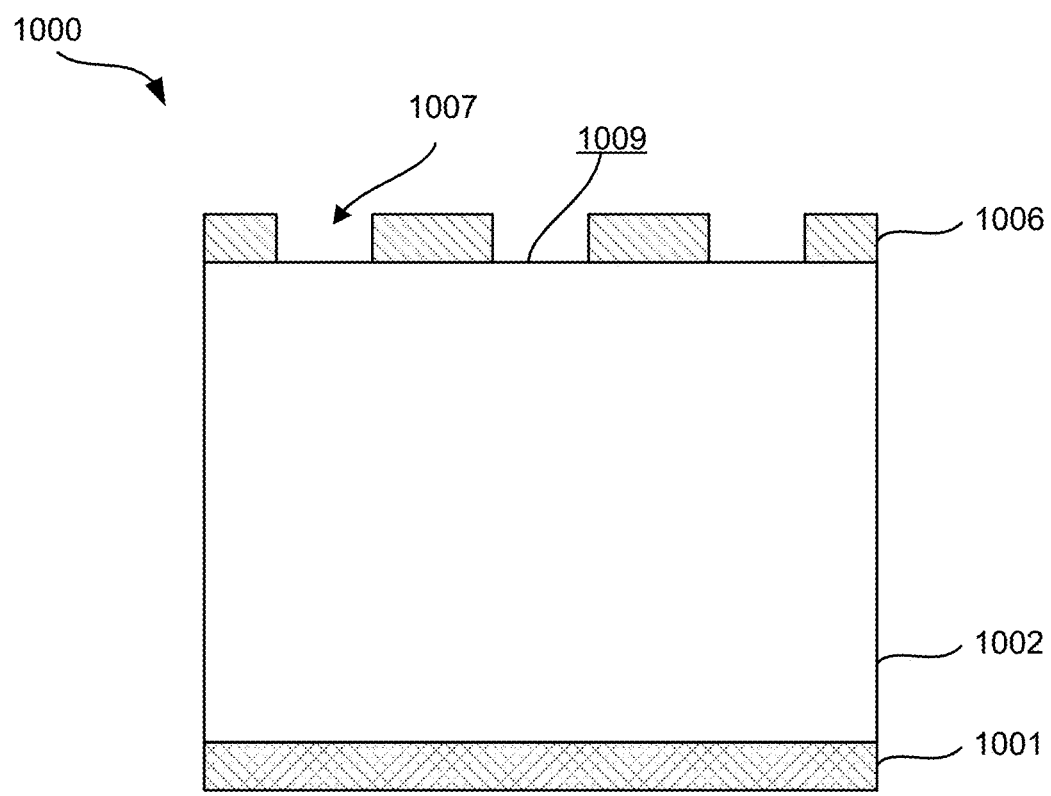
Figure 10E:
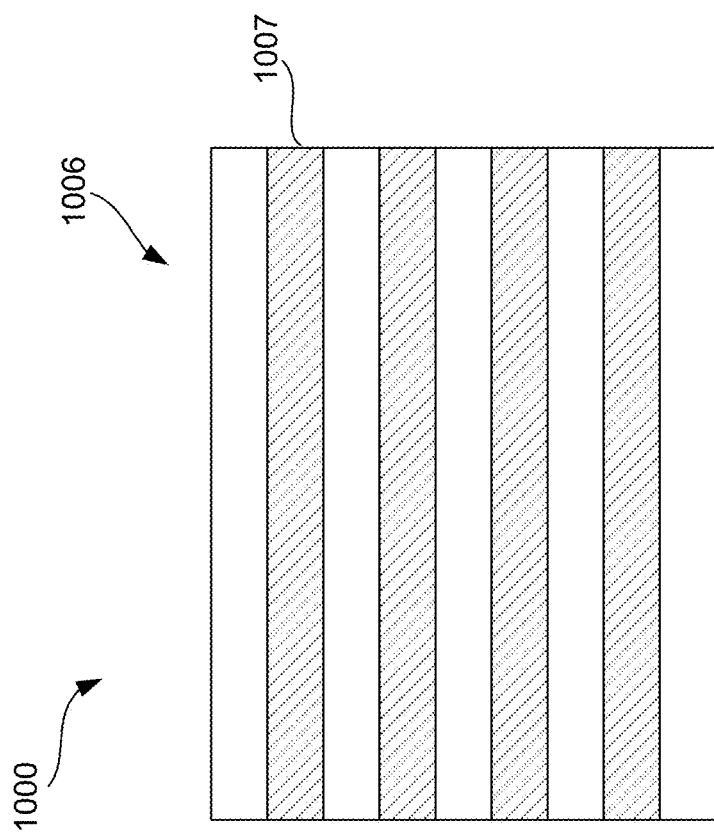
FIGS. 10D and 10E are partial plan view diagrams illustrating patterning of a hardmask layer according to various embodiments of the present invention.
Figure 10D:
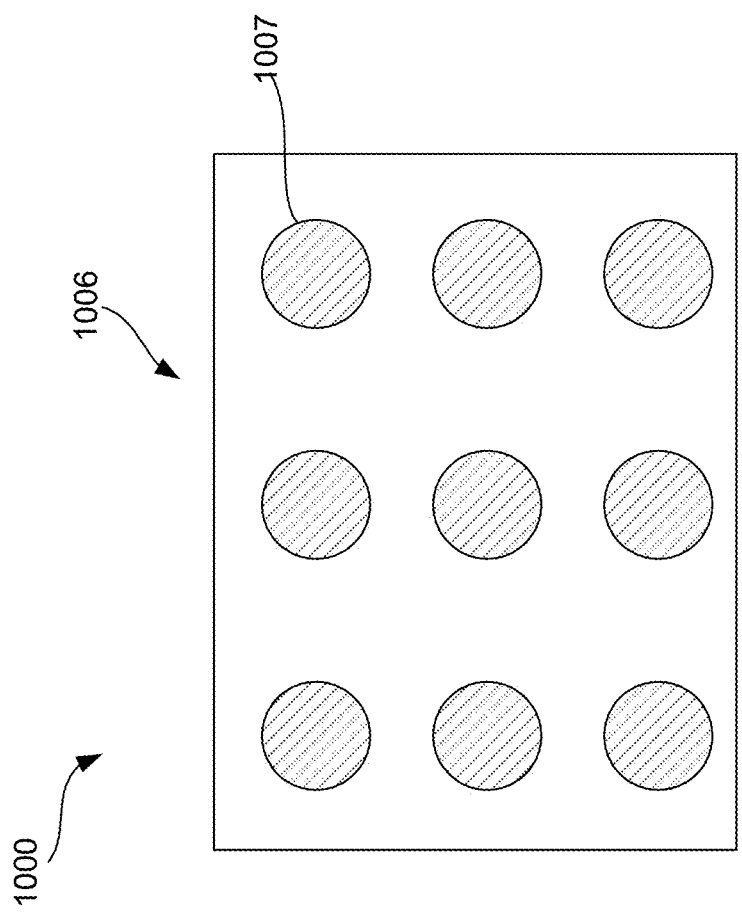
Figures 10F, 10G:
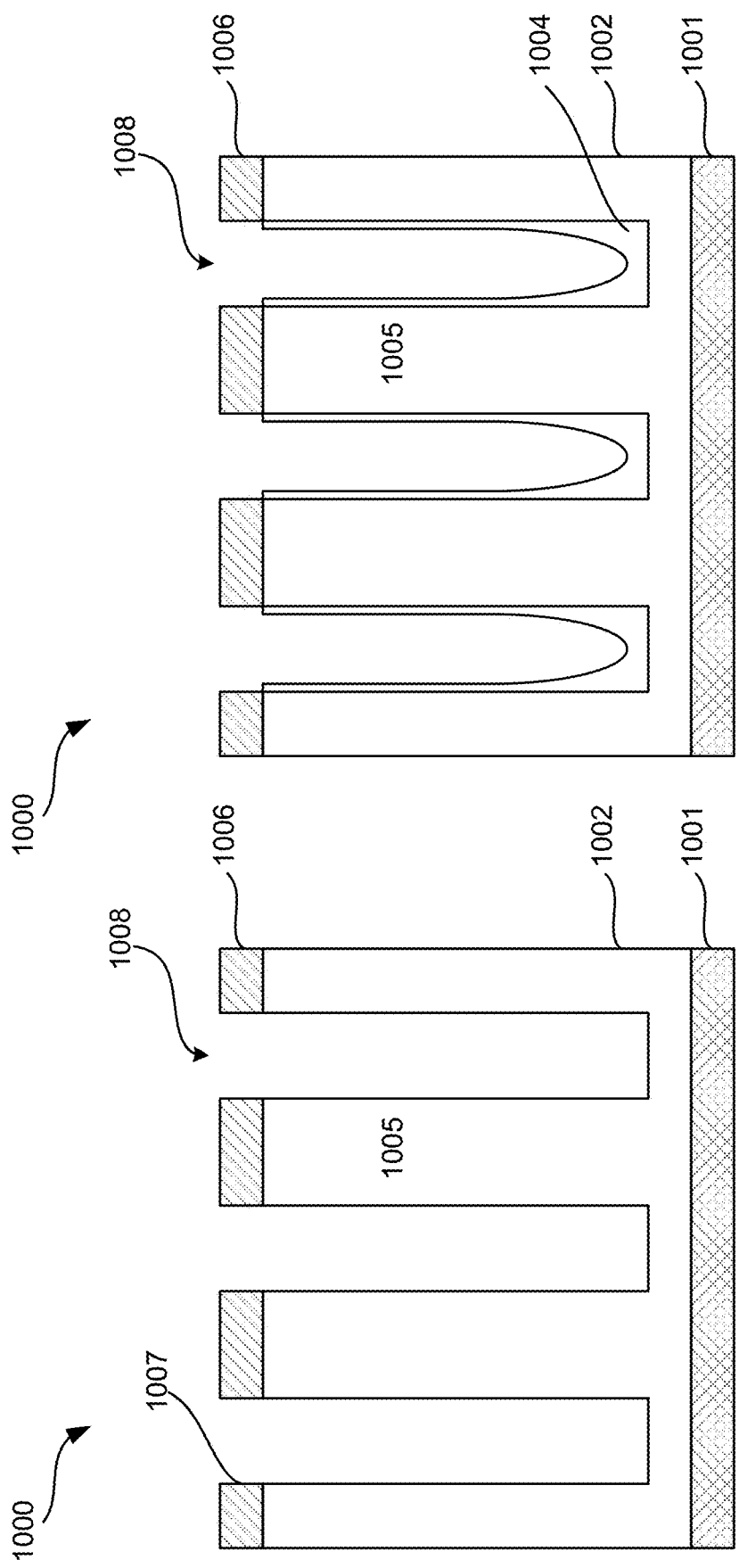
Figure 10K:
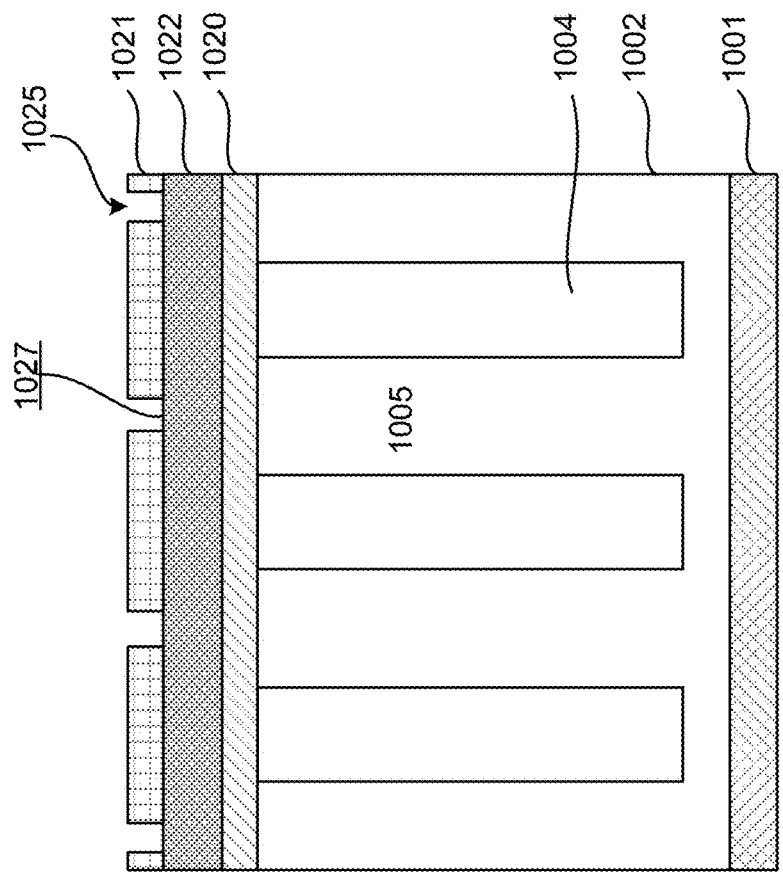
Figure 10J:
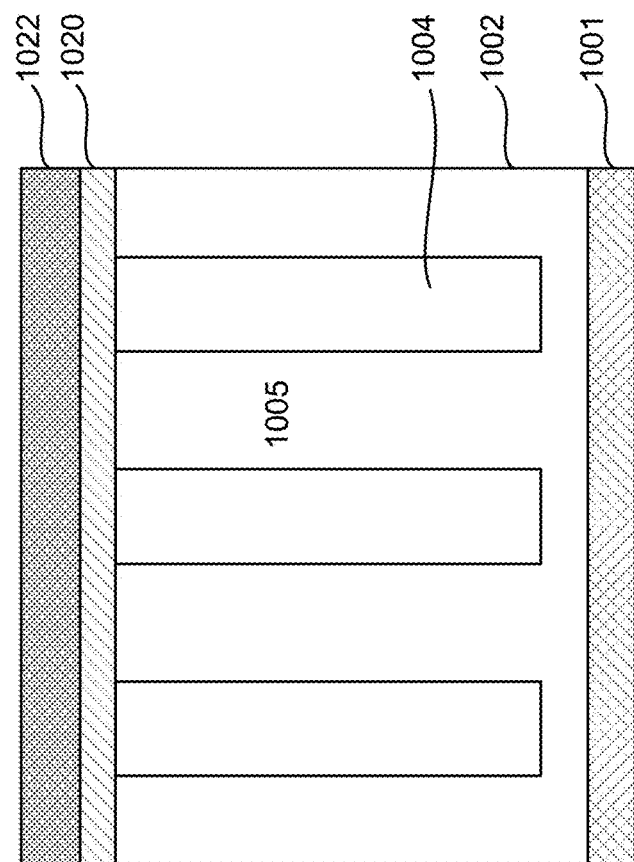
Figure 10L:
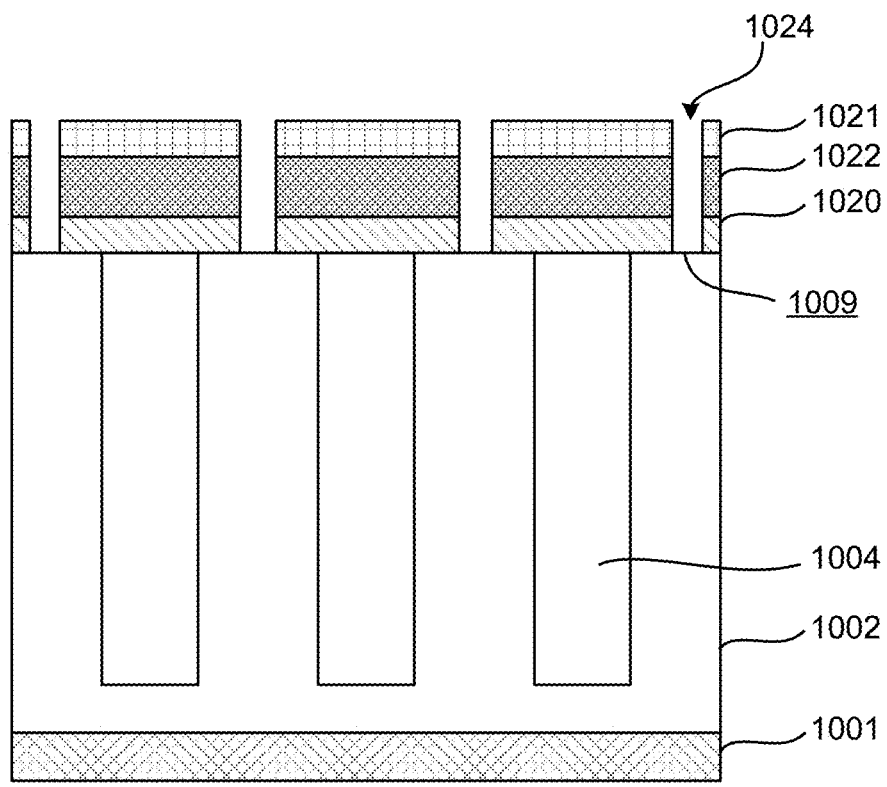
Figure 10M:
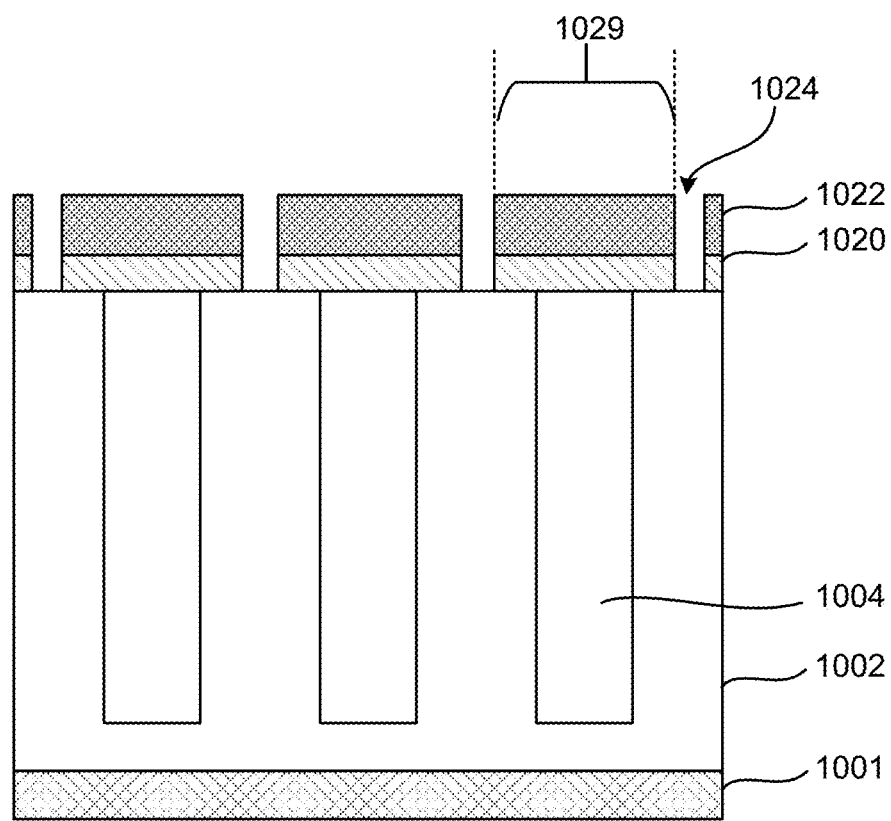
Figure 10P:
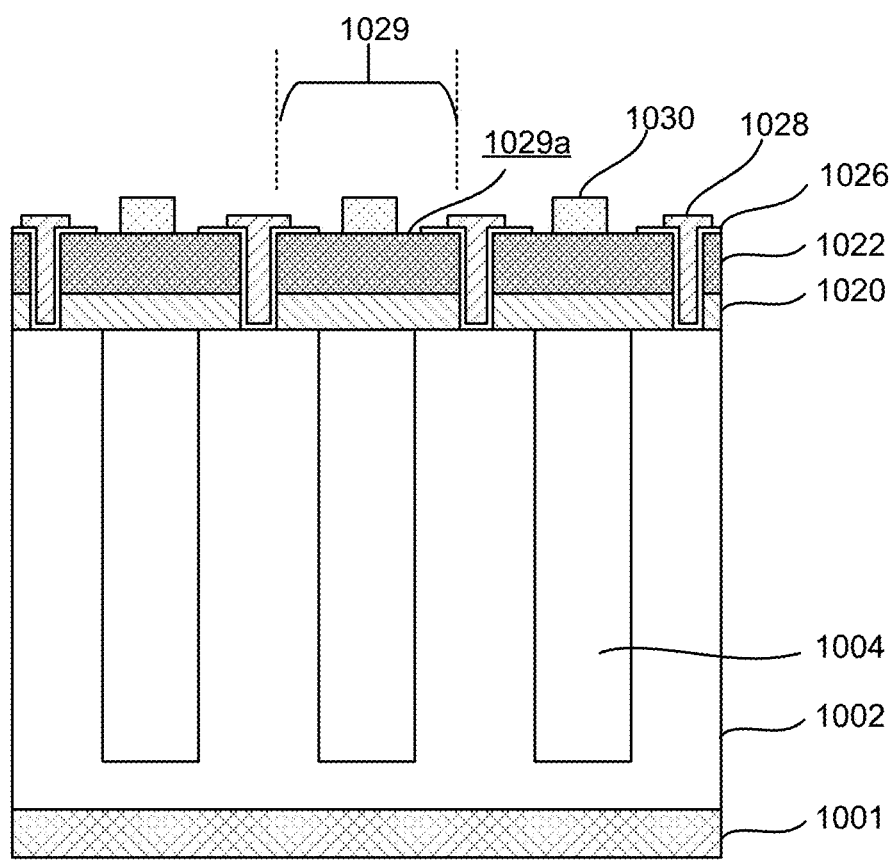

Referring back to FIG. 9 and with reference to FIGS. 10A through 10P, a method of manufacturing a MOSFET device 1000 is described according to some embodiments of the present invention. FIG. 10A is a partial cross-sectional view illustrating a MOSFET device 1000 having an n+ doped semiconductor substrate 1001, and an n– doped first semiconductor layer 1002 epitaxially grown on the n+ doped semiconductor substrate 1001. In one embodiment, the dopant concentration of semiconductor substrate 1001 may be in the range from $1 \times 10^{17}$ atoms/cm$^3$ to $1 \times 10^{19}$ atoms/cm$^3$. In one embodiment, first semiconductor layer 1002 forms the drift region of the device and is doped with n-type dopant such as nitrogen. In one embodiment, first semiconductor layer 1002 may have a dopant concentration in the range of about $1 \times 10^{16}$ atoms/cm$^3$ to $1 \times 10^{17}$ atoms/cm$^3$ and a thickness of 5-20 μm.

Referring to FIG. 10B, a first hardmask layer 1006 is formed on the semiconductor layer 1002. In one embodiment, first hardmask layer 1006 may be formed by a PECVD process. In another embodiment, first hardmask layer 1006 may be formed using an LPCVD process. In another embodiment, first hardmask layer 1006 may be formed using an MOCVD process. In another embodiment, first hardmask layer 1006 may be formed using a physical vapor deposition (e.g., sputtering) process. As shown in FIG. 10C, first hardmask layer 1006 is patterned with a plurality of openings 1007 that expose a portion 1009 of the upper surface of semiconductor layer 1002. In one embodiment, the first hardmask layer 1006 may be patterned using RIE with a F-based chemistry. In one embodiment, the cross section of the openings 1007 is a circular shape as shown in FIG. 10D. In another embodiment, the cross section of the opening 1007 is a rectangular shape that extends through the width of the semiconductor layer 1002, as shown in FIG. 10E. It should be understood that embodiments of the present invention should not be construed as being limited to a particular shape illustrated herein but are to include variations in shape that are appropriate to the particular applications. In some embodiments, first hardmask layer 1006 may include silicon oxides, silicon carbides, silicon nitrides, silicon carbonitrides, etc. The thickness of first hardmask layer 1006 may be in the range of about 300 nm-600 nm. In one embodiment, a diameter/width of opening 1007 is in a range of about 0.4-1.5 μm, and a distance between adjacent openings 1007 is in a range of about 1.5-3 μm.

Referring to FIG. 10F, an etch process is performed using first hardmask layer 1006 as a mask to form a plurality of first trenches 1008, each of which is separated by a first portion 1005 of first semiconductor layer 1002. In some embodiments, first trenches 1008 may extend to a predetermined depth within the semiconductor layer 1002, for example, 70%-90% of the thickness of semiconductor layer 1002. In one embodiment, first trenches 1008 may extend through the entire thickness of first semiconductor layer 1002. It should be understood the depth of trenches 1008 should not be construed as being limited to a particular depth as described above but are to include variations depending on particular device design. In some embodiments, the etch process may include a RIE process.

In one embodiment, after forming the trenches 1008, a cleaning process is performed using a TMAH solution of about 25% by weight, at a temperature of about 85° C., and for a duration of about 30 minutes. In another embodiment, prior to performing a cleaning using the TMAH solution, a pre-cleaning such as piranha clean using a $H_2SO_4$:$H_2O$ in a volume ratio 2:1 for 2 minutes may also be performed.

In one embodiment, the etch process may include a hydroxide-based etch, such as TMAH, which provides an anisotropic etch, allowing for the formation of trenches with vertical sidewalls along GaN m-planes.

Referring to FIG. 10G, after cleaning, a second semiconductor structure 1004 is selectively regrown within the first trenches 1008. In one embodiment, second semiconductor structure 1004 may include a p-type GaN layer that is epitaxially and uniformly grown in the first trenches 1008 at a temperature of about 950° C. up to a thickness that is substantially planar to the upper surface 1009 of first semiconductor layer 1002, as shown in FIG. 10H. In one embodiment, the second semiconductor structure 1004 is grown to completely fill the first trenches 1008, as shown in FIG. 10I. In one embodiment, second semiconductor structure 1004 is doped with p-type dopant such as Mg. In one embodiment, second semiconductor structure 1004 may have a dopant concentration in the range of about $1\times10^{16}$ atoms/cm³ to $1\times10^{17}$ atoms/cm³. According to some embodiments, the dopant concentration is determined to achieve a charge balance with neighboring n-type doped first semiconductor layer 1002. In one embodiment, the selective regrowth process may include the use of a MOCVD process.

Referring to FIG. 10I, first hardmask layer 1006 is removed to expose the upper surface portion 1009 of first semiconductor layer 1002 and upper surface 1010 of second semiconductor structure 1004. In one embodiment, first hardmask layer 1006 is removed using wet or dry etch processes.

Referring to FIG. 10J, a third semiconductor layer 1020 is epitaxially grown on first semiconductor layer 1002 and second semiconductor structure 1004. Then, a fourth semiconductor layer 1022 is epitaxially grown on third semiconductor layer 1020. In one embodiment, third semiconductor layer 1020 may include a p-type GaN layer that is epitaxially and uniformly grown at a temperature of about 950° C. up to a predetermined thickness (e.g., 0.1-0.6 μm). In one embodiment, third semiconductor layer 1020 can have a dopant concentration in the range from $1\times10^{16}$ atoms/cm³ to $5\times10^{17}$ atoms/cm³. In one embodiment, fourth semiconductor layer 1022 may include an n-type GaN layer that is epitaxially and uniformly grown at a temperature of about 950° C. up to a predetermined thickness (e.g., 0.2-0.6 μm). In one embodiment, fourth semiconductor layer 1022 can have a dopant concentration greater than that of first semiconductor layer 1002, for example in the range from $1\times10^{17}$ atoms/cm³ to $1\times10^{18}$ atoms/cm³. In one embodiment, fourth semiconductor layer 1022 can also include a thin (e.g., 50-100 nm thick), heavily doped ($1-5\times10^{18}$ atoms/cm³) region at the upper surface of fourth semiconductor layer 1022.

Referring to FIG. 10K, a second hardmask layer 1021 is formed on fourth semiconductor layer 1022. Second hardmask layer 1021 is patterned with a plurality of openings 1025 aligned with at least part of the first portion 1005 of first semiconductor layer 1002 that separates the plurality of first trenches, so as to expose a portion 1027 of the upper surface of fourth semiconductor layer 1022. In one embodiment, second hardmask layer 1021 may be formed by a PECVD process. In another embodiment, second hardmask layer 1021 may be formed using an LPCVD process. In another embodiment, second hardmask layer 1021 may be formed using an MOCVD process. In another embodiment, hardmask layer 1021 may be formed using a physical vapor deposition (e.g., sputtering) process. In another embodiment, second hardmask layer 1021 may be patterned using RIE with an F-based chemistry.

Referring to FIG. 10L, an etch process is performed using second hardmask layer 1021 as a mask to form a plurality of second trenches 1024, exposing the upper surface portion 1009 of first semiconductor layer 1002. In one embodiment, the etch process may include an RIE process.

In one embodiment, a timed etch process may be performed using second hardmask layer 1021 as a mask to extend to a predetermined depth (e.g., 0.1 μm) in first semiconductor layer 1002. Then, second hardmask layer 1021 is removed as shown in FIG. 10M, exposing the upper surface of fourth semiconductor layer 1022. In one embodiment, second hardmask layer 1021 is removed using wet or dry etch processes. As shown in FIG. 10M, a source region 1029, i.e. a portion of third and fourth semiconductor layers 1020 and 1022 aligned with second semiconductor structure 1004, is separated by the second trenches 1024. In one embodiment, source region 1029 has a width of 0.4-0.8 μm.

In one embodiment, after forming second trenches 1024, a cleaning process is performed using a TMAH solution of about 25% by weight, at a temperature of about 85° C. and for a duration of about 30 minutes. In another embodiment, prior to performing a cleaning using the TMAH solution, a pre-cleaning such as a piranha clean using a $H_2SO_4:H_2O$ in a volume ratio 2:1 for 2 minutes may also be performed.

Referring to FIG. 10N, a gate dielectric layer 1026 is deposited on fourth semiconductor layer 1022. Specifically, gate dielectric layer 1026 is conformally deposited on source region 1029 and the sidewall and bottom wall of each of the plurality of second trenches 1024. In some embodiments, gate dielectric layer 1026 may be also coupled to upper surface portion 1009 of first semiconductor layer 1002 at the bottom of second trenches 1024. In one embodiment, the gate dielectric layer 1026 may have a thickness of approximately 100 nm and may include $Si_3N_4$ and be deposited by a PECVD process at about 300° C. In another embodiment, gate dielectric layer 1026 may have a thickness of approximately 100 nm and may include $SiO_2$ and be deposited by a PECVD process at about 300° C. In other embodiments, gate dielectric layer 1026 may be a composite including multiple layers of individual dielectrics, e.g., $SiO_2$ and $Si_3N_4$. In other embodiments, gate dielectric layer 1026 may be deposited by MOCVD. In another embodiment, gate dielectric layer 1026 may include $Al_2O_3$ deposited by ALD. It should be noted the thickness and material of gate dielectric layer 1026 should not be construed as being limited to the above particular examples, but to include variations to satisfy optimized threshold voltage target, electrical performance and device reliability of the MOSFET device 1000.

Referring to FIG. 10O, a gate metal layer 1028 is formed on gate dielectric layer 1026. According to some embodiments of the present invention, gate metal layer 1028 is formed within second trenches 1024 and on a portion of source region 1029 of gate dielectric layer 1026 surrounding second trenches 1024, leaving at least part of the upper surface of gate dielectric layer 1026 at source region 1029 exposed. In some embodiments, gate metal layer 1028 can be formed using a PVD process, a CVD process, an ALD process, etc. In some embodiments, gate metal layer 1028 may include tantalum, tungsten, palladium, silver, or aluminum, combinations thereof, and the like.

Referring to FIG. 10P, an etch process is performed on at least part of the upper surface of gate dielectric layer 1026 at source region 1029, exposing the upper surface of fourth semiconductor layer 1022. Then a source metal layer 1030 is formed on fourth semiconductor layer 1022 at the exposed part 1029a of source region 1029. In some embodiments, source metal layer 1030 can be formed using a PVD process, a CVD process, an ALD process, etc. In some embodiments, source metal layer 1030 may include a refractory metal, a refractory metal compound or a refractory metal alloy (e.g., TiN).

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on," and the terms "a," "an" and "the" may include singular and plural references. Furthermore, as used herein, the term "by" may also mean "from," depending on the context. Furthermore, as used herein, the term "if" may also mean "when" or "upon," depending on the context. Furthermore, as used herein, the words "and/or" may refer to and encompass any possible combinations of one or more of the associated listed items.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "below," "above," "higher," "lower," "over" and "under" are defined with respect to the conventional plane or surface being on the top surface of the wafer or substrate, regardless of the orientation of the wafer or substrate. It will be understood that these terms are intended to encompass different orientations of the device in addition to the otientati on depicted in the figures.

It is to be understood that the appended claims are not limited to the precise configuration illustrated in the drawings. One of ordinary skill in the art would recognize various modification, alternatives, and variations may be made in the arrangement and steps of the methods and devices above without departing from the scope of the invention.

What is claimed is:

1. A vertical junction field effect transistor (JFET) device comprising:
    a III-nitride substrate having a first conductivity type;
    a first III-nitride layer coupled to the III-nitride substrate, wherein the first III-nitride layer is characterized by a first dopant concentration and the first conductivity type, and the first III-nitride layer comprises a plurality of trenches;
    a second III-nitride structure formed within the trenches, wherein the second III-nitride structure is characterized by a second conductivity type opposite to the first conductivity type;
    a plurality of III-nitride fins, each coupled to the first III-nitride layer, wherein the plurality of III-nitride fins are separated by one of a plurality of recess regions;
    a III-nitride gate layer formed within the recess regions and coupled to the second III-nitride structure, wherein the III-nitride gate layer is characterized by the second conductivity type;
    a source metal layer coupled to an upper portion of each of the plurality of III-nitride fins; and
    a gate metal layer coupled to an upper portion of the III-nitride gate layer.

2. The vertical JFET device of claim 1 wherein a dopant concentration of the plurality of III-nitride fins is greater than the dopant concentration of the first III-nitride layer.

3. The vertical JFET device of claim 1 wherein a dopant concentration of the second III-nitride structure is substantially equal to a dopant concentration of the first III-nitride layer.

4. The vertical JFET device of claim 1 wherein a depth of the plurality of trenches extend an entire thickness of the first III-nitride layer.

5. The vertical JFET device of claim 1 wherein the III-nitride gate layer is coupled to a portion of the first III-nitride layer.

6. The vertical JFET device of claim 1 wherein the III-nitride gate layer comprises an epitaxially regrown layer.

7. The vertical JFET device of claim 1 wherein the III-nitride gate layer comprises a deposited layer disposed on the second III-nitride structure.

8. The vertical JFET device of claim 1 wherein the III-nitride gate layer comprises an ion implanted layer or diffused dopant layer.

9. The vertical JFET device of claim 8 wherein the III-nitride gate layer comprises:
- a first portion extending partially up sidewalls of the plurality of III-nitride fins;
- a second portion extending across a portion of the first III-nitride layer; and
- a third portion extending across a top surface of the second III-nitride structure.

10. The vertical JFET device of claim 9 wherein the first portion of the III-nitride gate layer is characterized by a height amounting to 70%-90% of a thickness of the plurality of III-nitride fins.

* * * * *